(12) United States Patent
Kippelen et al.

(10) Patent No.: US 10,763,447 B2
(45) Date of Patent: Sep. 1, 2020

(54) DEVICES WITH ORGANIC SEMICONDUCTOR LAYERS ELECTRICALLY-DOPED OVER A CONTROLLED DEPTH

(71) Applicant: Georgia Tech Research Corporation, Atlanta, GA (US)

(72) Inventors: Bernard Kippelen, Atlanta, GA (US); Naoya Aizawa, Atlanta, GA (US); Canek Fuentes-Hernandez, Atlanta, GA (US); Junji Kido, Atlanta, GA (US); Seth Marder, Atlanta, GA (US); Felipe A. Larrain, Atlanta, GA (US); Wen-Fang Chou, Atlanta, GA (US); Vladimir Kolesov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 78 days.

(21) Appl. No.: 15/735,549

(22) PCT Filed: Jun. 3, 2016

(86) PCT No.: PCT/US2016/035790
§ 371 (c)(1),
(2) Date: Dec. 11, 2017

(87) PCT Pub. No.: WO2017/007554
PCT Pub. Date: Jan. 12, 2017

(65) Prior Publication Data
US 2018/0175314 A1 Jun. 21, 2018

Related U.S. Application Data

(60) Provisional application No. 62/173,067, filed on Jun. 9, 2015.

(51) Int. Cl.
*H01L 51/44* (2006.01)
*H01L 51/00* (2006.01)
*H01L 51/42* (2006.01)

(52) U.S. Cl.
CPC ............ *H01L 51/44* (2013.01); *H01L 51/002* (2013.01); *H01L 51/0003* (2013.01);
(Continued)

(58) Field of Classification Search
CPC .................................................. H01L 31/02167
See application file for complete search history.

(56) References Cited

U.S. PATENT DOCUMENTS

| | | | | |
|---|---|---|---|---|
| 3,574,009 A | * | 4/1971 | Chizinsky et al. | ..... H01L 21/00 438/560 |
| 3,980,507 A | * | 9/1976 | Carley | .................... H01L 21/00 438/548 |
| 4,387,387 A | * | 6/1983 | Yamazaki | ......... H01L 31/02167 136/255 |
| 4,461,691 A | * | 7/1984 | Frank | ..................... C25B 1/003 204/242 |

(Continued)

FOREIGN PATENT DOCUMENTS

WO   2015063492   5/2015

OTHER PUBLICATIONS

Search Report and Opinion from parent PCT Application No. PCT/US16/35790 dated Feb. 21, 2017 (17 pages).

*Primary Examiner* — Raj R Gupta
(74) *Attorney, Agent, or Firm* — Troutman Pepper Hamilton Sanders LLP; Ryan A. Schneider

(57) ABSTRACT

The disclosed technology includes systems, devices, and methods associate with producing an organic semiconductor film having electrical dopant molecules distributed to a controlled depth. In an example implementation, a semiconductor device is provided. The semiconductor device can include a first substrate and an organic semiconductor film disposed on the first substrate. The organic semiconductor film includes a first region characterized by electrical dopant (Continued)

molecules distributed to a controlled depth with respect to a first surface of the organic semiconductor film. The semiconductor device further can include an electrode in contact with at least a portion of the first region of the organic semiconductor film.

26 Claims, 73 Drawing Sheets

(52) U.S. Cl.
CPC ...... *H01L 51/0034* (2013.01); *H01L 51/0036* (2013.01); *H01L 51/0047* (2013.01); *H01L 51/4253* (2013.01); *H01L 51/4293* (2013.01); *H01L 51/0035* (2013.01); *H01L 51/0037* (2013.01); *H01L 51/0043* (2013.01); *Y02E 10/549* (2013.01)

(56) References Cited

U.S. PATENT DOCUMENTS

| | | | |
|---|---|---|---|
| 5,478,776 A | 12/1995 | Luftman et al. | |
| 2004/0084724 A1 | 5/2004 | Kapels et al. | |
| 2006/0216851 A1 | 9/2006 | Russell et al. | |
| 2009/0000477 A1 | 1/2009 | Jinbo et al. | |
| 2009/0004772 A1* | 1/2009 | Jinbo | H01L 21/02505 |
| | | | 438/99 |
| 2009/0042346 A1* | 2/2009 | Kugler | H01L 51/0529 |
| | | | 438/197 |
| 2010/0044682 A1 | 2/2010 | Bolink et al. | |
| 2014/0272189 A1* | 9/2014 | Owens | D06M 10/003 |
| | | | 427/553 |
| 2016/0254058 A1* | 9/2016 | Cronin | G11C 16/0466 |
| | | | 365/185.18 |

* cited by examiner

| Samples | Work function (eV) |
|---|---|
| Pristine P3HT | 4.4 ± 0.1 |
| P3HT film dipped in PMA solution for 10 s | 4.8 ± 0.1 |
| P3HT film dipped in PMA solution for 30 min | 4.8 ± 0.1 |
| P3HT film dipped in PMA solution for 60 min | 4.8 ± 0.1 |

| Samples | Work function (eV) |
|---|---|
| Pristine P3HT | 4.4 ± 0.1 |
| P3HT film dipped in PMA solution for 60 min | 4.8 ± 0.1 |
| P3HT film dipped in hydrazine hydrate solution for 30 min | 4.4 ± 0.1 |

| Sample | $J_{SC}$ (mA/cm²) | $V_{OC}$ (mV) | FF | PCE (%) |
|---|---|---|---|---|
| VAK_I_109A | 10.5 ± 0.5 | 800 ± 5 | 0.50 ± 0.01 | 4.2 ± 0.2 |

Averaged over 2 devices, illuminated by Oriel lamp, 100mW/cm²

| Sample | $J_{SC}$ (mA/cm²) | $V_{OC}$ (mV) | FF | PCE (%) |
|---|---|---|---|---|
| VAK_II_46F | 10.5 ± 0.1 | 760 ± 1 | 0.63 ± 0.01 | 5.0 ± 0.1 |

Averaged over 5 devices, illuminated by Oriel lamp, 100 mW/cm²

12-Molybdophosphoric acid hydrate
(PMA)
Lot #W15A045

Poly(3-hexylthiophene-2,5-diyl)
(P3HT)
Lot # PTL14-22

Indene $C_{60}$ Bisadduct
Lot #39030-141006001

1,2-Dichlorobenzene
Sigma-Aldrich

Polyethylenimine, 80% ethoxylated
solution, 35-40 wt. % in $H_2O$ (PEIE)
Lot #04814BGV 2-Methoxyethanol
Sigma-Aldrich
Lot #SHBD1377V

| Substrate Name | $J_{sc}$ (mA/cm²) | $V_{oc}$ (mV) | FF | PCE (%) |
|---|---|---|---|---|
| VAK_I_124B | 10.4 ± 0.1 | 755 ± 1 | 0.53 ± 0.01 | 4.2 ± 0.1 |
| Averaged over 2 devices | | | | |
| VAK_I_124C | 11.5 ± 0.3 | 769 ± 5 | 0.52 ± 0.02 | 4.6 ± 0.1 |
| Averaged over 4 devices | | | | |

Dipped for 60s .25M PMA Solution
Glass/ITO/PEIE/P3HT:ICBA(PMA Doped)/Al

Dipped for 60s .5M PMA Solution
Glass/ITO/PEIE/P3HT:ICBA(PMA Doped)/Al

| Substrate Name | $J_{sc}$ (mA/cm²) | $V_{oc}$ (mV) | FF | PCE (%) |
|---|---|---|---|---|
| VAK_I_124I | 9.0 ± 0.5 | 789 ± 3 | 0.55 ± 0.01 | 4.0 ± 0.2 |
| Averaged over 5 devices | | | | |
| VAK_I_124J | 9.1 ± 0.8 | 793 ± 3 | 0.54 ± 0.01 | 3.9 ± 0.3 |
| Averaged over 4 devices | | | | |

| Sample | $J_{SC}$ (mA/cm$^2$) | $V_{OC}$ (mV) | FF | PCE (%) |
|---|---|---|---|---|
| VAK_I_116C | 7.7 ± 0.2 | 795 ± 6 | 0.56 ± 0.02 | 3.4 ± 0.2 |

Averaged over 3 devices, illuminated by Oriel lamp, 100mW/cm$^2$

| Sample | $J_{SC}$ (mA/cm²) | $V_{OC}$ (mV) | FF | PCE (%) |
|---|---|---|---|---|
| VAK_I_116D | 7.2 ± 0.1 | 820 ± 5 | 0.60 ± 0.02 | 3.5 ± 0.1 |

Averaged over 3 devices, illuminated by Oriel lamp, 100mW/cm²

| Sample | $J_{sc}$ (mA/cm$^2$) | $V_{oc}$ (mV) | FF | PCE (%) |
|---|---|---|---|---|
| VAK_I_116E | 7.5 ± 0.3 | 822 ± 2 | 0.59 ± 0.01 | 3.7 ± 0.2 |

Averaged over 3 devices, illuminated by Oriel lamp, 100mW/cm$^2$

| Sample | $J_{SC}$ (mA/cm²) | $V_{OC}$ (mV) | FF | PCE (%) |
|---|---|---|---|---|
| VAK_I_116F | 8.0 ± 0.1 | 822 ± 9 | 0.48 ± 0.01 | 3.2 ± 0.1 |

Averaged over 3 devices, illuminated by Oriel lamp, 100mW/cm²

| Sample | $J_{SC}$ (mA/cm²) | $V_{OC}$ (mV) | FF | PCE (%) |
|---|---|---|---|---|
| VAK_I_116G | 8.6 ± 0.1 | 824 ± 10 | 0.43 ± 0.01 | 3.1 ± 0.1 |

Averaged over 3 devices, illuminated by Oriel lamp, 100mW/cm²

12-Molybdophosphoric acid hydrate
(PMA)
Lot #W15A045

Poly(3-hexylthiophene-2,5-diyl)
(P3HT)
Lot # PTL14-22

PEDOT:PSS AI 4083

1,2-Dichlorobenzene
Sigma-Aldrich

Phosphotungstic Acid Hydrate
(PTA)

Poly(3-hexylthiophene-2,5-diyl)
(P3HT)

| Substrate Description | WF (eV) |
|---|---|
| Pristine P3HT | 4.4 ± 0.1 |

| Substrate Description | WF (eV) | |
|---|---|---|
| | PMA | PTA |
| P3HT doped | 4.8 ± 0.1 | 4.6 ± 0.1 |
| P3HT doped rinsed with chlorobenzene | 4.8 ± 0.1 | Partially dissolved |
| P3HT de-doped in hydrazine hydrate | 4.4 ± 0.1 | 4.5 ± 0.1 |
| P3HT doped 2nd time | 4.7 ± 0.1 | 4.6 ± 0.1 |

*Taken at 4 spots on each substrate

PCDTBT

12-Molybdophosphoric acid hydrate
(PMA)

Poly(3-hexylthiophene-2,5-diyl)
(P3HT)

Indene $C_{60}$ Bisadduct
(ICBA)

Polyethylenimine, 80% ethoxylated
solution, 35-40 wt. % in $H_2O$ (PEIE)

| Sample | $J_{SC}$ (mA/cm²) | $V_{OC}$ (mV) | FF | PCE (%) |
|---|---|---|---|---|
| VAK_II_15F | 6.0 ± 1.0 | 821 ± 2 | 0.55 ± 0.01 | 2.7 ± 0.5 |

Averaged over 3 devices, illuminated by Oriel lamp, 100 mW/cm²

| Sample | $J_{SC}$ (mA/cm²) | $V_{OC}$ (mV) | FF | PCE (%) |
|---|---|---|---|---|
| VAK_II_52G | 9.0 ± 0.5 | 835 ± 2 | 0.54 ± 0.01 | 4.1 ± 0.3 |

Averaged over 4 devices, illuminated by Oriel lamp, 100 mW/cm²

| Sample | $J_{SC}$ (mA/cm$^2$) | $V_{OC}$ (mV) | FF | PCE (%) |
|---|---|---|---|---|
| VAK_II_22F | 9.6 ± 0.3 | 771 ± 4 | 0.60 ± 0.02 | 4.4 ± 0.2 |

Averaged over 4 devices, illuminated by Oriel lamp, 100 mW/cm$^2$

12-Molybdophosphoric acid hydrate
(PMA)

Poly(3-hexylthiophene-2,5-diyl)
(P3HT)

Indene C$_{60}$ Bisadduct
(ICBA)

Polyethylenimine, 80% ethoxylated
solution, 35-40 wt. % in H$_2$O (PEIE)

| Sample | $J_{SC}$ (mA/cm$^2$) | $V_{OC}$ (mV) | FF | PCE (%) |
|---|---|---|---|---|
| FL-I-50F | 8.6 ± 0.2 | 794 ± 4 | 0.69 ± 0.01 | 4.9 ± 0.1 |

Averaged over 4 devices, illuminated by Oriel lamp, 100 mW/cm$^2$

| Sample | $J_{SC}$ (mA/cm$^2$) | $V_{OC}$ (mV) | FF | PCE (%) |
|---|---|---|---|---|
| VAK_II_48F | 13.6 ± 0.4 | 799 ± 3 | 0.55 ± 0.01 | 6.0 ± 0.1 |

Averaged over 4 devices, illuminated by Oriel lamp, 100 mW/cm$^2$

12-Molybdophosphoric acid hydrate (PMA)

PC$_{70}$BM

Polyethylenimine, 80% ethoxylated solution, 35-40 wt. % in H$_2$O (PEIE)

PffBT4T-2OD (PCE11)

| Sample | $J_{sc}$ (mA/cm$^2$) | $V_{oc}$ (mV) | FF | PCE (%) |
|---|---|---|---|---|
| VAK_II_52H | 16.8 ± 0.3 | 704 ± 1 | 0.66 ± 0.01 | 7.8 ± 0.2 |

Averaged over 3 devices, illuminated by Oriel lamp, 100 mW/cm$^2$

| Polymer Film | WF (eV) (Pristine) | WF (eV) (Doped) |
|---|---|---|
| PIPCP | 4.8 ± 0.1 | 5.1 ± 0.1 |

12-Molybdophosphoric acid hydrate (PMA)

PffBT4T-2OD

| Polymer Film | WF (eV) (Pristine) | WF (eV) (Doped) |
|---|---|---|
| PffBT4T-2OD | 4.8 ± 0.1 | 5.3 ± 0.1 |

12-Molybdophosphoric acid hydrate (PMA)

X2

| Polymer Film | WF (eV) (Pristine) | WF (eV) (Doped) |
|---|---|---|
| X2 | 4.7 ± 0.1 | 5.2 ± 0.1 |

12-Molybdophosphoric acid hydrate
(PMA)

Poly(3-hexylthiophene-2,5-diyl)
(P3HT)

12-Molybdophosphoric acid hydrate (PMA)　　　PCDTBT

| Sample name | Sample description | Work function (eV) |
|---|---|---|
| WFC-I-14ref | Pristine P3HT film | 4.43 ± 0.02 |
| WFC-I-14A | P3HT film dipped in PMA in nitromethane | 5.05 ± 0.06 |
| WFC-I-14B | P3HT film dipped in PMA in IPA | 4.46 ± 0.02 |
| WFC-I-14C | P3HT film dipped in PMA in DMSO | 4.49 ± 0.04 |
| WFC-I-15ref | Pristine P3HT film | 4.42 ± 0.02 |
| WFC-I-15D | P3HT film dipped in PMA in ethanol | 4.72 ± 0.02 |

DEVICES WITH ORGANIC SEMICONDUCTOR LAYERS ELECTRICALLY-DOPED OVER A CONTROLLED DEPTH

CROSS REFERENCE TO RELATED APPLICATION

This application claims priority under 35 U.S.C. 119 to U.S. Provisional Patent Application No. 62/173,067 entitled "Controlling the Solubility and Electrical Conductivity of Organic Semiconductor Films by Reversible Doping," filed 9 Jun. 2015, the contents of which are incorporated by reference in their entirety as if fully set forth herein.

STATEMENT REGARDING FEDERALLY SPONSORED RESEARCH OR DEVELOPMENT

This invention was made with government support under grant number N00014-14-1-0126 awarded by the United States Navy Office of Naval Research. The government has certain rights in the invention.

FIELD OF THE DISCLOSED TECHNOLOGY

The disclosed technology generally relates to the reversible electrical doping and patterning of organic semiconductor layers and their use in organic electronic devices.

BACKGROUND

Controlled electrical doping of inorganic semiconductors has been key to the success of microelectronics. Methods to produce controlled electrical doping of thin organic semiconductor layers with a thickness in the range from a few nanometers to hundreds of nanometers, is expected to play an enabling role for the development of organic electronic devices such as organic light-emitting devices (OLEDs), organic thin-film transistors (OTFTs), organic photovoltaic devices (OPVs), organic photodetectors, organic memories, and any device containing an organic semiconductor in which electric charge is introduced or removed. Chemical and electrochemical doping are known methods for electrical doping traditional organic semiconductors.

Chemical doping (p[n]-type) is typically realized by mixing strong electron acceptor [donor] molecules within the bulk of an organic semiconductor layer to generate free holes [electrons]. The generated free carriers increase the conductivity and thus minimize ohmic losses through the organic semiconductor and in certain cases facilitate carrier injection and extraction by reducing the contact resistance. Furthermore, dopant molecules need to be immobilized within the bulk of the organic semiconductor to prevent diffusion of dopant molecules and degradation of the electronic properties of the devices.

Chemical doping of organic semiconductors is also typically realized through the coevaporation under vacuum of dopant and organic semiconductor molecules to form a thin organic semiconductor layer on a substrate. Alternatively, doped organic semiconductor layers can be processed by dissolving dopant and organic semiconductor molecules into organic solvents to form a solution from which a thin layer can be processed onto a substrate or any type of underlying layer. However, this method requires that the ionic species formed upon charge transfer reactions between organic semiconductor and dopant molecules remain soluble enough in order to avoid the precipitation of reactants. Although methods to produce thin doped organic semiconductor layers from solution in ambient conditions hold the promise to be more economical than those requiring material evaporation under vacuum, limited solubility of reactants can hinder the ability to process uniform high-quality doped-films that are suitable for organic electronic applications.

Polyoxometalates are a well-known class of transition metal-oxide nanocluster materials with various sizes for a very wide range of applications. Polyoxometalates are polyatomic ions typically consisting of transition metals such as vanadium (V), niobium (Nb), tantalum (Ta), molybdenum (Mo) and tungsten (W) in high oxidation states covalently linked through oxygen atoms forming a closed 3-dimensional framework with general formula $\{MO_x\}_n$, where M=Mo, W, V or Nb. Polyoxometalates display a very large range of framework structures such as Keggin, Dawson, Anderson, Lindqvist structures among many others. Of particular interest are frameworks comprising transition metal oxides and acidic hydrogen atoms linked to an element such as silicon (Si), phosphorous (P), arsenic (As), tungsten (W), among others typically chosen from the p-block of the periodic table, having a general formula $H_k\{X_sM_nO_m\}_p$, where X is an element referred to as heteroatom typically chosen from the p-block and located at the center of the framework, and M is a transition metal. Frameworks having this composition are known as heteropolyacids and are widely used as catalyst. Heteropolyacids with a ratio $X/M=1/12$ typically form frameworks having a Keggin structure and typically display good thermal stability, high acidity and are strong oxidants.

Phosphomolybdic acid (PMA), phosphotungstic acid (PTA) and silicotungstic acid are known heteropolyacids that have been used in organic electronic devices such as organic light-emitting diodes and organic photovoltaics as hole and electron transport layers, but not as dopants. A limitation of using polyoxometalates as dopants of solution processable organic layers is that their radical salts display limited solubility in commonly used organic solvents and precipitate in solution, thus preventing processing of uniform thin layers required for efficient organic electronic devices, and limiting the ability to control the degree of doping.

A need exists for improved methods and dopant/solvent combinations that allow controlled electrical doping of high-quality organic semiconductor layers for use with organic electronic devices.

BRIEF SUMMARY

Some or all of the above needs may be addressed by certain embodiments of the disclosed technology.

According to an exemplary embodiment of the disclosed technology, a semiconductor device is provided. The semiconductor device includes a first substrate, and an organic semiconductor film disposed on the first substrate. The organic semiconductor film has a first region characterized by electrical dopant molecules distributed to a controlled depth with respect to a first surface of the organic semiconductor film. The semiconductor device further includes an electrode in contact with at least a portion of the first region of the organic semiconductor film.

According to another exemplary embodiment of the disclosed technology, a method is provided. The method includes forming a layer of an organic semiconductor film on a substrate, exposing a first region of an outer surface of the organic semiconductor film to a doping environment, the doping environment including both dopant and solvent molecules. The dopant includes an electrical dopant. The method further includes controlling a depth of diffusion of the electrical dopant into a bulk of the organic semiconductor film by selecting a duration of the exposure to the doping environment. The dopant is selected to produce a film that reduces a solubility of the film, increases a photo-oxidation stability of the film; and facilitates one or more of transport, injection and collection of charge carriers in the organic semiconductor film.

Certain embodiments of the disclosed technology include a method to reversibly dope a thin layer of an organic semiconductor.

These and other objects, features and advantages of the disclosed technology will become more apparent upon reading the following specification in conjunction with the accompanying figures and examples.

BRIEF DESCRIPTION OF THE FIGURES

FIG. 5 (bottom figure) depicts profiling of Mo(3d) at various depths in a P3HT film after immersion in PMA. Surface material of the film is removed by ion beam etching between successive XPS measurements, indicating Mo(3d) diffusion to 50 nm.

FIG. 83 shows work function values of the P3HT films, as described in Example 34.

DETAILED DESCRIPTION

Certain embodiments of the disclosed technology relate to systems, methods, devices, and materials for electrically-doping organic semiconductor film by diffusion of certain dopants into the bulk of the film. As disclosed herein, the depth of diffusion of the dopant into the film may be controlled, for example, by controlling an exposure time of the organic semiconductor film to the dopant and a solvent.

Certain example implementations of the disclosed technology described herein relate to an organic semiconductor layer (and/or film) that may act as an acceptor material in which electrical donor molecules exposed to a surface of the film may be diffused within a bulk of the film to a controlled depth. Certain example implementations may utilize materials and techniques disclosed herein to produce organic semiconductor layer or film having a doped outer layer portion. In certain example implementations, the presence of solvent molecules together with the donor molecules may facilitate the diffusion of the donor molecules into the bulk of the film. The various materials disclosed herein may be selected such that doping the film may stabilize certain characteristics of the film, including but not limited to photo-oxidation and/or solubility of the film.

One aspect of the disclosed technology includes selectively controlling a patterning of the film doping. For example, an aperture may be formed to selectively dope a first region of the organic semiconductor layer by selective exposure to the donor and solvent molecules, while a second region of the organic semiconductor layer may be masked or blocked to prevent the exposure.

Another aspect of the disclosed technology includes selectively de-doping a portion of a doped region of the organic semiconductor layer. For example, an aperture may be formed to selectively expose a third region of the doped organic semiconductor layer to a solution (for example, to a basic solution) to selectively remove or neutralize at least a portion of the donor molecules from the third region, while a fourth region of the doped organic semiconductor layer may be masked or blocked to prevent the de-doping exposure. As understood by those having skill in the art, the disclosed technology may provide certain tangible benefits for manufacturing a range of organic semiconductor devices.

Embodiments of the disclosed technology will be described more fully hereinafter with reference to the accompanying drawings, in which certain example embodiments are disclosed.

Figure 1:
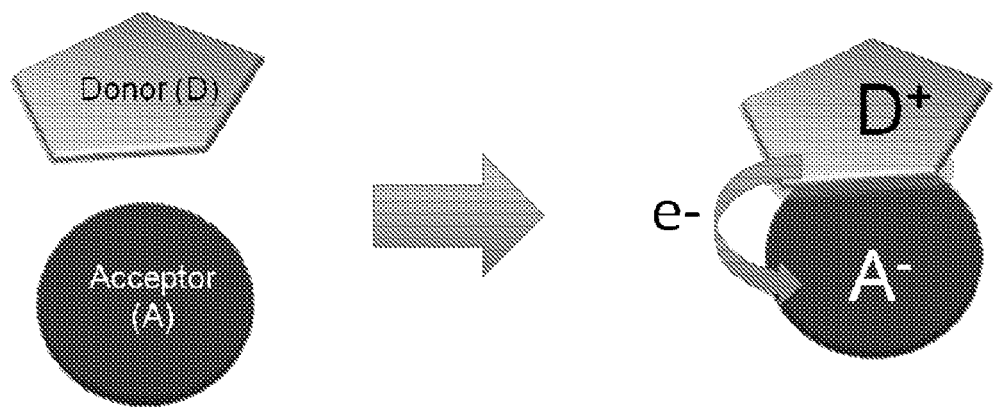
FIG. 1 depicts a general oxidation-reduction process in which a donor molecule gives up an electron to an acceptor molecule, thereby changing the electrical charge of the acceptor molecule.

FIG. 1 depicts a general oxidation-reduction process in which a donor molecule gives up an electron to an acceptor molecule, thereby changing the electrical charge of the acceptor molecule. Certain doped organic semiconductor layers can be processed by dissolving dopant and organic semiconductor molecules into organic solvents to form a solution from which a thin layer can be processed onto a substrate. However, such related methods can require that the ionic species formed upon charge transfer reactions between organic semiconductor and dopant molecules remain soluble enough in order to avoid the precipitation of reactants. The limited solubility of reactants can hinder the ability to process uniform high-quality doped-films that are suitable for organic electronic applications. Certain exemplary embodiments of the disclosed technology can be utilized to address this issue.

Figure 2:
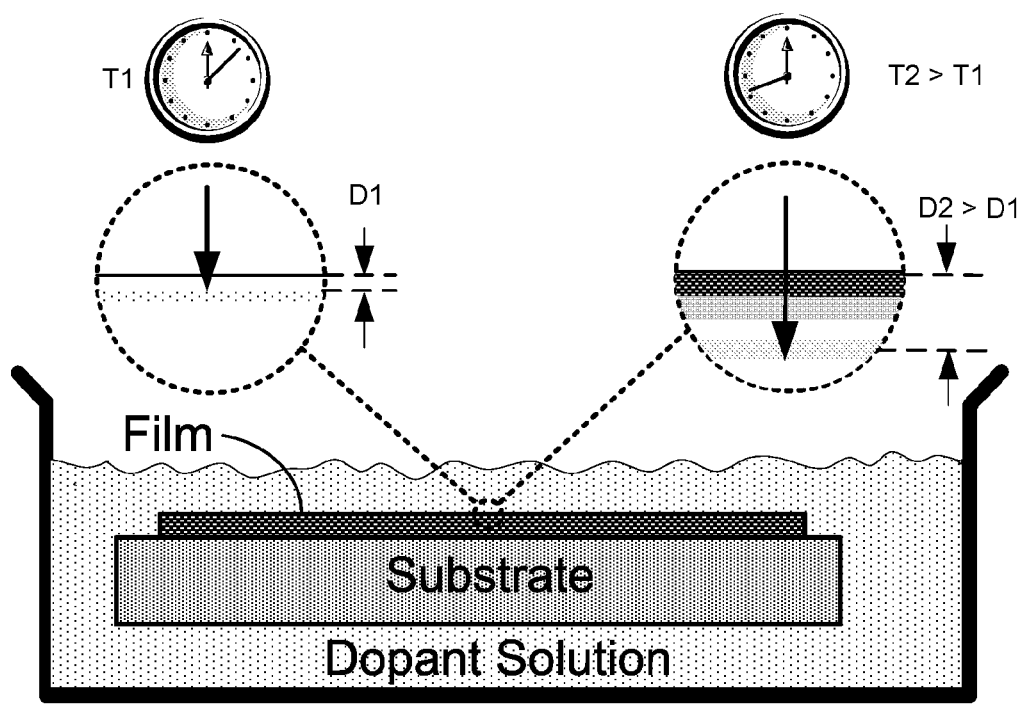
FIG. 2 depicts an electrical doping process of an organic semiconductor film, with a diffusion depth controlled by a time of exposure to the dopant, according to an example implementation of the disclosed technology.

FIG. 2 depicts an illustrative process for electrically-doping an organic semiconductor. According to an example implementation of the disclosed technology, the dopant diffusion depth (D1, D2) into the bulk of the film may be controlled by controlling a time of exposure. In one implementation, an organic semiconductor layer (film) may be deposited on a substrate, which may be an insulator, a metal, a metal-oxide, a polymer electrode, etc. According to an example implementation of the disclosed technology, the exposed surface of the film may be in contact with the dopant and a solvent. As indicated in FIG. 2, upon exposure of the film to the dopant solution, the dopant may initially diffuse into the organic semiconductor film to a shallow depth D1. As the film remains exposed to the dopant/solvent the dopant may continue to diffuse to a greater depth (D2) corresponding to the exposure time duration T2-T1.

The illustrative process shown in FIG. 2 depicts immersion of the film into a dopant solution that includes a dopant and solvent. However, certain example implementations the disclosed technology can include exposing the film to the dopant, solvent, and/or de-dopant via numerous other methods, including but not limited to exposure via vapor, spraying, printing, coating, stamping, stenciling, etc., without departing from the scope of the disclosed technology.

Figure 3:
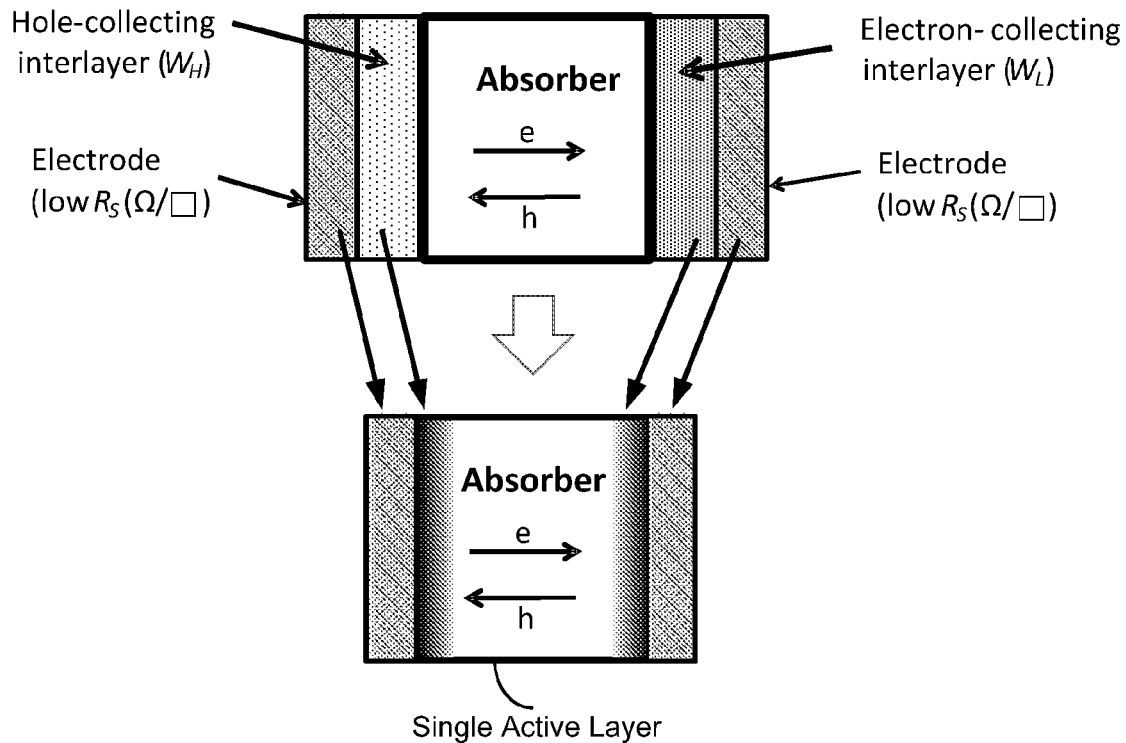
FIG. 3 depicts a typical multi-layer device (top figure) compared with a single active layer device (bottom figure) that may be made using certain example implementations of the disclosed technology.

FIG. 3 depicts one beneficial aspect of the disclosed technology in which certain traditional processing steps and/or layers may be simplified, eliminated, and/or incorporated into a single active layer. For example, the top figure depicts a typical multi-layer solar cell device that includes outer electrode layers, a separate hole-collecting interlayer, a separate electron-collecting interlayer, and a middle absorber layer. In contrast, and according to an example implementation of the disclosed technology, the bottom figure depicts a single-active layer device in which one or more of the hole and electron collecting interlayers may be combined or included with the absorber layer. In this respect, certain example implementations of the disclosed technology may enable the use of an organic semiconductor layer for devices in which the hole and/or electron layers are integrated into a single active layer by diffusion of appropriate respective dopants into the organic semiconductor layer. In accordance with certain example implementation of the disclosed technology, the inclusion of the "interlayers" into the single active layer (i.e., into the organic semiconductor layer) may enable simplification of processing and materials. In some instances, the disclosed technology may enable making devices that have a relatively thicker active layer, as compared with traditional devices and processes. A technical benefit related to the thicker active layer is the reduction of pinholes and defects in the film.

Figure 4:
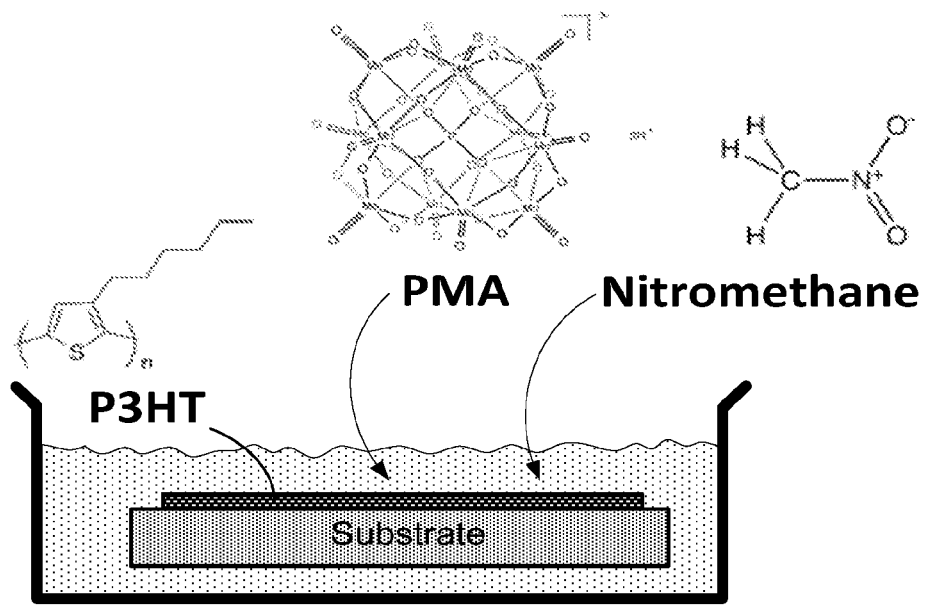
FIG. 4 depicts an electrical doping process utilizing certain materials as the dopant, acceptor, and solvent, according to an example implementation of the disclosed technology.

FIG. 4 depicts an electrical doping process utilizing certain materials as the dopant, acceptor, and solvent, according to an example implementation of the disclosed technology. For example, in this particular illustration, the organic semiconductor film may include P3HT, the dopant molecule may be PMA, and the solvent may be nitromethane. Numerous other materials, processes, and measurement results are disclosed herein and are presented below in the "EXPERIMENTAL RESULTS AND EXAMPLES" section of this disclosure. The materials and process depicted in FIG. 4 may relate to one example for the purpose of illustration. Other materials and processes are contemplated and included herein without limiting the scope of the disclosed technology to these particular materials.

As discussed above with reference to FIG. 2 and according to an example implementation of the disclosed technology, the doped organic semiconductor film may be characterized by electrical dopant molecules distributed to a controlled depth with respect to the surface of the film.

Figure 5:
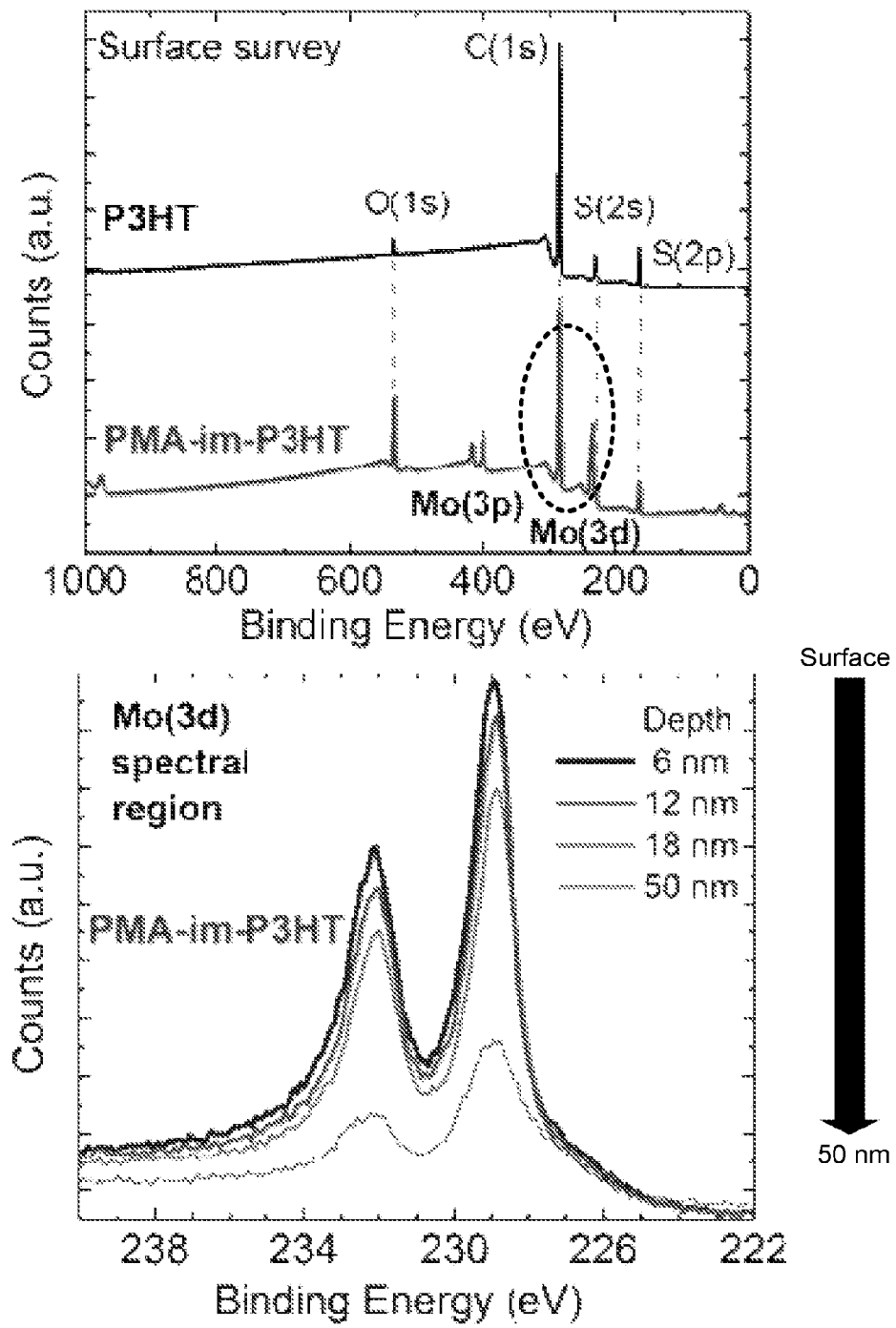
FIG. 5 (top figure) shows a X-ray photoelectron spectrograph (XPS) of a P3HT film surface (top curve) and P3HT after immersion in PMA (bottom curve) in which Mo(3d) is utilized for determining dopant diffusion depth.

FIG. 5 shows experimental results of dopant concentration as a function of the diffusion depth into the film. For example, the top curve in the top graph of FIG. 5 shows a X-ray photoelectron spectrograph (XPS) of a P3HT film surface. The bottom curve of the top graph of FIG. 5 shows the P3HT film after immersion in a PMA solution. In accordance with an example implementation of the disclosed technology, the measurement of Mo(3d) may be utilized for determining dopant diffusion depth. The bottom chart of FIG. 5 shows profiling of Mo(3d) at various depths in a P3HT film after immersion in a PMA solution, indicating Mo(3d) diffusion up to at least 50 nm for this sample. The profiling of the Mo(3d) into the depth of the film was carried out by removing successive top portions of the film by ion beam etching between successive XPS measurements.

Figure 6:
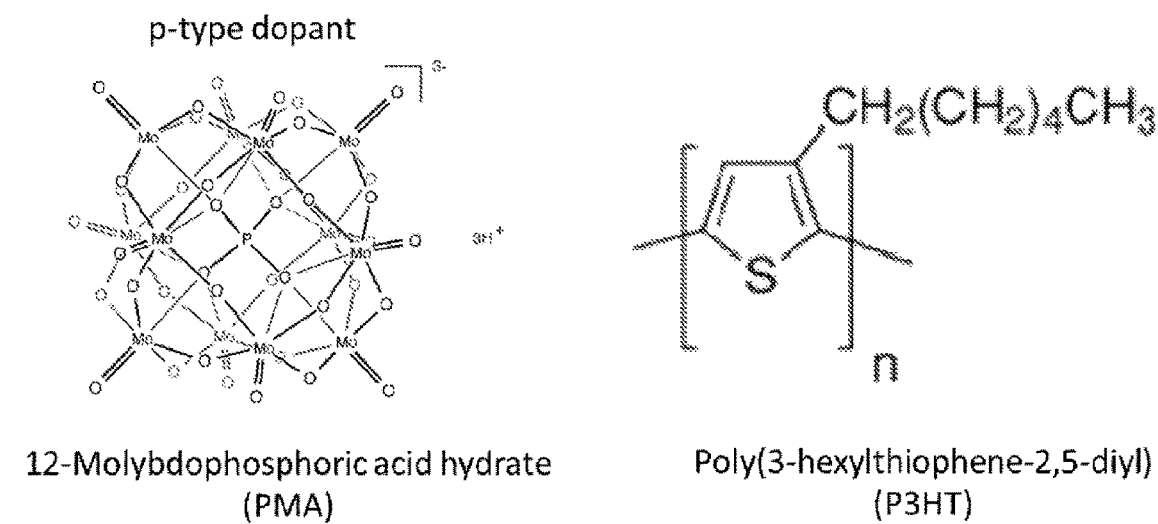
FIG. 6 depicts chemical structures of PMA and P3HT (top figure), a sample geometry of P3HT film on a glass substrate (middle figure), and work function values (bottom figure) for pristine P3HT and P3HT samples dipped in PMA solution for various durations, as discussed with reference to Example 1.
Figure 6:
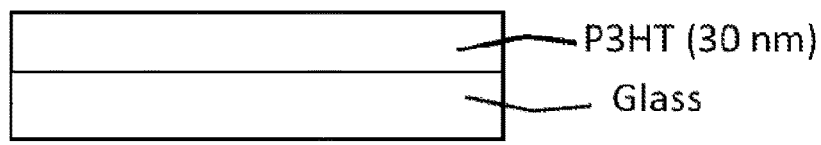

FIGS. 6-83 are discussed below in the "EXPERIMENTAL RESULTS AND EXAMPLES" section of this disclosure.

Figure 84:
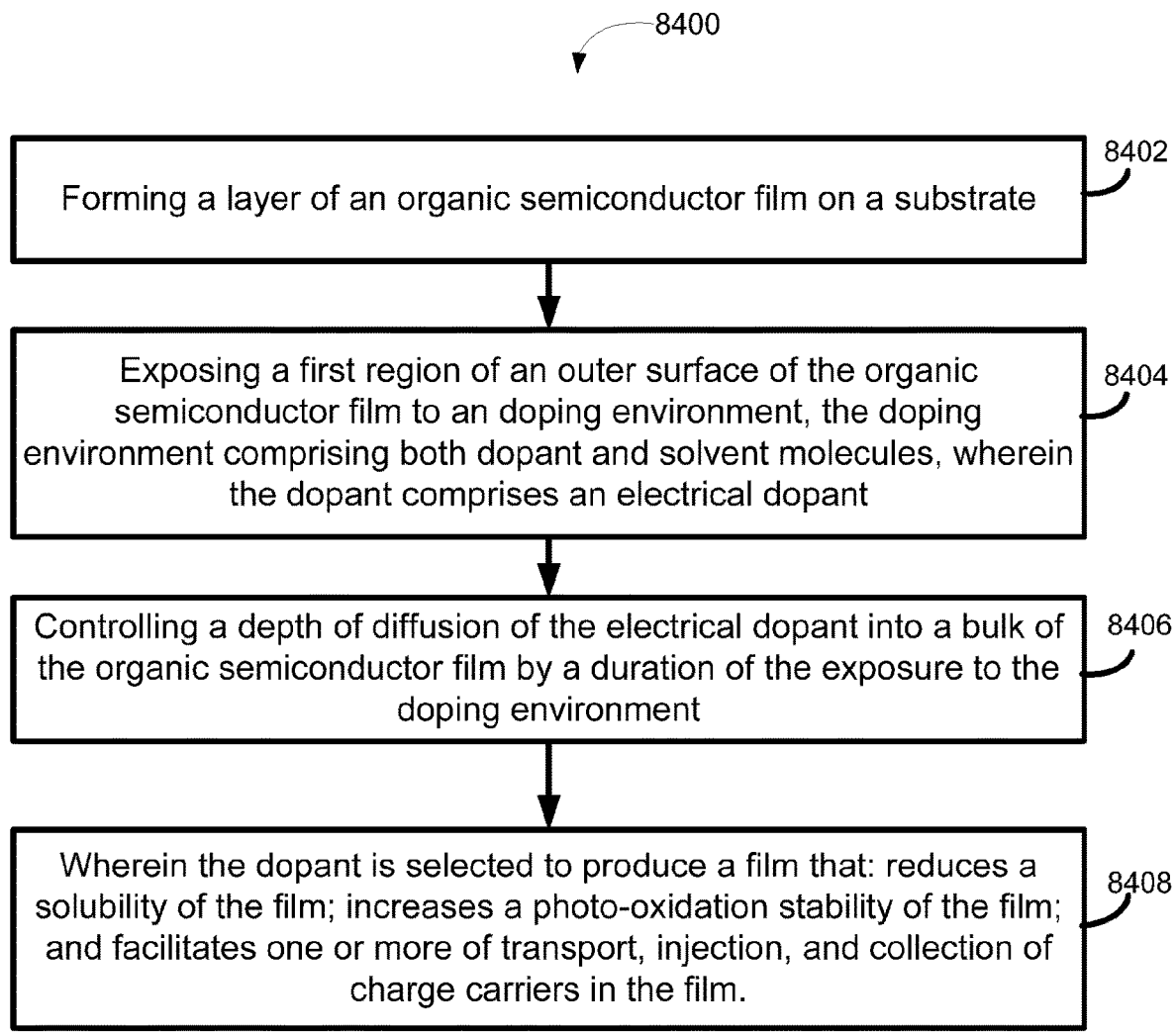
FIG. 84 is a flow diagram of a method, according to an example implementation of the disclosed technology.

FIG. 84 is a flow diagram of a method 8400, according to an example implementation of the disclosed technology. In block 8402, the method 8400 includes forming a layer of an organic semiconductor film on a substrate. In block 8404, the method 8400 includes exposing a first region of an outer surface of the organic semiconductor film to a doping environment, the doping environment comprising both dopant and solvent molecules, wherein the dopant comprises an electrical dopant. In block 8406, the method 8400 includes controlling a depth of diffusion of the electrical dopant into a bulk of the organic semiconductor film by controlling a duration of the exposure to the doping environment. In block 8408, the method 8400 specifies that dopant is selected to produce a film that reduces a solubility of the film, increases a photo-oxidation stability of the film, and facilitates one or more of transport, injection and collection of charge carriers in the film.

In accordance with an example implementation of the disclosed technology, exposing the film to the doping environment can include immersing the film in a polyoxometalate solution.

In certain example implementations, exposing the film to the doping environment can include exposing the film to a solvent of nitromethane.

According to an example implementation of the disclosed technology, the method can include exposing a second region of the doped organic semiconductor film to an environment including a basic solvent for a predetermined duration to de-dope the film by removal of at least a portion of the electrical dopant from the second region. Certain example implementations can further include drying the film. In certain example implementations, the basic solvent can include hydrazine.

According to an example implementation of the disclosed technology, a sheet resistance of the de-doped film in the second region may be substantially equivalent to a sheet resistance of an un-doped organic semiconductor film.

In certain example implementations, a Fermi level energy of the de-doped film in the second region is substantially equivalent to that of an un-doped organic semiconductor film.

According to an example implementation of the disclosed technology, forming the layer of the organic semiconductor film on the substrate can include forming a film characterized by a thickness range from about 10 nm to about 10 000 nm.

In certain example implementations, the film may be formed by spin coating. Various other methods may be utilized to form the film without departing from the scope of the disclosed technology.

In certain example implementations, forming the layer of the organic semiconductor film on the substrate can include forming the layer on one or more of an insulator, a semiconductor, a conductor, a metal, a metal-oxide, and a polymer electrode.

In an example implementation, the organic semiconductor can include one or more of a conjugated polymer, a conjugated molecule, a conjugated supramolecular structure, and a combination thereof.

In certain example implementations, the doping environment can include molybdenum (Mo).

In certain example implementations, the doping environment can include tungsten (W).

According to an example implementation of the disclosed technology, exposing the first region of the outer surface of the organic semiconductor film to the doping environment reduces a solubility of the organic semiconductor film.

In an example implementation, exposing the first region of the outer surface of the organic semiconductor film to the doping environment increases a photo-oxidation stability of the organic semiconductor film.

According to an example implementation of the disclosed technology, the exposing of the organic semiconductor film to the doping environment, and controlling the depth of diffusion may produce one or more of: an active layer of a solar cell, an active layer of a single-active layer solar cell; and an active layer of a single-active layer P-I-N junction.

Certain example implementations may be utilized to produce a semiconductor device that can include a first substrate, an organic semiconductor film disposed on the first substrate, the organic semiconductor film having a first region characterized by electrical dopant molecules distributed to a controlled depth with respect to a first surface of the organic semiconductor film. Certain example implementations may further include an electrode in contact with at least a portion of the first region of the organic semiconductor film In certain example implementations, the organic semiconductor film is further characterized by a second region in which the diffused dopant molecules are at least partially removed. In certain example implementations, the organic semiconductor film is further characterized by a second region in which the diffused dopant molecules are at least partially neutralized. In some implementations, the distributed dopant molecules may be at least partially removed (or neutralized) by exposure of one or more of the first and second region to hydrazine.

According to an example implementation of the disclosed technology, the substrate can include one or more of an insulator, a semiconductor, a conductor, a metal, a metal-oxide, and a polymer electrode.

In certain example implementations, the organic semiconductor can include one or more of a conjugated polymer, a conjugated molecule, a conjugated supramolecular structure, and a combination thereof.

According to certain example implementations of the disclosed technology, the organic semiconductor film may have a thickness in the range from about 10 nm to about 10,000 nm.

In certain example implementations, the dopant molecules can include a strong oxidizing agent.

In an example implementation, the dopant molecules comprise molybdenum (Mo).

In another example implementation, the dopant molecules comprise tungsten (W).

According to an example implementation of the disclosed technology, the dopant molecules reduce the solubility of the organic semiconductor film.

According to an example implementation of the disclosed technology, the dopant molecules increase a photo-oxidation stability of the organic semiconductor film.

In accordance with an example implementation of the disclosed technology, the dopant molecules comprise a p-dopant.

In certain example implementations, the dopant molecules can include a strong reducing agent.

In accordance with an example implementation of the disclosed technology, the dopant molecules can include a n-dopant.

In certain example implementations, the dopant molecules can include a polyoxometalate.

According to an example implementation of the disclosed technology, the doped organic semiconductor film can form an active layer of a solar cell.

In certain example implementations, the doped organic semiconductor film may form an active layer of a single-active layer solar cell.

In certain example implementations, the doped organic semiconductor film may form an active layer of a single-active layer P-I-N junction.

According to an example implementation of the disclosed technology, the diffused electrical dopant molecules are configured to facilitate one or more of transport, injection and collection of charge carriers.

In certain example implementations, the doped organic semiconductor film is characterized by a bulk conductivity that is controlled to be in a range of about 0.1 to about 3.0 S cm$^{-1}$.

In certain example implementations, the doped organic semiconductor film is characterized by a dopant diffusivity instability of less than 5.0% over 300 h at 60 degrees C.

Exemplary embodiment of the disclosed technology, as discussed herein, may relate to certain methods for doping a thin layer of an organic semiconductor. One method can include forming a thin layer of an organic semiconductor on a surface of a substrate; immersing the semiconductor layer in a polyoxometalate solution at room temperature for a prescribed period time; washing the semiconductor layer to remove excess polyoxometalate molecules from its surface; and drying the semiconductor layer to evaporate excess solvent. In certain example implementations, the sheet resistance and Fermi level energy of the thin semiconductor layer may be substantially modified after the film is washed and dried. For example, the work function of a polymer immersed on a polyoxometalate solution can be changed by up to 0.5 eV and its sheet resistance decreased by up to 7 orders of magnitude.

According to exemplary embodiments of the disclosed technology, a method can include tuning the sheet resistance and Fermi level energy of an organic semiconductor layer by controlling the concentration of the polyoxometalate solution, the immersion time or a combination thereof.

Exemplary embodiments of the disclosed technology relate to the use and processing of thin polymeric or molecular layers that are doped by immersion. According to one exemplary embodiment of this disclosed technology the polyoxometalate comprises phosphomolybdic acid (PMA). According to another exemplary embodiment of this disclosed technology the polyoxometalate comprises phosphotungstic acid (PTA).

Polyoxometalates are known to be soluble in polar aprotic solvents such as acetone, dimethyl sulfoxide, etc or polar protic solvents such as nitromethane, methanol, isopropanol, etc. According to an exemplary embodiment of this disclosed technology, a solvent or a mixture of solvents may be selected such that it produces controlled swelling of an organic semiconductor layer immersed in a solution of the solvent, but not such that is completely dissolves the organic semiconductor layer. In one embodiment of the disclosed technology, dilute polyoxometalate solutions with concentrations in the range from 1 mM to 1 M may be prepared in nitromethane.

According to an exemplary embodiment of the disclosed technology, the polyoxometalate may be selected to display an electron affinity that is larger than the ionization potential of the organic semiconductor to be p-doped. This selection allows for an efficient electron-transfer from the organic semiconductor layer into the polyoxometalate, leading to p-doping of the organic semiconductor layer.

According to another exemplary embodiment of the disclosed technology, the polyoxometalate may be selected to display an ionization potential that is smaller than the electron affinity of the organic semiconductor to be doped. This selection allows for an efficient electron-transfer from the polyoxometalate into the organic semiconductor layer, leading to n-doping of the organic semiconductor layer.

According to another exemplary embodiment of the disclosed technology, polyoxometalate-doped organic semiconductor layers may become less soluble in the solvents commonly used to dissolve the organic semiconductor. In one embodiment of the disclosed technology, polyoxometalate-doped organic semiconductor layers may become completely insoluble in the solvents commonly used to dissolve the organic semiconductor. Herein, the term insolubility is defined as the condition such that a change of the absorption or transmission spectra of a film composed of the doped-organic semiconductor is less than 25%, more preferably less than 10% and most preferably less than 1% after washing with the solvent used to dissolve the organic semiconductor.

Other embodiments include an article having a first organic semiconductor layer processed on a substrate from a solution in a solvent "A" and doped by immersion in a solution of a dopant dissolved in solvent "B" which renders the first doped-organic semiconductor layer insoluble in solvent "A", and a second organic semiconductor layer processed from a solution in solvent "A" wherein the deposition of the second organic semiconductor layer does not result in the dissolution of the first doped-organic semiconductor layer.

It should be noted to those skilled in the art that cross linking by the formation of covalent bonds is a common method to render materials insoluble. However, a potential limitation of such approaches include the need from cross linker, thermal heating, photochemistry, irreversibility of the cross-linking process, among others, leading to increased complexity of synthesis, the potential modification of the intrinsic properties of the organic semiconductor layers due to the addition of cross linkers and the potential decomposition of the material during the cross linking process. The approach disclosed herein, thus provides a means to simultaneously and reversibly modify the electrical properties and the solubility of an organic semiconductor film without the need to resort to the additions means described above.

It should also be noted to those skilled in the art, that other dopant molecules processed as described herein may lead to similar effects in that they may dope a semiconductor film while at the same time rendering it insoluble. Such dopants include nitrosonium hexafluorophosphate, "magic" blue, metal dithiolenes and Mo(tfd).

Other embodiments of this disclosed technology can include an article having: a substrate; a conducting layer that includes a noble metal, a transparent conducting metal oxide, graphene, or an organic conductor; a polyoxometalate-doped organic semiconductor layer including one or more organic semiconductor materials; and a top conducting layer comprising a noble metal, a transparent conducting metal oxide, graphene, or an organic conductor.

Other embodiments include an article having: a substrate; a conducting layer including a noble metal, a transparent conducting metal oxide, graphene, or an organic conductor; a polyoxometalate-doped organic semiconductor layer comprising one or more organic semiconductor materials; a plurality of organic semiconductor layers disposed on top of the polyoxometalate-doped organic semiconductor layer; and a top conducting layer comprising a noble metal, a transparent conducting metal oxide, graphene, or an organic conductor.

According to another exemplary embodiment of the disclosed technology, a method is provided for patterning a thin layer of an organic semiconductor film. The method can include forming a thin layer of an organic semiconductor on a surface of a substrate; applying to at least a portion of the semiconductor layer a polyoxometalate solution at room temperature for a prescribed period time; washing the semiconductor layer to remove excess polyoxometalate molecules; drying the semiconductor layer to evaporate excess solvent; and immersing the semiconductor layer in a solvent to dissolve the portions of the semiconducting layer not exposed to the polyoxometalate solution.

Other embodiments include an article having: a substrate; a conducting layer comprising a noble metal, a transparent conducting metal oxide, graphene, or an organic conductor; a patterned polyoxometalate-doped organic semiconductor layer comprising one or more organic semiconductor materials; and a top conducting layer comprising a noble metal, a transparent conducting metal oxide, graphene, or an organic conductor.

Other embodiments include an article having: a substrate; a conducting layer comprising a noble metal, a transparent conducting metal oxide, graphene, or an organic conductor; a patterned polyoxometalate-doped organic semiconductor layer comprising one or more organic semiconductor materials; a plurality of organic semiconductor layers disposed on top of the polyoxometalate-doped organic semiconductor layer; and a top conducting layer comprising a noble metal, a transparent conducting metal oxide, graphene, or an organic conductor.

According to an exemplary embodiment of the disclosed technology, a method is provided for de-doping a thin layer of a polyoxometalate-doped organic semiconductor film. The method can include forming a thin layer of an organic semiconductor on a surface of a substrate; immersing the semiconductor layer in a polyoxometalate solution at room temperature for a prescribed period time; washing the semiconductor layer to remove excess polyoxometalate molecules from its surface; drying the semiconductor layer to evaporate excess solvent; immersing the doped semiconductor layer into a basic solution for a prescribed period of time; and drying the film, wherein the conductivity and Fermi level energy of the thin semiconductor layer are not substantially changed, after the last drying step, with respect to values found on pristine films. According to one embodiment of the disclosed technology, a basic solution may be formed by dissolving NaOH in any of water, ethanol or methanol. According to another embodiment of the disclosed technology, a basic solution may be formed by dissolving hydrazine hydrate 500 mM in acetonitrile.

Those skilled in the art will recognize that multiple cycles of doping and de-doping can be used to produce functional devices with patterned layers. Other embodiments include an article having: a substrate; a conducting layer comprising a noble metal, a transparent conducting metal oxide, graphene, or an organic conductor; an organic semiconductor layer comprising one or more organic semiconductor materials which have undergone a cycle polyoxometalate-doping and de-doping; and a top conducting layer comprising a noble metal, a transparent conducting metal oxide, graphene, or an organic conductor.

Other embodiments include an article having: a substrate; a conducting layer comprising a noble metal, a transparent conducting metal oxide, graphene, or an organic conductor; an organic semiconductor layer comprising one or more organic semiconductor materials which have undergone a cycle polyoxometalate-doping and de-doping; a plurality of organic semiconductor layers disposed on top of the polyoxometalate-doped organic semiconductor layer; and a top conducting layer comprising a noble metal, a transparent conducting metal oxide, graphene, or an organic conductor.

Other embodiments include an article having: a substrate; a conducting layer comprising a noble metal, a transparent conducting metal oxide, graphene, or an organic conductor; a patterned organic semiconductor layer comprising one or more organic semiconductor materials which have undergone a cycle of polyoxometalate-doping and de-doping; and a top conducting layer comprising a noble metal, a transparent conducting metal oxide, graphene, or an organic conductor.

Other embodiments include an article having: a substrate; a conducting layer comprising a noble metal, a transparent conducting metal oxide, graphene, or an organic conductor; a patterned organic semiconductor layer comprising one or more organic semiconductor materials which have undergone a cycle of polyoxometalate-doping and de-doping; a plurality of organic semiconductor layers disposed on top of the polyoxometalate-doped organic semiconductor layer; and a top conducting layer comprising a noble metal, a transparent conducting metal oxide, graphene, or an organic conductor.

Other embodiment include an electronic device having: a substrate; and a plurality of conducting and semiconducting layers wherein at least one layer is a polyoxometalate-doped organic layer and wherein the electronic properties of the electronic device remain unchanged after being exposed to 60° C. and 90% RH for at least 40 h in the dark.

In the description provided herein, numerous specific details are set forth. It is to be understood that certain embodiments may be practiced without each and every one of the specific details. In other instances, well-known methods, structures and techniques have not been shown in detail in order not to obscure an understanding of this description. The term "exemplary" herein is used synonymous with the term "example" and is not meant to indicate excellent or best. References to "one embodiment," "an embodiment," "exemplary embodiment," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of the disclosed technology are intended to be illustrative and not restrictive. Many suitable materials that would perform the same or a similar function as the materials described herein are intended to be embraced within the scope of the disclosed technology. Such other materials not described herein can include, but are not limited to, for example, materials that are developed after the time of the development of the disclosed technology.

The technology disclosed herein may be embodied in many different forms and should not be construed as limited to the embodiments set forth herein; rather, these embodiments are provided so that this disclosure is thorough, complete, and conveys the scope of the disclosed technology to those skilled in the art.

The following section of this disclosure presents numerous experimental results and examples with reference to FIGS. 6-83. It should be understood that the materials, configurations, and/or processing steps disclosed herein provide support for the claimed technology. However, it should also be understood that certain example implementation of the disclosed technology may utilize other materials, configurations, and/or processing steps without departing from the scope of the disclosed and/or claimed technology.

EXPERIMENTAL RESULTS AND EXAMPLES

Example 1. PMA Doping of P3HT

FIG. 6 depicts chemical structures of PMA and P3HT (top figure), a sample geometry of P3HT film on a glass substrate (middle figure), and work function values (bottom figure) for pristine P3HT and P3HT samples dipped in PMA solution for various durations.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 80° C. at 500 rpm, the film of poly(3-hexylthiophene) (P3HT, 4002-E, BS16-77, Rieke Metals) was filtered through 0.2-μm-pore PTFE filters and spin-coated on each substrate from 10 mg/ml chlorobenzene solution at a speed of 1000 rpm and an acceleration of 10000 rpm/s for 30 s and annealed at 150° C. for 10 min on hot plate in the glove box. The thickness of the P3HT film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045) in nitromethane for various times, 10 s, 30 min, and 60 min, rinsed thoroughly with pure nitromethane to remove all remaining PMA from the surface, and annealed at 70° C. for 10 min on a hot plate inside a $N_2$-filled glove box.

The work function, or Fermi level energy, of the P3HT films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV.

Figure 7:
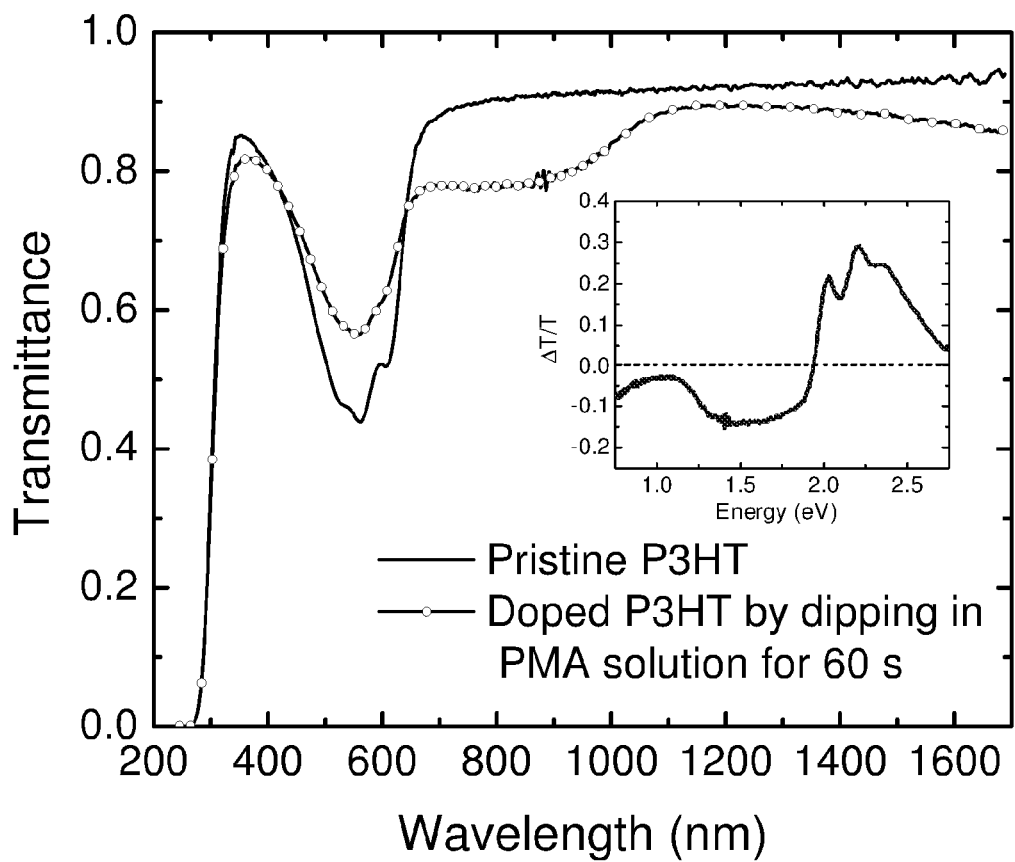
FIG. 7 is a transmittance spectra of pristine P3HT (solid line) and doped P3HT (circles) as a function of wavelength, as described in Example 1. The insert graph depicts a change in transmittance between the pristine P3HT and PMA-doped P3HT as a function of energy (eV).

FIG. 7 is a transmittance spectra of pristine P3HT (solid line) and doped P3HT (circles) as a function of wavelength. The insert graph depicts a change in transmittance between the pristine P3HT and PMA-doped P3HT as a function of energy (eV). The transmission spectrum of the samples was measured with the ellipsometer (J. A. Woollam Co.).

Example 2. Insolubility of Doped P3HT in Chlorobenzene

Figure 8:
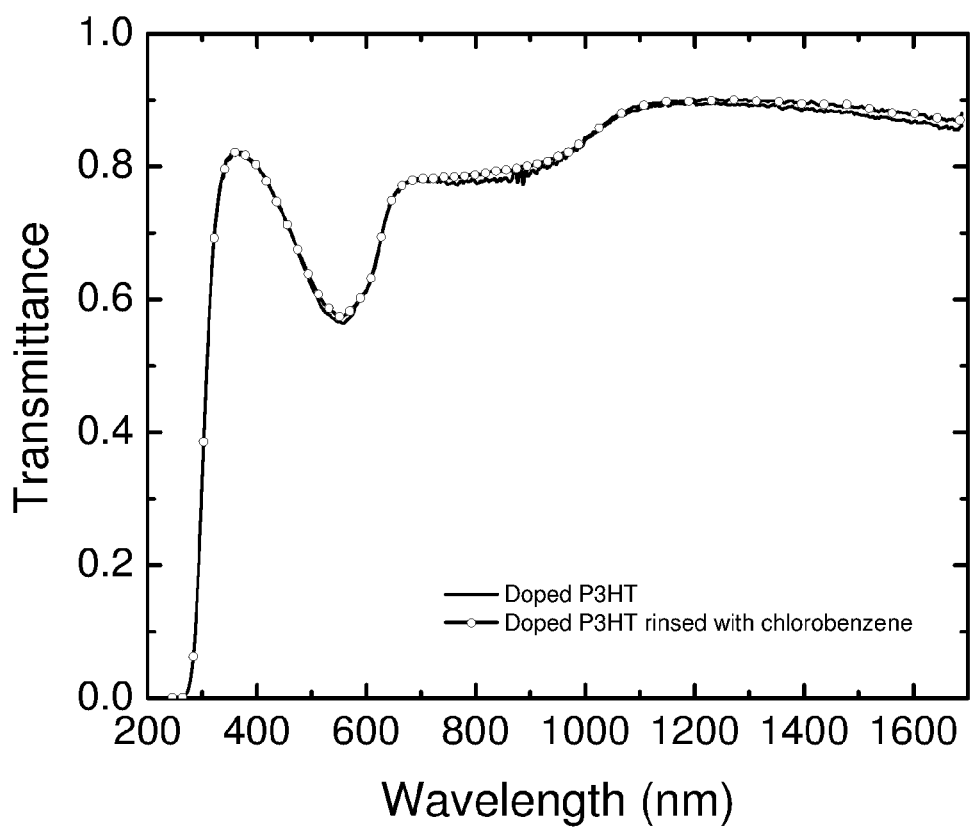
FIG. 8 is a transmittance spectra of doped P3HT (solid line) and the transmittance spectra (circles) after rinsing the same sample with chlorobenzene, as discussed with respect to Example 2.

FIG. 8 is a transmittance spectrum of doped P3HT (solid line) and the transmittance spectrum (circles) after rinsing the same sample with chlorobenzene.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 80° C. at 500 rpm, the film of poly(3-hexylthiophene) (P3HT, 4002-E, BS16-77, Rieke Metals) was filtered through 0.2-μm-pore PTFE filters and spin-coated on each substrate from 10 mg/ml chlorobenzene solution at a speed of 1000 rpm and an acceleration of 10000 rpm/s for 30 s and annealed at 150° C. for 10 min on hot plate in the glove box. The thickness of the P3HT film is 30 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 30 min, rinsed thoroughly with pure nitromethane to remove all remaining PMA from the surface, and annealed at 70° C. for 10 min on a hot plate inside a $N_2$-filled glove box.

The P3HT films were then rinsed with chlorobenzene by spinning it at 800 rpm 10000 rpm/s for 30 s. The transmission spectrum of the samples was measured with the ellipsometer (J. A. Woollam Co.).

Example 3. Dedoping P3HT with Hydrazine Hydrate

Figure 9:
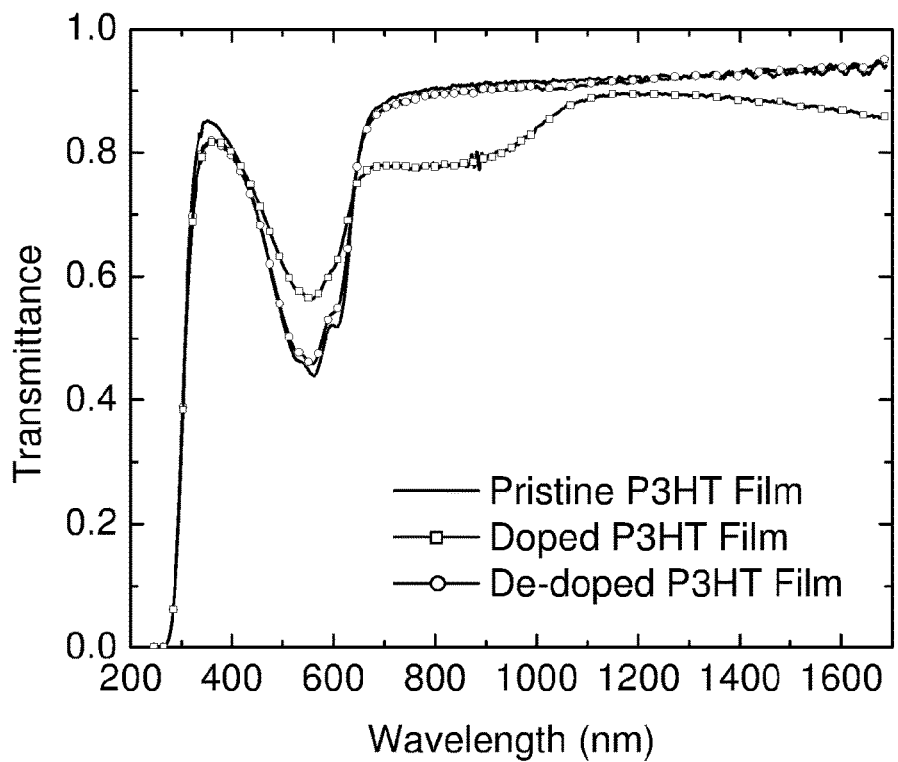
FIG. 9. is transmittance spectra (top graph) of pristine P3HT film (solid line), doped P3HT (squares) and de-doped P3HT film (circles). The table (bottom) shows work function vales measured in these films. The transmittance spectra and work function values indicate doping reversibility in the samples, as discussed with respect to Example 3.

FIG. 9. is transmittance spectra (top graph) of pristine P3HT film (solid line), doped P3HT (squares) and de-doped P3HT film (circles). The table (bottom) shows work function vales measured in these films. The transmittance spectra and work function values indicate doping reversibility in the samples.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 80° C. at 500 rpm, the film of poly(3-hexylthiophene) (P3HT, 4002-E, BS16-77, Rieke Metals) was filtered through 0.2-μm-pore PTFE filters and spin-coated on each substrate from 10 mg/ml chlorobenzene solution at a speed of 1000 rpm and an acceleration of 10000 rpm/s for 30 s and annealed at 150° C. for 10 min on hot plate in the glove box. The thickness of the P3HT film is 30 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane 60 min, rinsed thoroughly with pure nitromethane to remove all remaining PMA from the surface, and annealed at 70° C. for 10 min on a hot plate inside a $N_2$-filled glove box. To de-dope, or neutralize the samples, the P3HT films were dipped into a 0.5 M solution of hydrazine hydrate (Alfa Aesar, Lot #: SHBD9967V) in acetonitrile for 30 min, rinsed with pure acetonitrile, and then annealed at 70° C. for 10 min on a hot plate inside a $N_2$-filled glove box.

The work function, or Fermi level energy, of the P3HT films was measured prior to PMA doping, post PMA doping, and post treatment with hydrazine hydrate solutions with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmission spectrum of the samples was measured with the ellipsometer (J. A. Woollam Co.).

Figure 10:
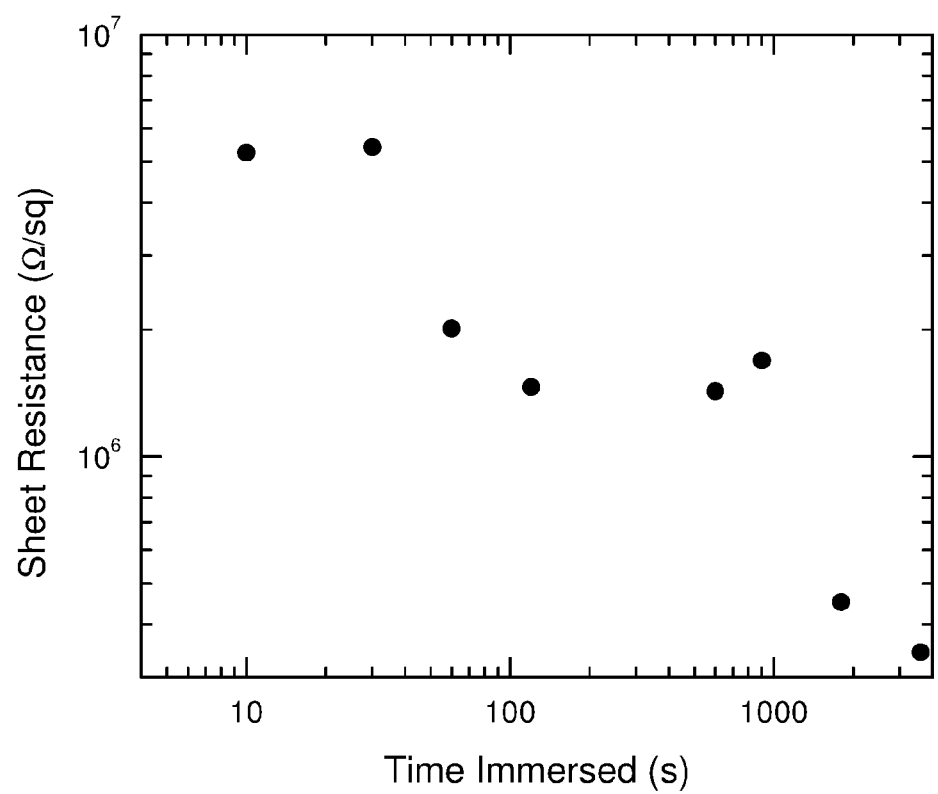
FIG. 10 shows sheet resistance dependence of doped P3HT as a function of immersion time, as discussed with reference to Example 4.

Example 4. Increased Conductivity of P3HT Films Dependent on Immersion Times in PMA Solution FIG. 10 shows sheet resistance dependence of doped P3HT as a function of immersion time.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 80° C. at 500 rpm, the film of poly(3-hexylthiophene) (P3HT, 4002-E, BS16-77, Rieke Metals) was filtered through 0.2-µm-pore PTFE filters and spin-coated on each substrate from 30 mg/ml chlorobenzene solution at a speed of 800 rpm and an acceleration of 10000 rpm/s for 30 s and annealed at 150° C. for 10 min on hot plate in the glove box. The thickness of the P3HT film is 140 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for various times, 10, 30, 60, 120, 300, 600, 1800, and 3600 s, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (SPECTROS) 150 nm of Ag was deposited through a shadow mask at a base pressure of $5 \times 10^{-8}$ Torr. The completed devices were transferred to another $N_2$-filled glove box for electrical measurements in a sealed container.

Figure 11:
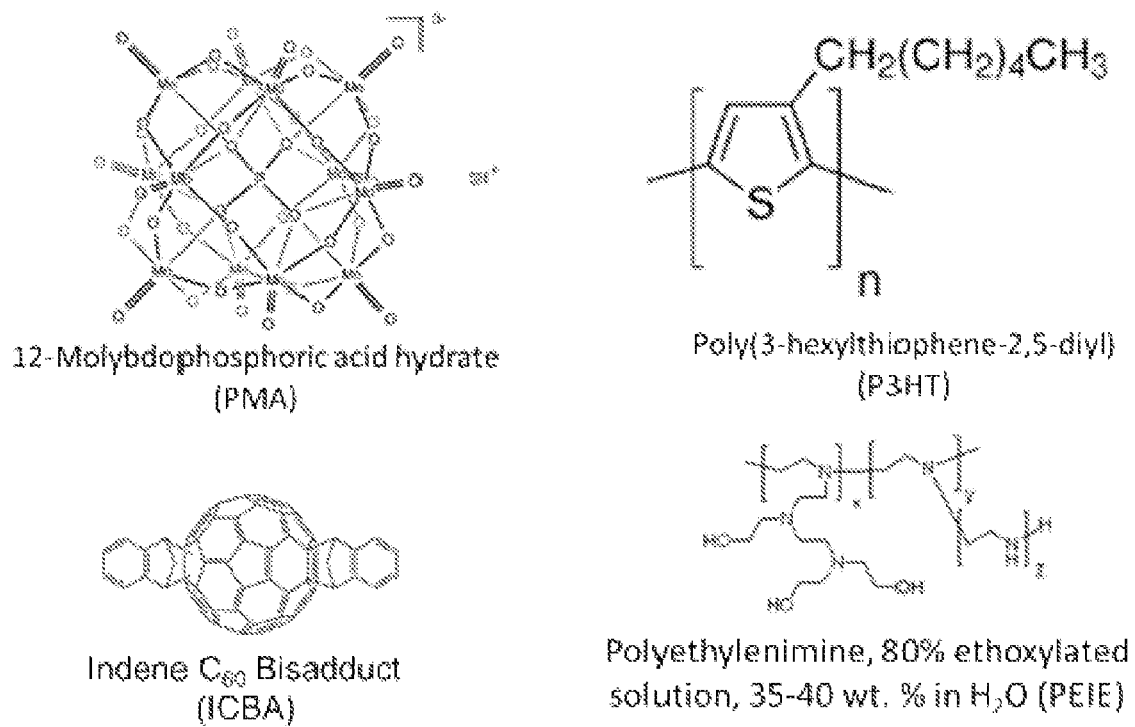
FIG. 11 depicts chemical structures of some of the materials disclosed herein for use in a solar cell device as discussed with respect to Example 5, including PMA, P3HT, ICBA, and PEIE.
Figure 12:
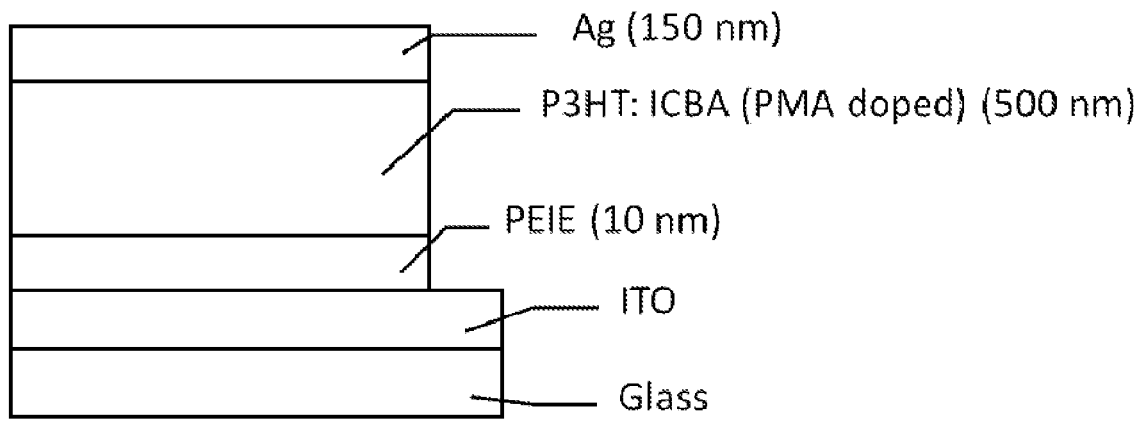
FIG. 12 depicts an example solar cell device structure, as discussed with respect to Example 5, and according to an example implementation of the disclosed technology.
Figure 13:
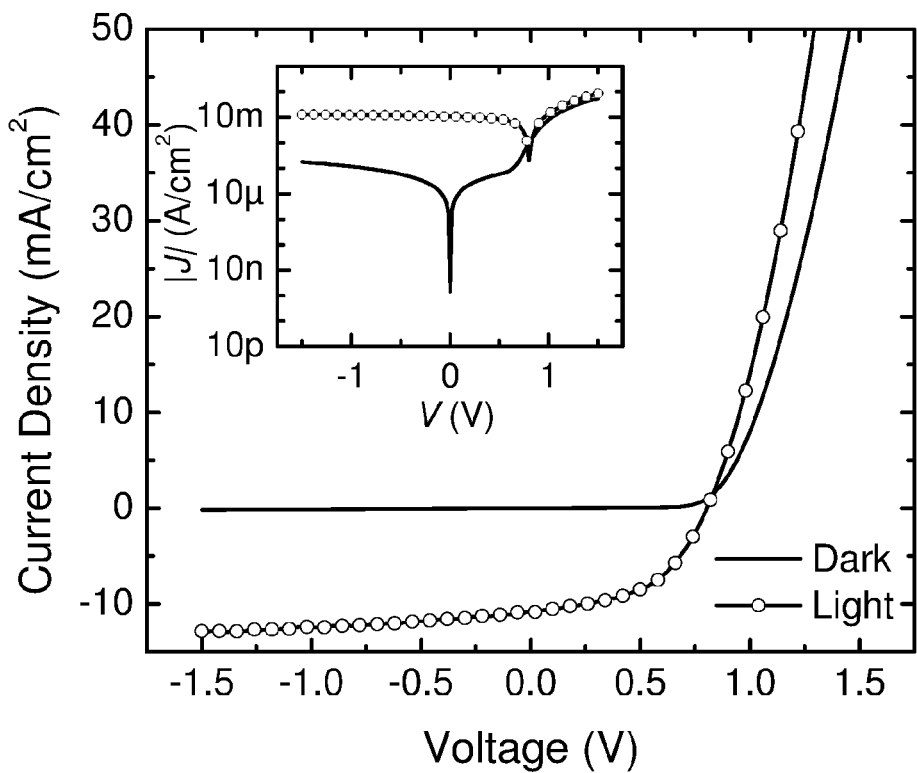
FIG. 13 depicts current density vs. voltage (J-V) characteristics and device performance parameters for the solar cell device as depicted in FIG. 12.

Transfer Length Measurements (TLM) were conducted on each of the films to determine the sheet resistance of the film. The TLM data was gathered from 4 rows of contacts along each substrate, 2 rows with a width of 1200 µm and 2 rows with a width of 2400 µm with distances along each row of contacts of 200, 100, 50, and 25 µm Example 5. Inverted Solar Cells with 500 Nm-Thick P3HT:ICBA Active Layer Dipped in PMA Solution for 30 s FIG. 11 depicts chemical structures of some of the materials disclosed herein for use in a device, including PMA, P3HT, ICBA, and PEIE. FIG. 12 depicts an example solar cell device structure, according to an example implementation of the disclosed technology. FIG. 13 depicts current density vs. voltage (J-V) characteristics and device performance parameters for the solar cell device as depicted in FIG. 12.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw~70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-µm-pore PTFE filters and spin-coated on each substrate from 80 mg/ml dichlorobenzene solution at a speed of 800 rpm and an acceleration of 10000 rpm/s for 30 s and annealed at 150° C. for 10 min on hot plate in the glove box. The thickness of the active layer is 500 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 30 s, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 14:
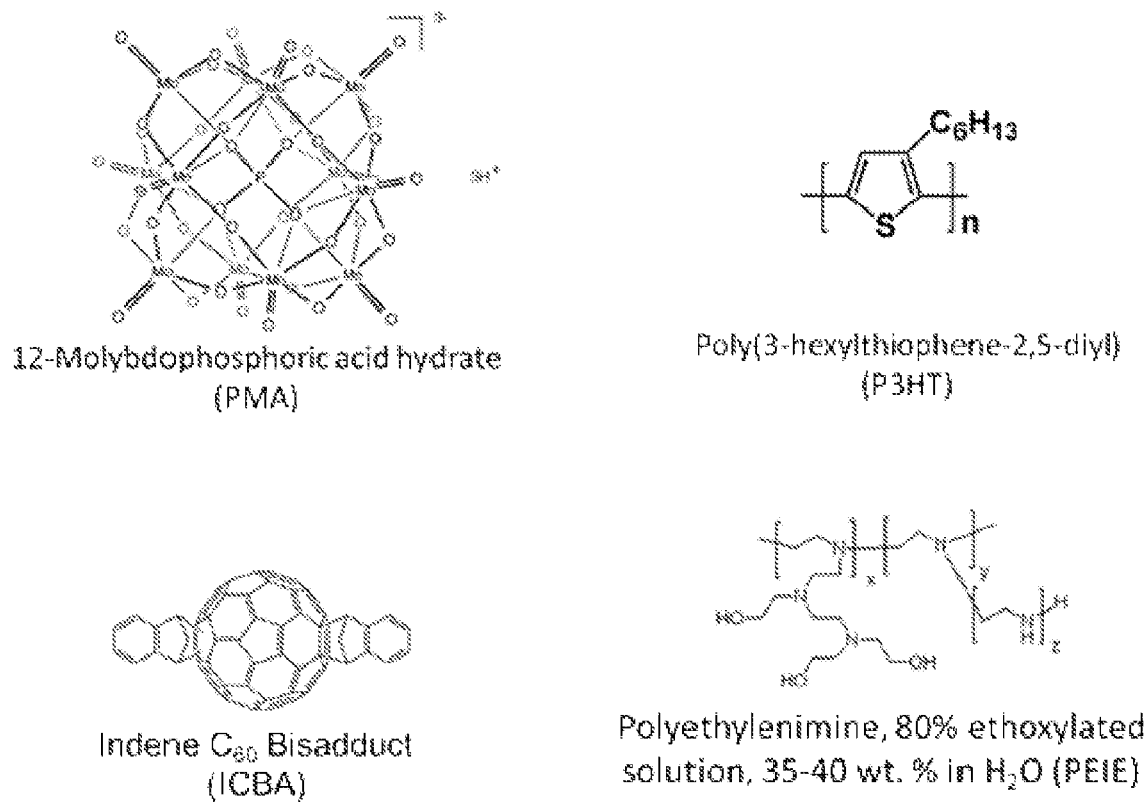
FIG. 14 depicts chemical structures of some of the materials disclosed herein for use in a solar cell device as discussed with respect to Example 6, including PMA, P3HT, ICBA, and PEIE.
Figure 15:
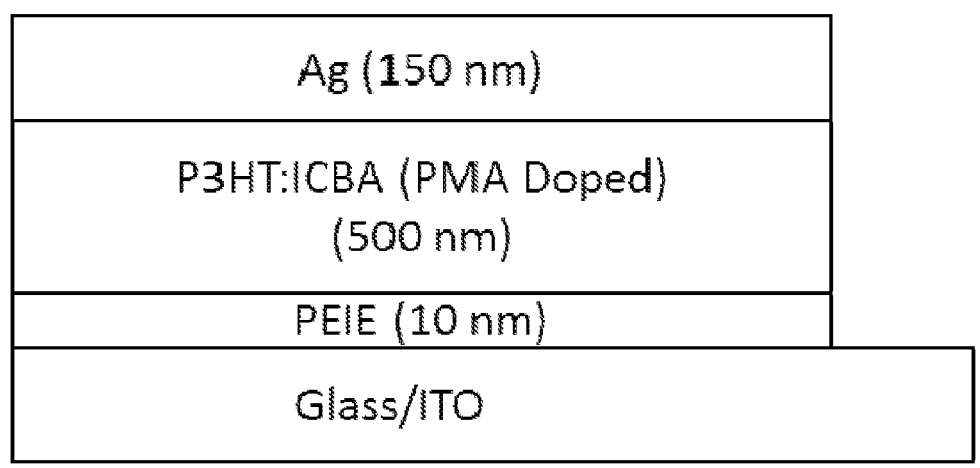
FIG. 15 depicts an example solar cell device structure, according to an example implementation of the disclosed technology, and as discussed with respect to Example 6.
Figure 16:
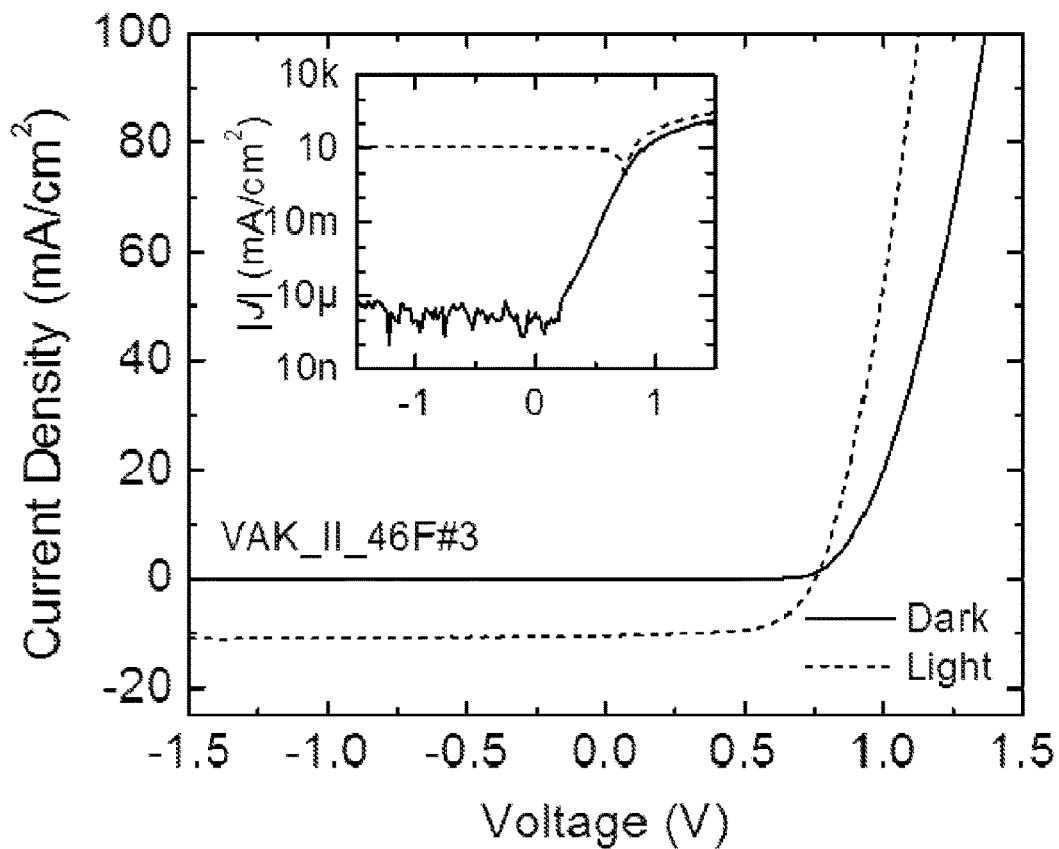
FIG. 16 depicts current density vs. voltage (J-V) characteristics and device performance parameters for the solar cell device as depicted in FIG. 15.

Example 6. Inverted Solar Cells with 500 nm-Thick P3HT:ICBA Active Layer Immersed in PMA for 60 s FIG. 14 depicts chemical structures of some of the materials disclosed herein for use in a device, including PMA, P3HT, ICBA, and PEIE. FIG. 15 depicts an example solar cell device structure, according to an example implementation of the disclosed technology. FIG. 16 depicts current density vs. voltage (J-V) characteristics and device performance parameters for the solar cell device as depicted in FIG. 15.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70, 000) was dissolved in $H_2O$ with a concentration of 35-40 wt. % as received from Aldrich. It was diluted into 2-methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-µm-pore PTFE filters and spin-coated on each substrate from 80 mg/ml dichlorobenzene solution at a speed of 800 rpm and an acceleration of 10000 rpm/s for 30 s and annealed at 150° C. for 10 min on hot plate in the glove box. The thickness of the active layer is 500 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045, Alfa Aesar) in nitromethane for 60 s, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of 5×10$^{-8}$ Torr. The completed devices were transferred to another N$_2$-filled glove box for electrical measurements in a sealed container.

The devices were electrically isolated using a razor to pattern around each device. Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source and the active area of each devices was defined with an aperture.

Figure 17:
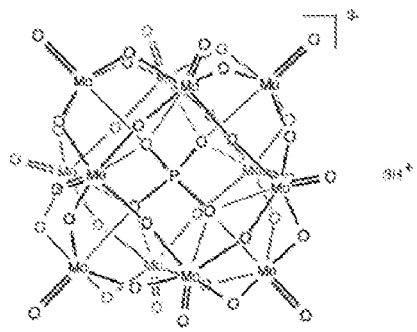
FIG. 17 depicts chemical structures of some of the materials disclosed herein for use in a solar cell device, as discussed with respect to Example 7.
Figure 17:
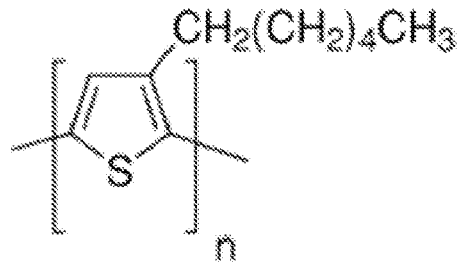
Figure 17:
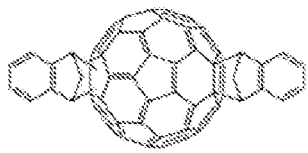
Figure 17:
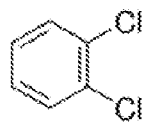
Figure 17:
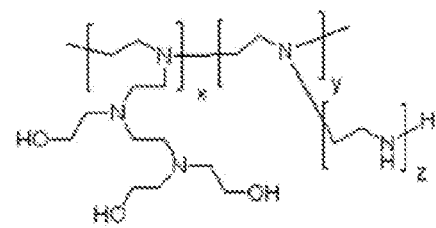
Figure 17:
Figure 18:
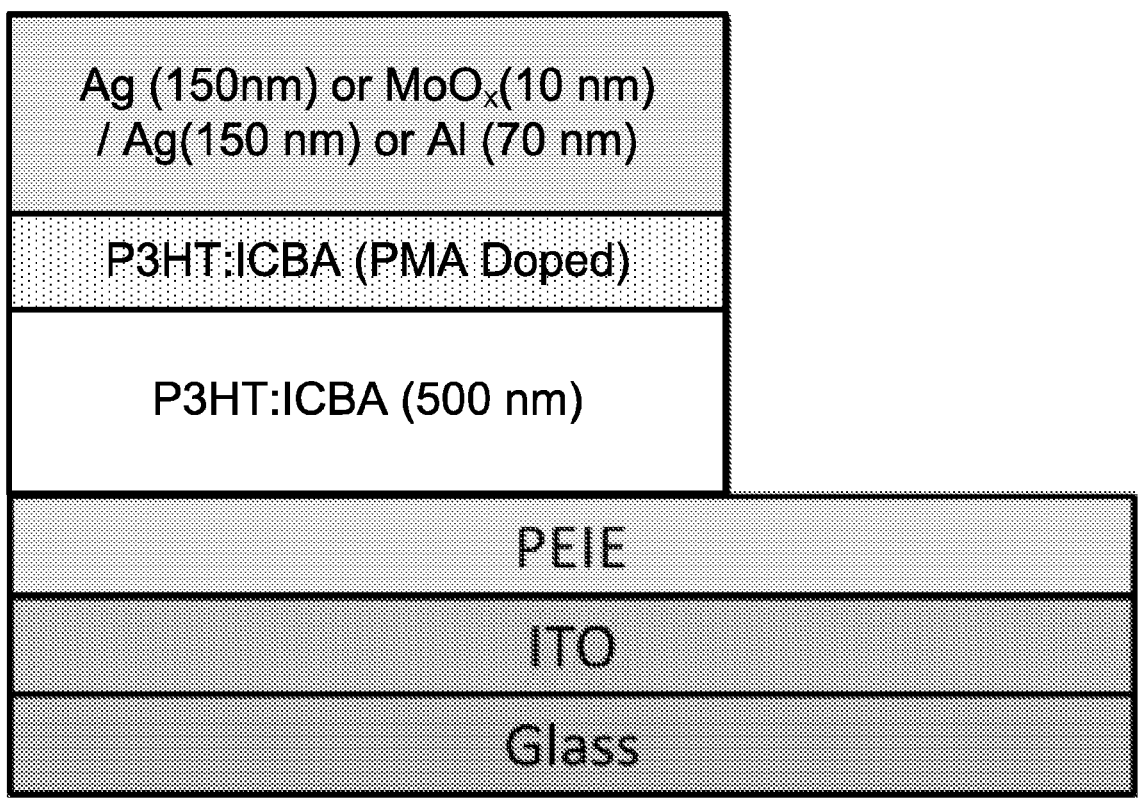
FIG. 18 depicts another example solar cell device structure, according to an example implementation of the disclosed technology, as discussed with respect to Example 7.
Figure 19:
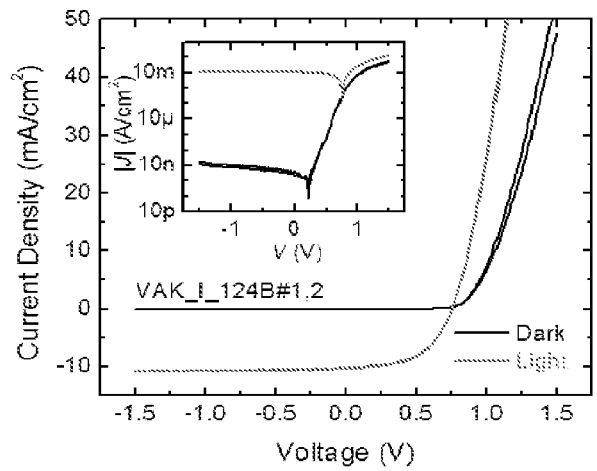
FIG. 19 depicts performance characteristics for an example device as shown in FIG. 18 for a reference device and a doped device.
Figure 19:
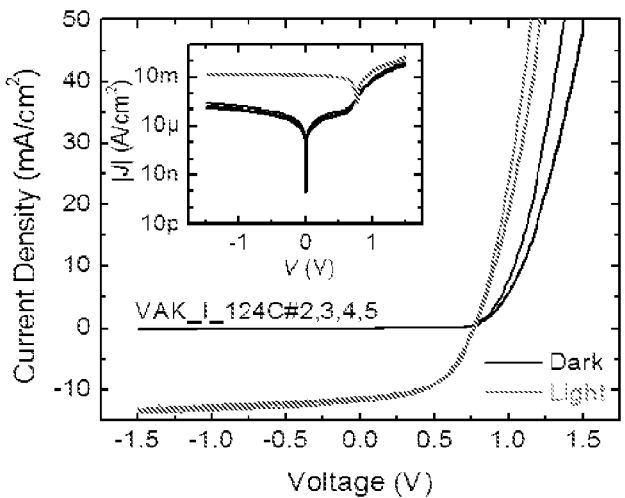
Figure 20:
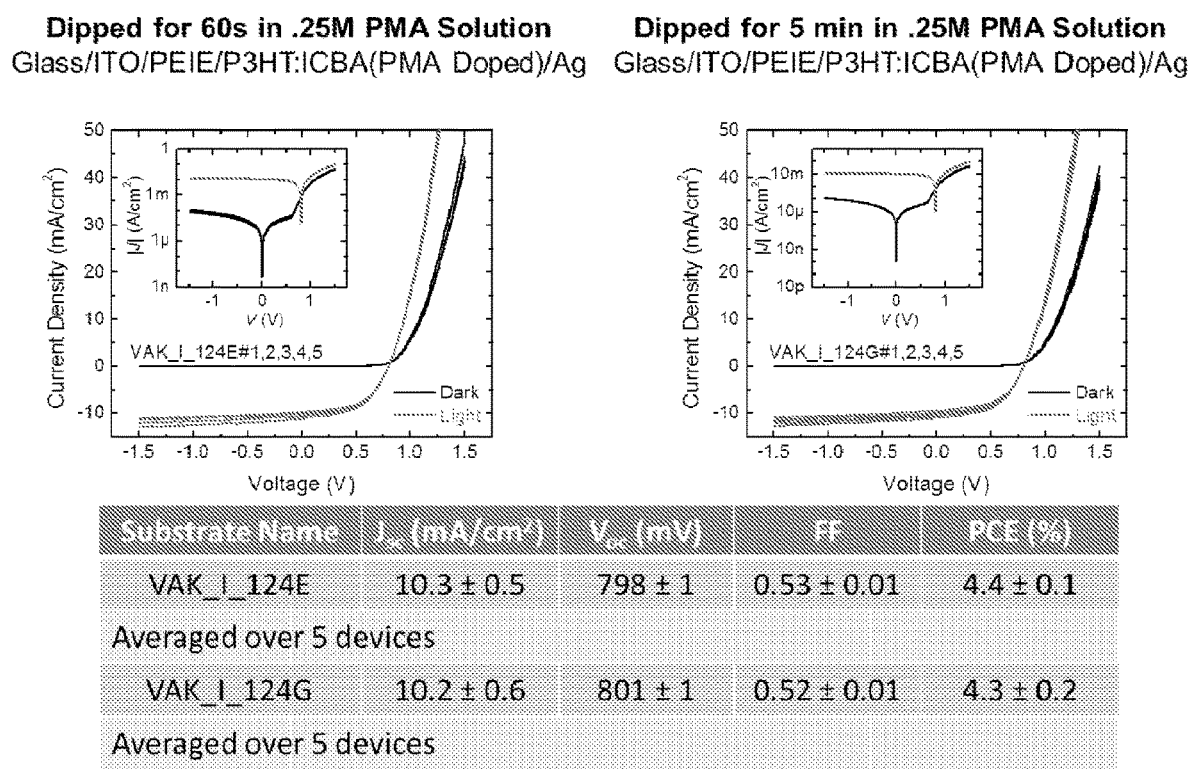
FIG. 20 depicts averaged device performance characteristics for an example device as shown in FIG. 18 for devices doped for different durations.
Figure 21:
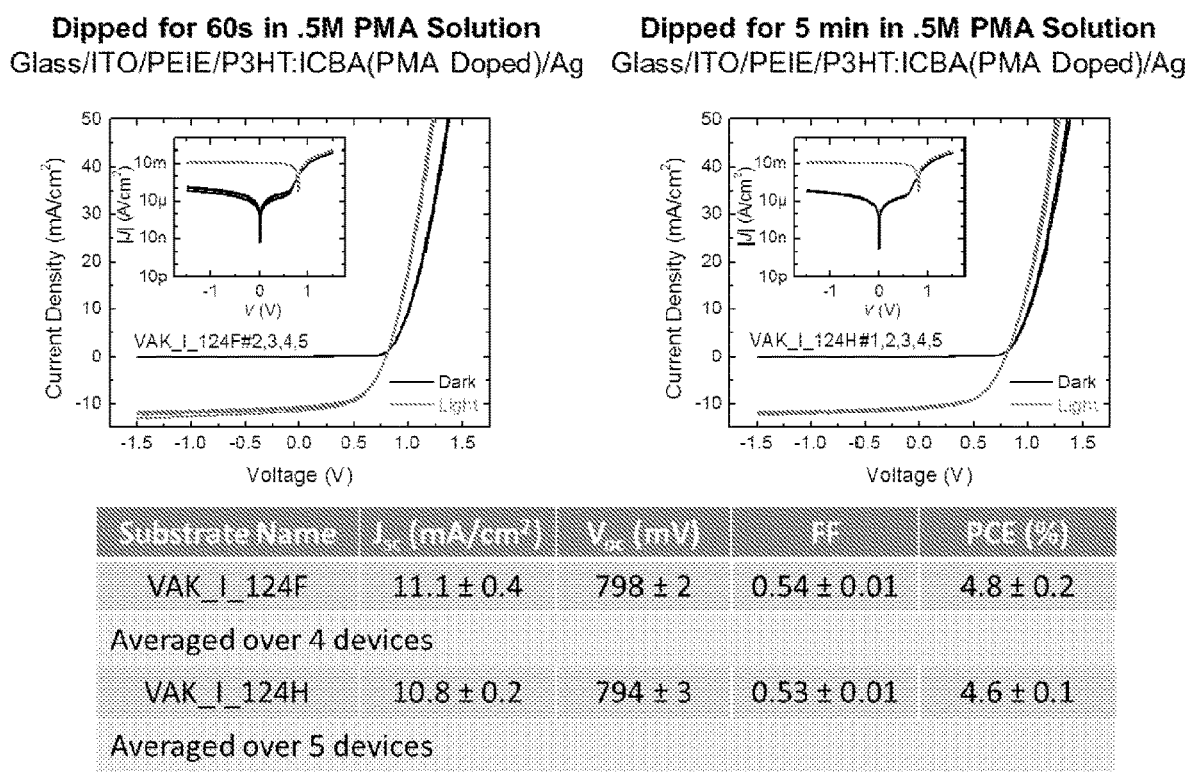
FIG. 21 depicts averaged device performance characteristics for an example device as shown in FIG. 18 for devices doped for different durations in a higher concentration dopant.
Figure 22:
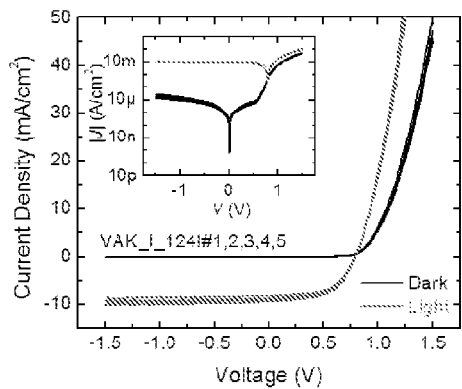
FIG. 22 depicts averaged device performance characteristics for an example device as shown in FIG. 18 for devices doped for the same duration, but with different dopant concentrations.
Figure 22:
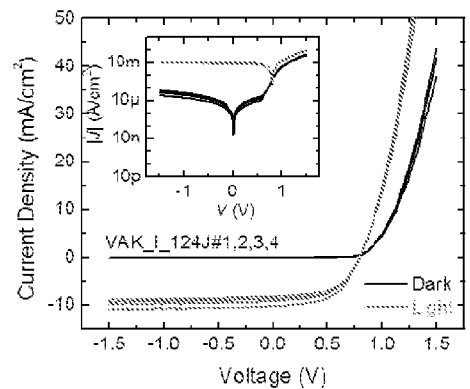
Figure 23:
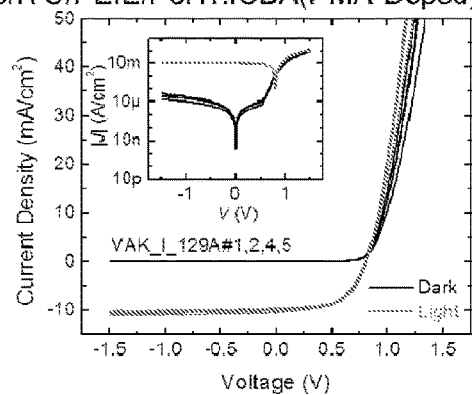
FIG. 23 depicts averaged device performance characteristics for an example device as shown in FIG. 18 for a second batch of devices doped for 60 s duration at a 0.5 M PMA dopant concentration, corresponding to one of the conditions as depicted in FIG. 22.
Figure 24:
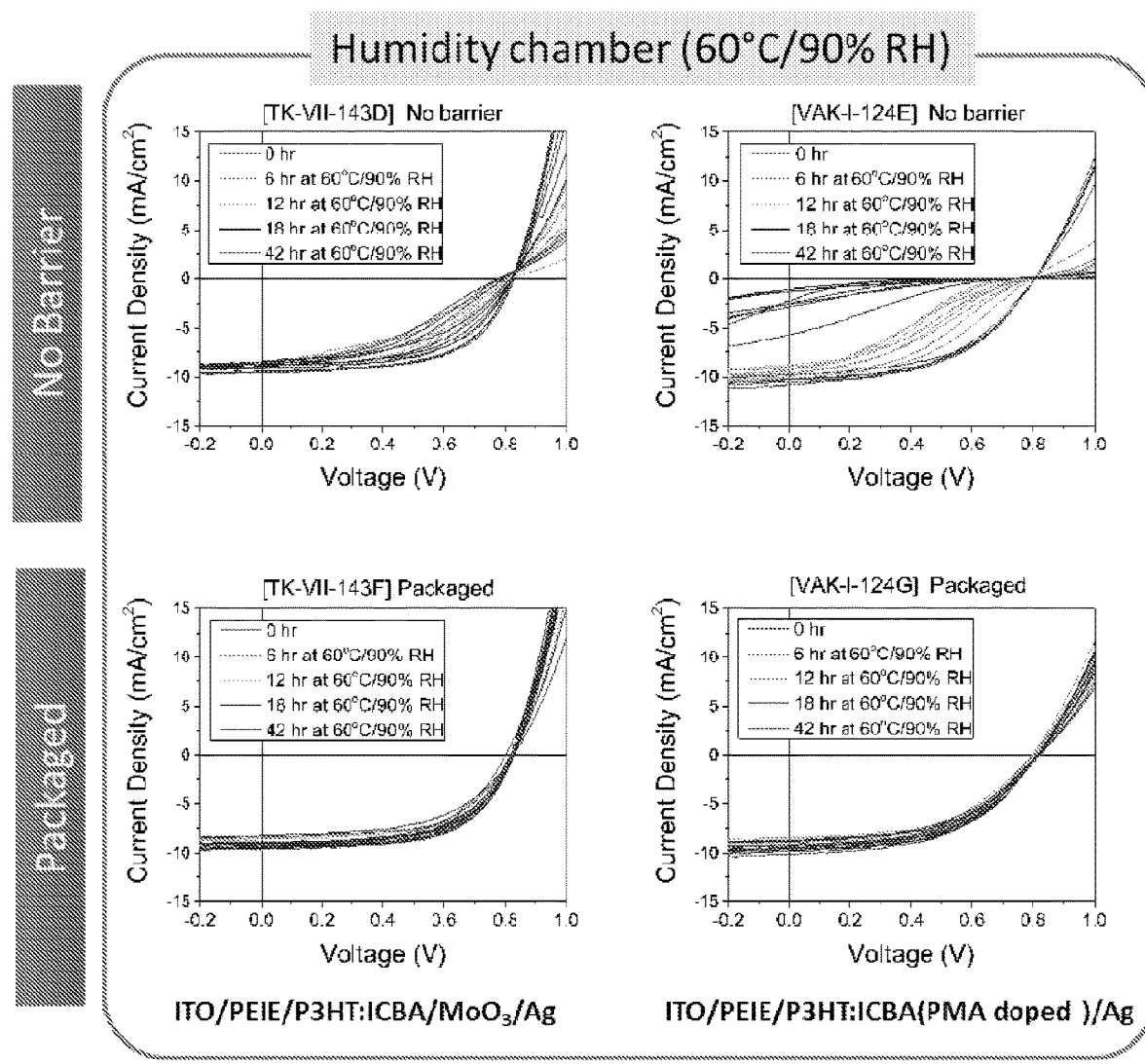
FIG. 24 shows device performance comparisons of encapsulated (packaged) and un-encapsulated (no-barrier) devices as a function of exposure time to an environment of 60° C. and 90% RH and in the dark.
Figure 25:
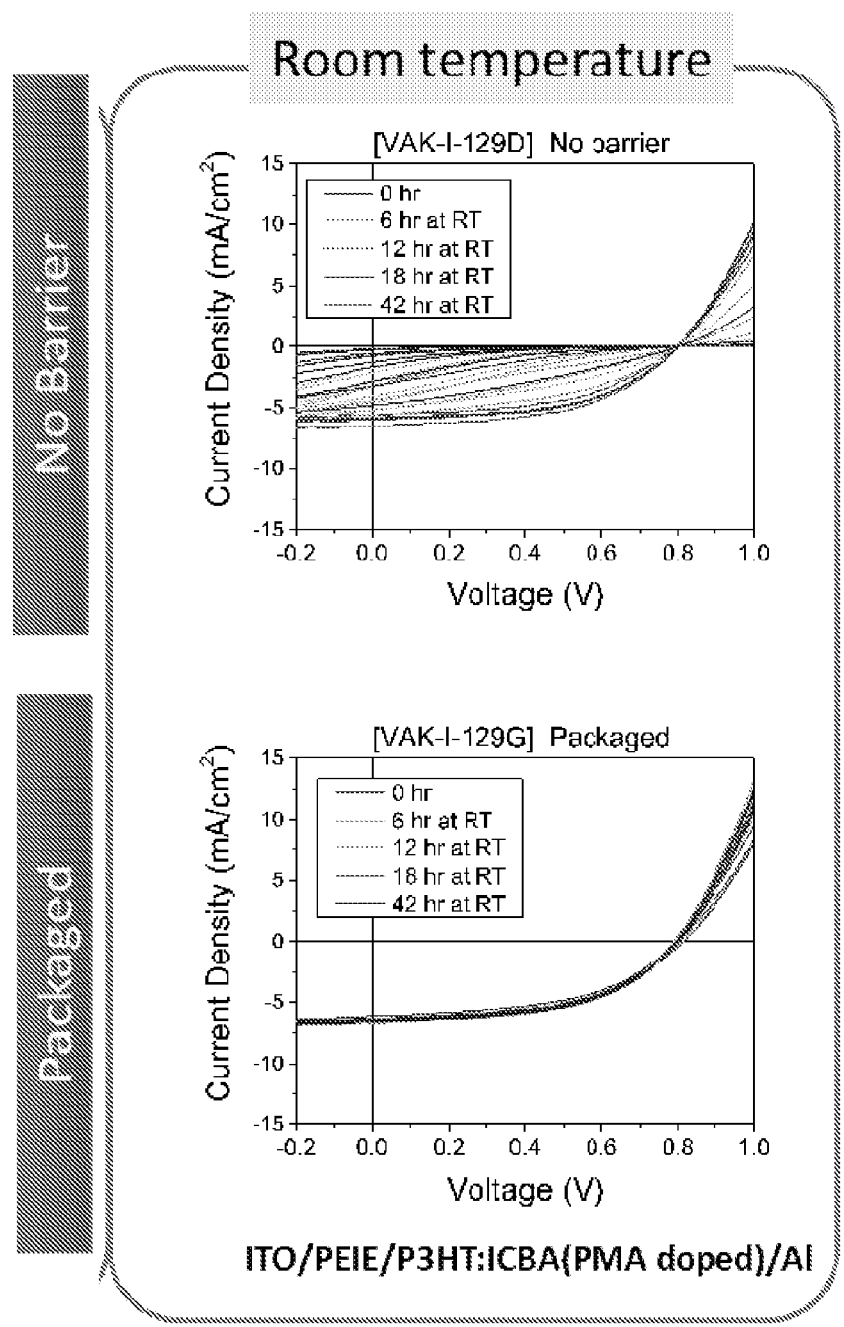
FIG. 25 shows device performance comparisons of encapsulated (packaged) and un-encapsulated (no-barrier) devices as a function of exposure time at room temperature.
Figure 26:
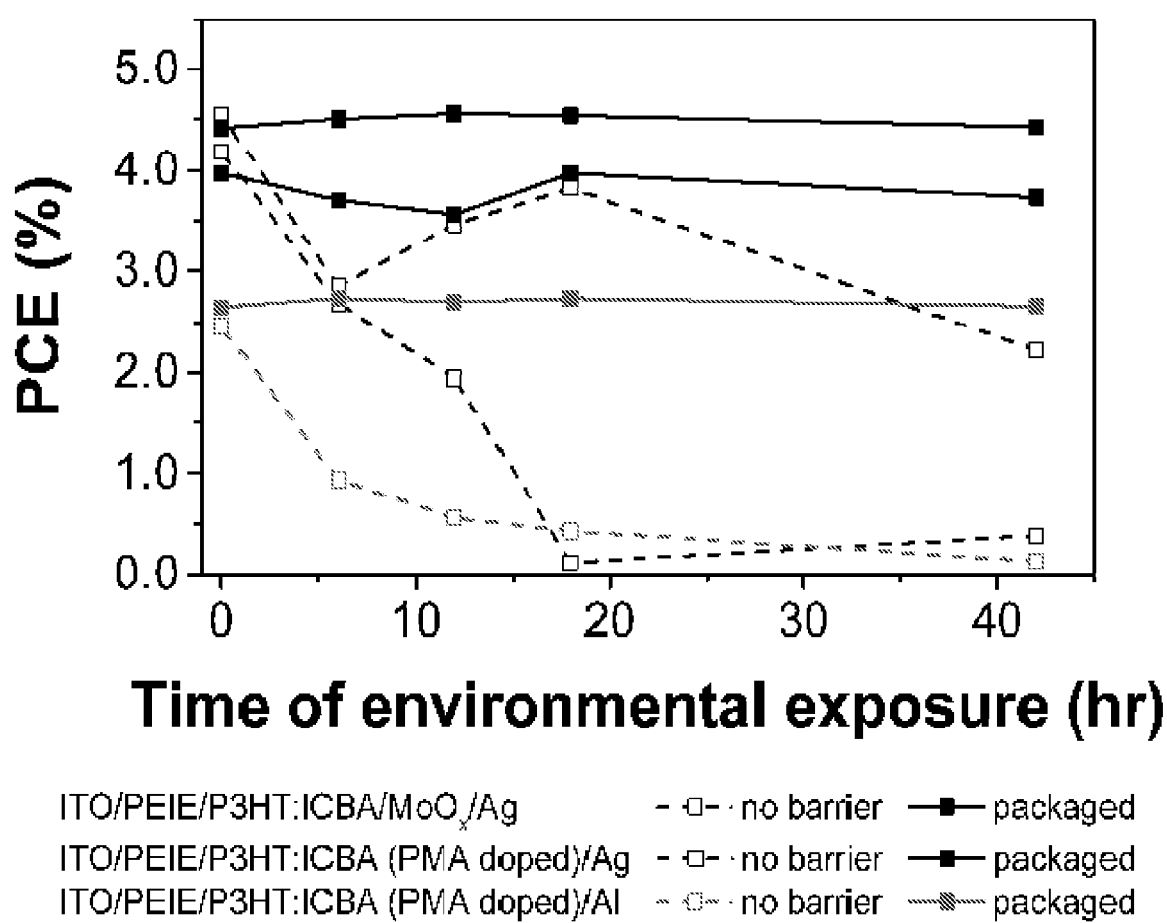
FIG. 26 summarizes the device performance changes (see FIGS. 24 and 25) for the encapsulated and un-encapsulated devices.

Example 7. Inverted Solar Cells with 500 nm-Thick P3HT:ICBA Active Layer Dipped in PMA for Various Times and Using Molybdenum Oxide Silver or Aluminum Top Electrodes FIG. 17 depicts chemical structures of some of the materials disclosed herein for use in a device. FIG. 18 depicts another example solar cell device structure, according to an example implementation of the disclosed technology. FIG. 19 depicts averaged device performance characteristics for an example device as shown in FIG. 18 for a reference device and a doped device. FIG. 20 depicts averaged device performance characteristics for an example device as shown in FIG. 18 for devices doped for different durations. FIG. 21 depicts averaged device performance characteristics for an example device as shown in FIG. 18 for devices doped for different durations in a higher concentration dopant. FIG. 22 depicts averaged device performance characteristics for an example device as shown in FIG. 18 for devices doped for the same duration, but with different dopant concentrations. FIG. 23 depicts averaged device performance characteristics for an example device as shown in FIG. 18 for a second batch of devices doped for 60 s duration at a 0.5 M PMA dopant concentration, corresponding to one of the conditions as depicted in FIG. 22. FIG. 24 shows device performance comparisons of encapsulated (packaged) and un-encapsulated (no-barrier) devices as a function of exposure time to an environment of 60° C. and 90% RH and in the dark. FIG. 25 shows device performance comparisons of encapsulated (packaged) and un-encapsulated (no-barrier) devices as a function of exposure time at room temperature. FIG. 26 summarizes the device performance changes (see FIGS. 24 and 25) for the encapsulated and un-encapsulated devices.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, HNO$_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

Polyethylenimine, 80% ethoxylated (PEIE) (Mw~70,000) was dissolved in H$_2$O with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a N$_2$-filled glove box. The active layer of poly(3-hexylthiophene) (P3HT, 4002-E, PTL14-22, Rieke Metals): Indene C$_{60}$ Bisadduct (ICBA, Lumtec, Lot #39030-141006001) (1:1, weight ratio) was filtered through 0.2-µm-pore PTFE filters and spin-coated on each substrate from 80 mg/ml dichlorobenzene solution at a speed of 800 rpm and an acceleration of 10000 rpm/s for 30 s and annealed at 150° C. for 10 min on hot plate in the glove box. The thickness of the active layer is 500 nm, measured using a spectroscopic ellipsometer (J. A. Woollam Co.). The substrates were then dipped into a 0.5 M or 0.25 M solution of 12-Molybdophosphoric acid hydrate (PMA, Alfa Aesar, Lot # W15A045) in nitromethane for 60 s or 5 min and rinsed thoroughly with pure nitromethane to remove all remaining PMA from the surface, and annealed at 70° C. for 10 min on a hot plate inside a N$_2$-filled glove box.

Samples were then loaded into a vacuum thermal evaporation system (EvoVac, Angstrom Engineering Inc.) 150 nm Ag, 10 nm MoO$_3$ followed by 150 nm of Ag, or 70 nm of Al were deposited through a shadow mask at a base pressure of 5×10$^{-8}$ Torr. The completed devices were transferred to another N$_2$-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

The stability of encapsulated devices exposed to an 60° C./90% RH atmosphere in the dark was tested for up to 42 h and compared with the performance of un-encapsulated devices to demonstrate the stability of the PMA doping achieved in this devices. The results reveal no appreciable change of the electrical properties of the devices and consequently suggest no diffusion of dopant molecules.

Figure 27:
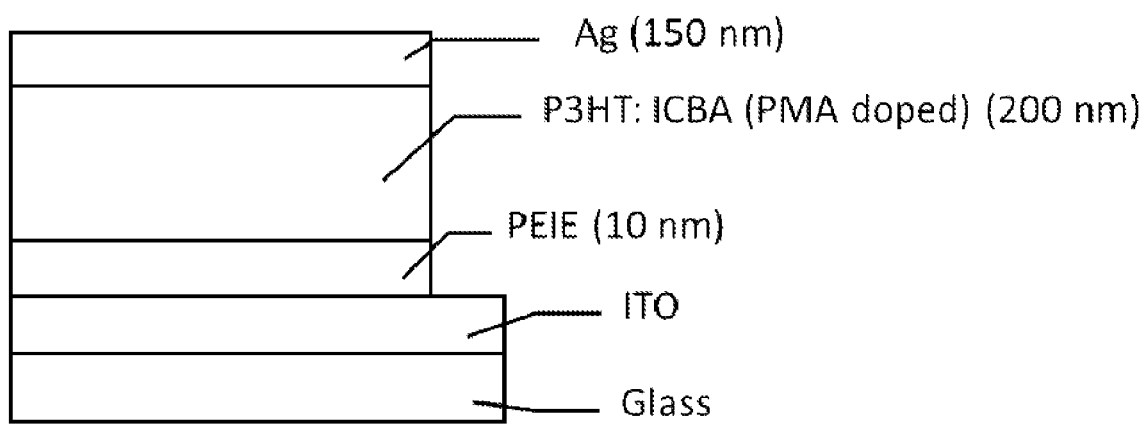
FIG. 27 depicts another example solar cell device structure, as discussed with reference to Example 8, and according to an example implementation of the disclosed technology.
Figure 28:
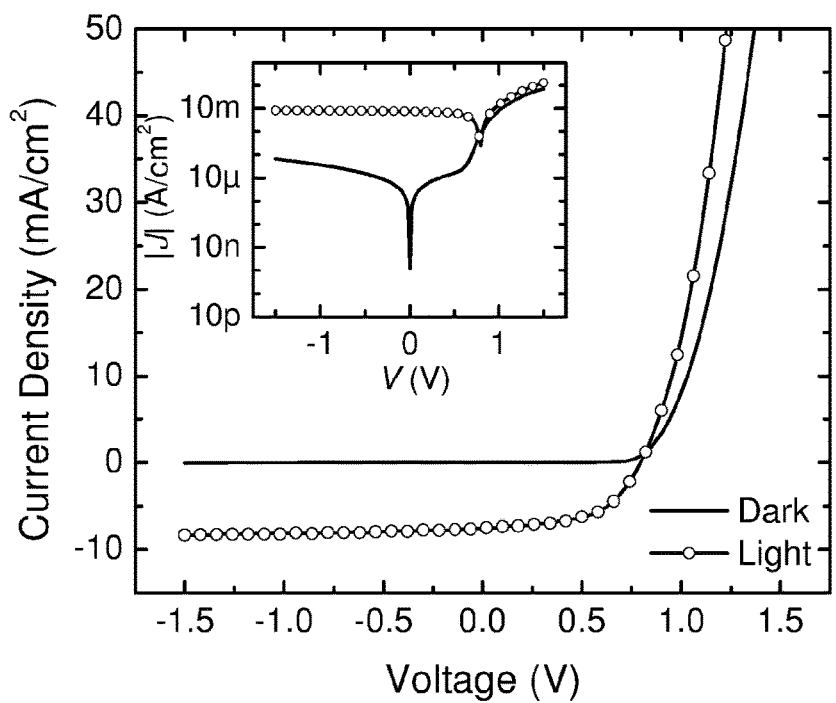
FIG. 28 shows J-V characteristics and device performance parameters for the device shown in FIG. 27.

Example 8. Inverted Solar Cells with 200 nm-Thick P3HT:ICBA Active Layer Dipped in PMA for 60 s FIG. 27 depicts another example solar cell device structure, according to an example implementation of the disclosed technology. FIG. 28 shows J-V characteristics and device performance parameters for the device shown in FIG. 27.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, HNO$_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

Polyethylenimine, 80% ethoxylated (PEIE) (Mw~70,000) was dissolved in H$_2$O with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a N$_2$-filled glove box. The active layer of poly(3-hexylthiophene) (P3HT, 4002-E, PTL14-22, Rieke Metals): Indene C$_{60}$ Bisadduct (ICBA, Lumtec, Lot #39030-141006001) (1:1, weight ratio) was filtered through 0.2-µm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 60 s, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 29:
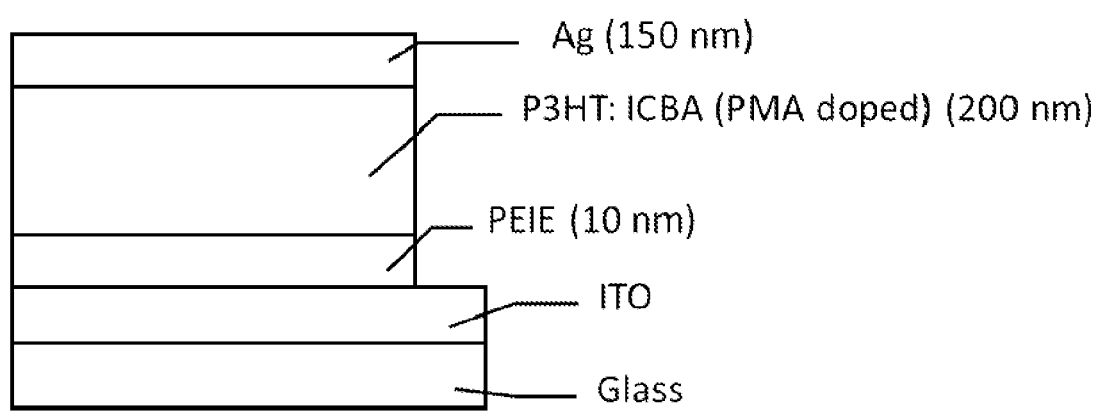
FIG. 29 depicts another example solar cell device structure, as discussed with reference to Example 9, and according to an example implementation of the disclosed technology.
Figure 30:
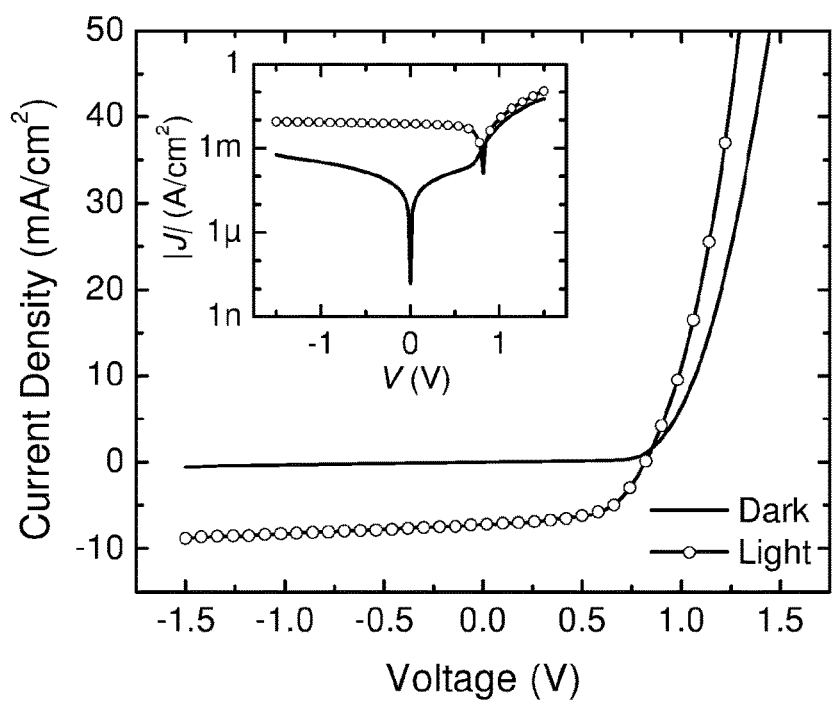
FIG. 30 shows J-V characteristics and device performance parameters for the device shown in FIG. 29.

Example 9. Inverted Solar Cells with 200 nm-Thick P3HT:ICBA Active Layer Dipped in PMA for 300 s FIG. 29 depicts another example solar cell device structure, according to an example implementation of the disclosed technology. FIG. 30 shows J-V characteristics and device performance parameters for the device shown in FIG. 29.

ITO-coated glass (Colorado Concept Coatings LLC) with a sheet resistivity of ~15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PETE) (Mw~70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-μm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 5 min, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 31:
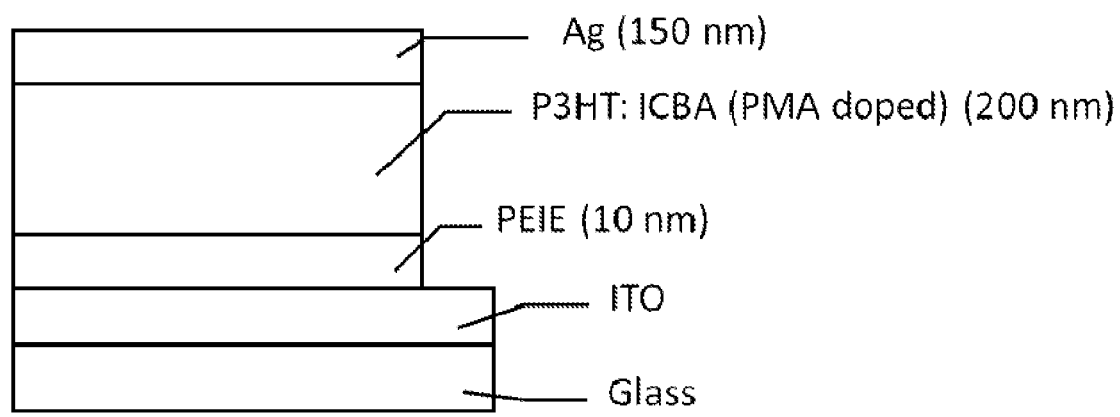
FIG. 31 depicts another example solar cell device structure, as discussed with reference to Example 10, and according to an example implementation of the disclosed technology.
Figure 32:
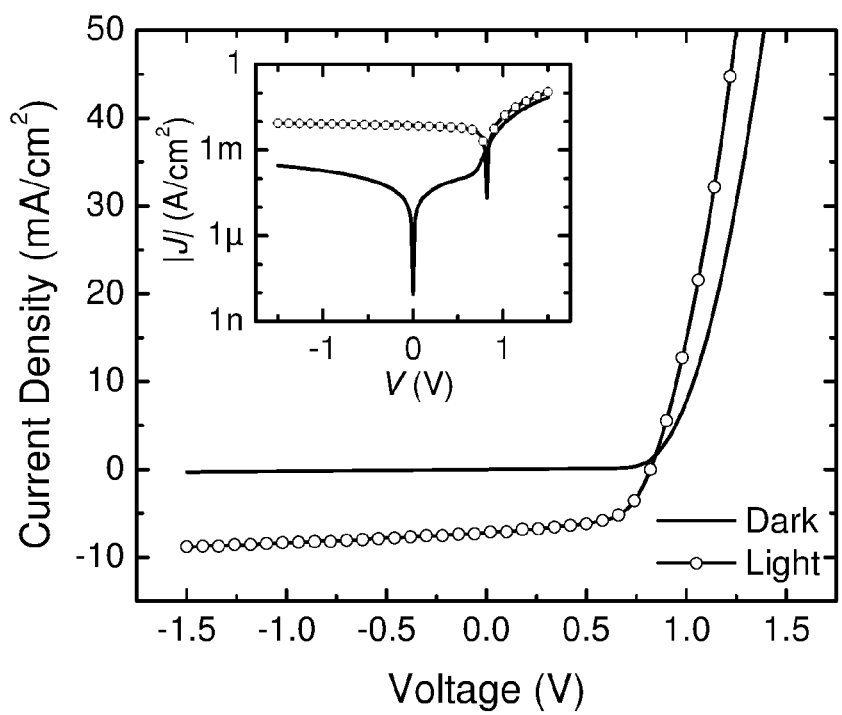
FIG. 32 shows J-V characteristics and device performance parameters for the device shown in FIG. 31.

Example 10. Inverted Solar Cells with 200 nm-Thick P3HT:ICBA Active Layer Dipped in PMA for 600 s FIG. 31 depicts another example solar cell device structure, according to an example implementation of the disclosed technology. FIG. 32 shows J-V characteristics and device performance parameters for the device shown in FIG. 31.

ITO-coated glass (Colorado Concept Coatings LLC) with a sheet resistivity of ~15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw~70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-μm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 10 min, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 33:
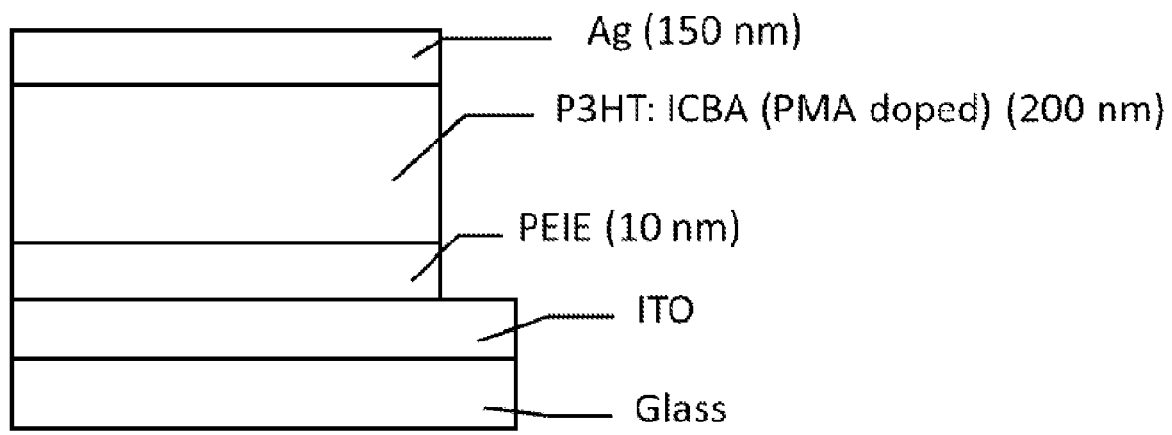
FIG. 33 depicts another example solar cell device structure, as discussed with reference to Example 11, and according to an example implementation of the disclosed technology.
Figure 34:
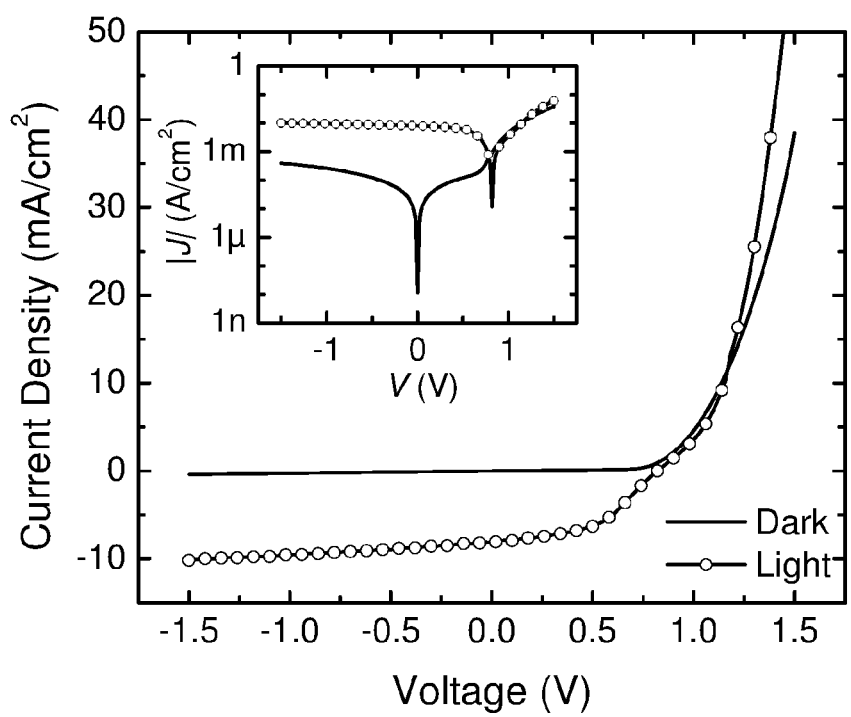
FIG. 34 shows J-V characteristics and device performance parameters for the device shown in FIG. 33.

Example 11. Inverted Solar Cells with 200 nm-Thick P3HT:ICBA Active Layer Dipped in PMA for 1800 s FIG. 33 depicts another example solar cell device structure, according to an example implementation of the disclosed technology. FIG. 34 shows J-V characteristics and device performance parameters for the device shown in FIG. 33.

ITO-coated glass (Colorado Concept Coatings LLC) with a sheet resistivity of ~15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw~70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-μm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 30 min, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 35:
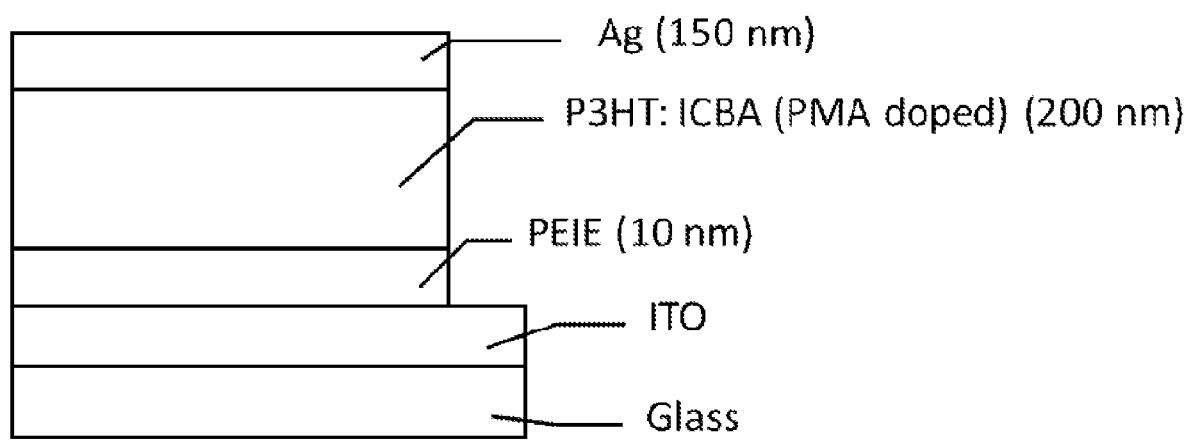
FIG. 35 depicts another example solar cell device structure, as discussed with reference to Example 12, and according to an example implementation of the disclosed technology.
Figure 36:
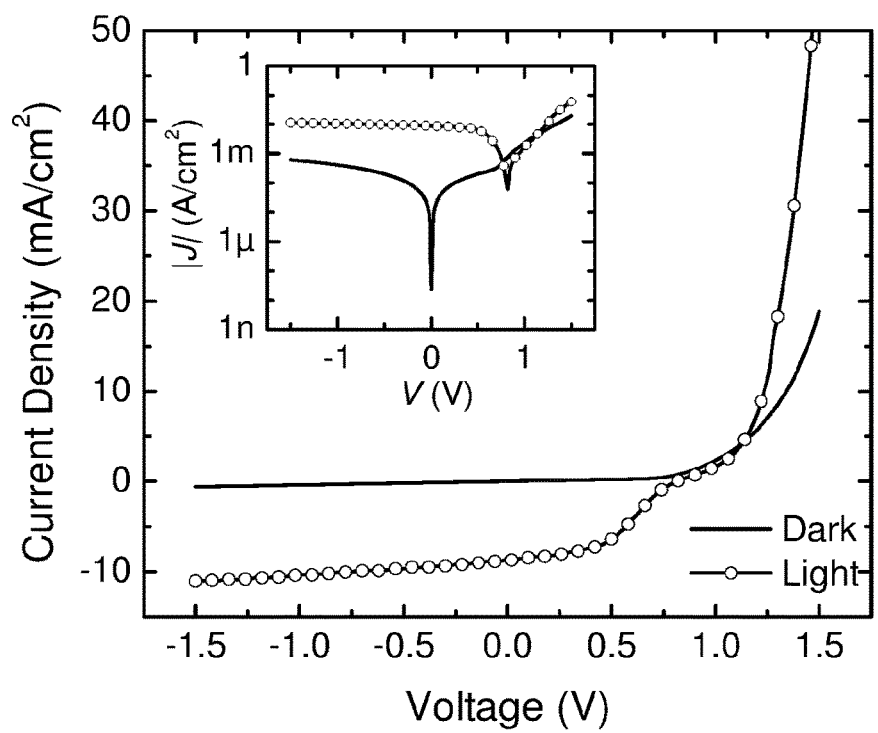
FIG. 36 shows J-V characteristics and device performance parameters for the device shown in FIG. 35.

Example 12. Inverted Solar Cells with 200 nm-Thick P3HT:ICBA Active Layer Dipped in PMA for 3600 s FIG. 35 depicts another example solar cell device structure, according to an example implementation of the disclosed technology. FIG. 36 shows J-V characteristics and device performance parameters for the device shown in FIG. 35.

ITO-coated glass (Colorado Concept Coatings LLC) with a sheet resistivity of ~15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw~70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-μm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.). The substrates were then dipped into a 0.5 M solution of 12-Molybdophosphoric acid hydrate (PMA, Alfa Aesar, Lot # W15A045) in nitromethane for 60 min, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Example 13. P3HT Diodes by Doping and De-Doping

Figure 37:
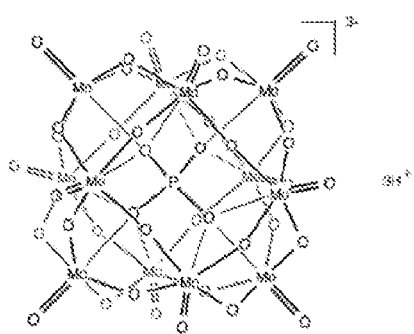
FIG. 37 depicts chemical structures of some of the materials disclosed herein for use in a diode device, as discussed with reference to Example 13, and according to an example implementation of the disclosed technology.
Figure 37:
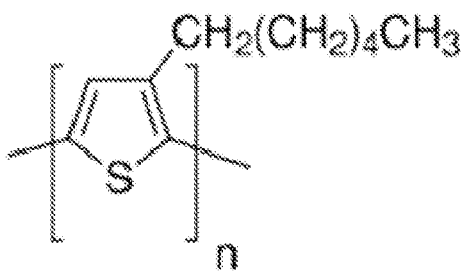
Figure 37:
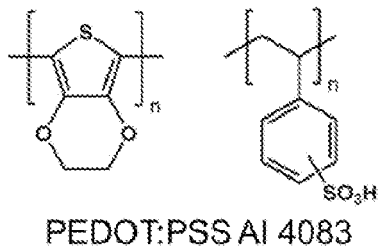
Figure 37:
Figure 38:
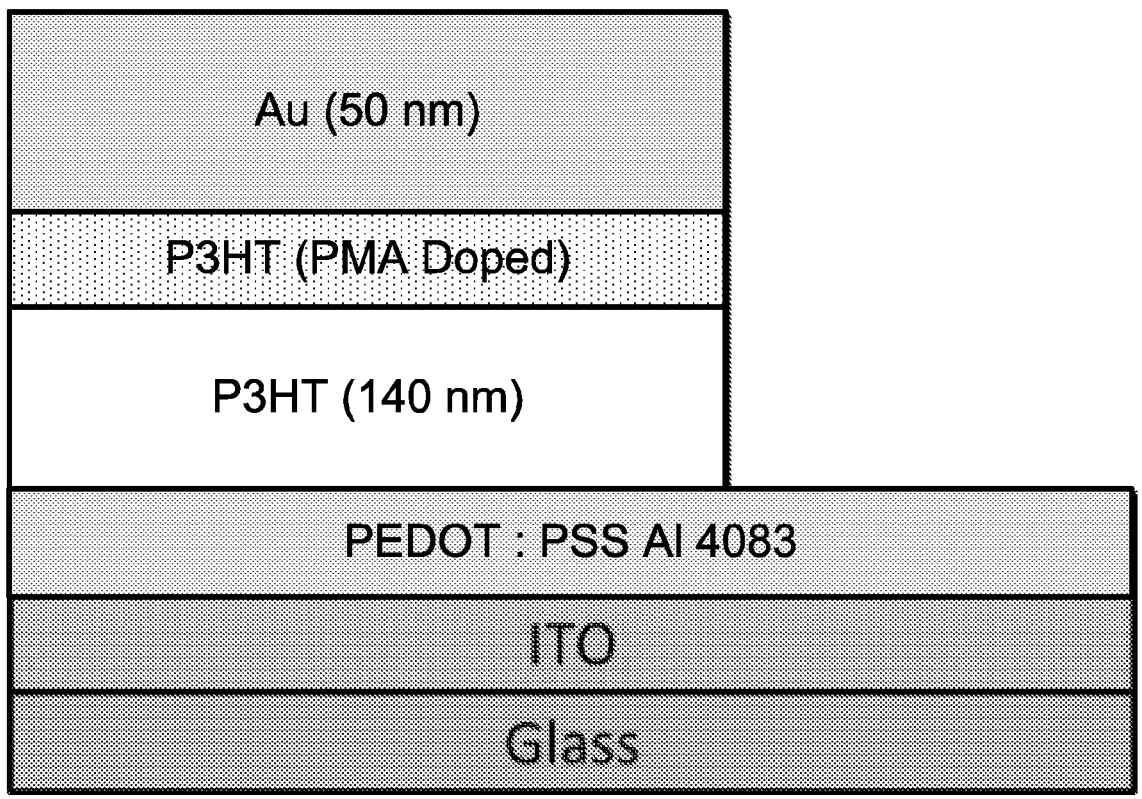
FIG. 38 depicts a diode structure, according to an example implementation of the disclosed technology.
Figure 39:
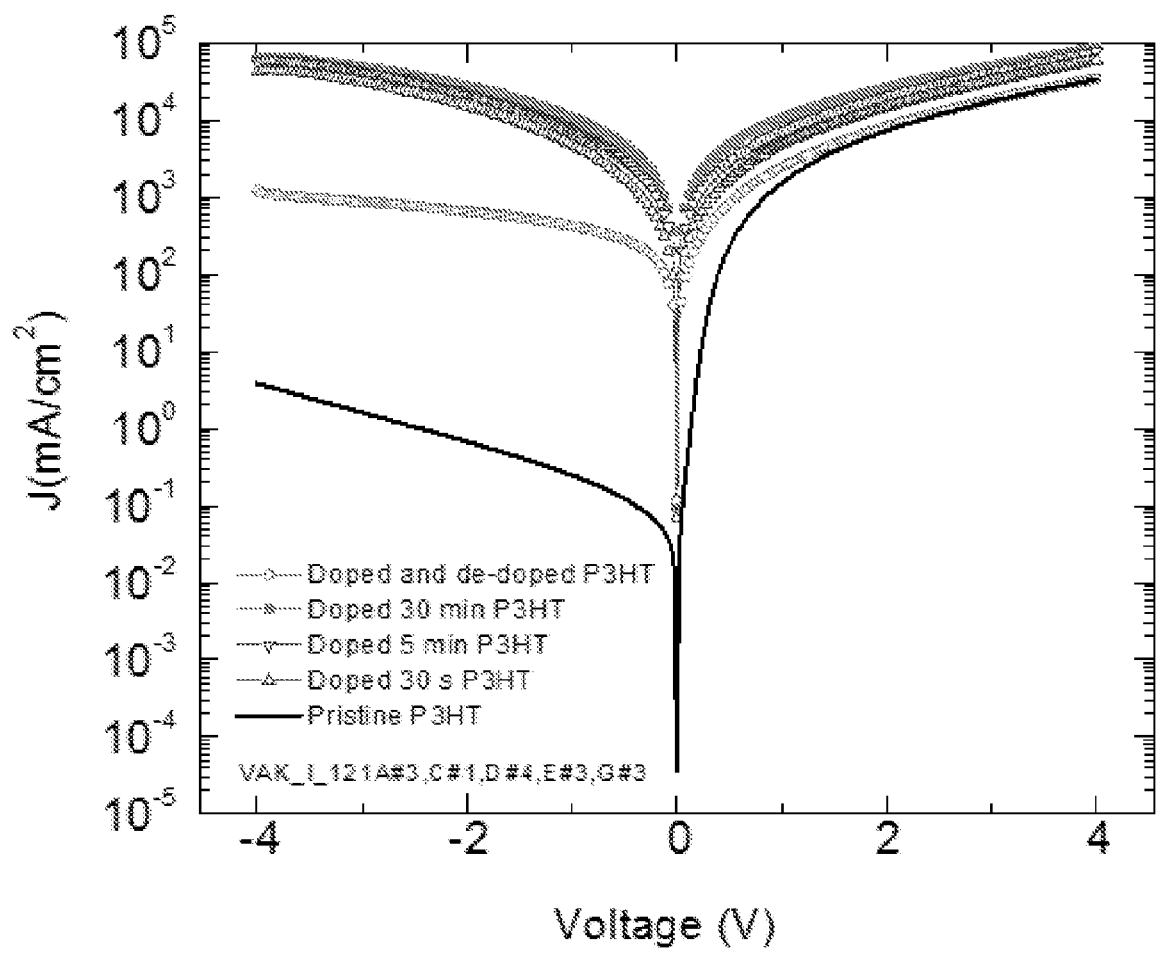
FIG. 39 depicts J-V characteristics and device performance parameters for the diode device as shown in FIG. 38.

FIG. 37 depicts chemical structures of some of the materials disclosed herein for use in a device. FIG. 38 depicts a diode structure, according to an example implementation of the disclosed technology. FIG. 39 depicts J-V characteristics and device performance parameters for the diode device as shown in FIG. 38.

Glass/ITO sheets were cut and half of the ITO was etched with 3:1 $HNO_3$:HCl. The etched slides were cut into 1"×1" pieces and cleaned in sequential ultrasonic baths of deionized water, Acetone, and IPA. The Glass/ITO substrates are treated by $O_2$ plasma for 1 min. PEDOT:PSS AI 4083 was spin coated at 5000 rpm 928 rpm/s for 60 s through a 0.45 μm PVDF filter and annealed at 140° C. for 10 min.

A solution of P3HT in 1,2-dichlorobenzene was simultaneously prepared with a concentration of 30 mg/mL and set on a hot plate at 70° C. at 500 rpm to stir overnight (12 h). A 140 nm thick film of P3HT film was spun on the glass/ITO at 800 rpm 10000 rpm/s for 30 s through a 0.2 μm PTFE filter. The films were solvent annealed for 2 h.

A solution of 12-Molybdophosphoric acid hydrate (PMA, Alfa Aesar, Lot # W15A045) in nitromethane 0.5 M 922 g/L was prepared in a N$_2$-filled glove box. Glass/ITO/P3HT samples were dipped for 30s, 5 min and 30 min. The samples were then sprayed down by pure nitromethane and then 1 mL of nitromethane was spun on the samples at 2000 rpm 2000 rpm/s for 30 s to remove any remaining PMA. After washing the films with nitromethane, the substrates were set on the hot plate at 70° C. for 10 min to remove the remaining solvent. The 30 minute doped P3HT film was then dipped into a 0.5 M solution of hydrazine hydrate (Sigma Aldrich, Lot #: SHBD9967V) in acetonitrile for 30 min to de-dope, or neutralize, the film.

Samples were then loaded into a vacuum thermal evaporation system (SPECTROS) where a 50 nm thick Au-electrode was deposited through a shadow mask with no rotation at a rate of 1.5 Å/s. The completed devices were transferred to another N$_2$-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program.

Figure 40:
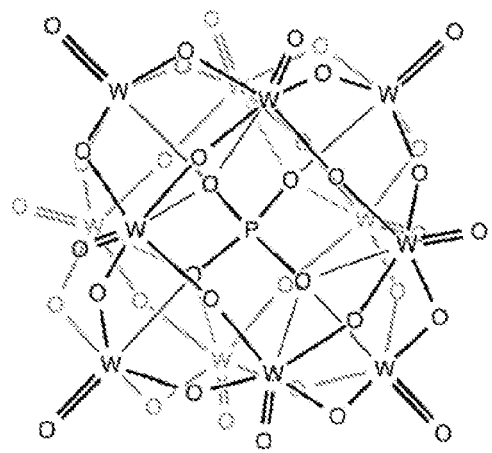
FIG. 40 depicts chemical structures of PTA and P3HT, as disclosed herein and as discussed with reference to Example 14.
Figure 40:
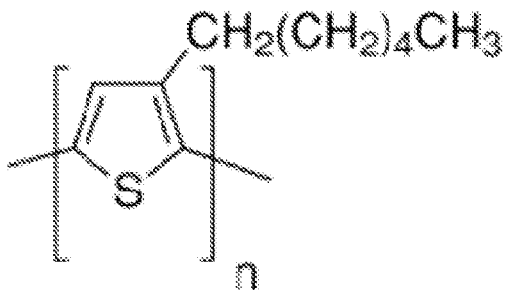
Figure 41:
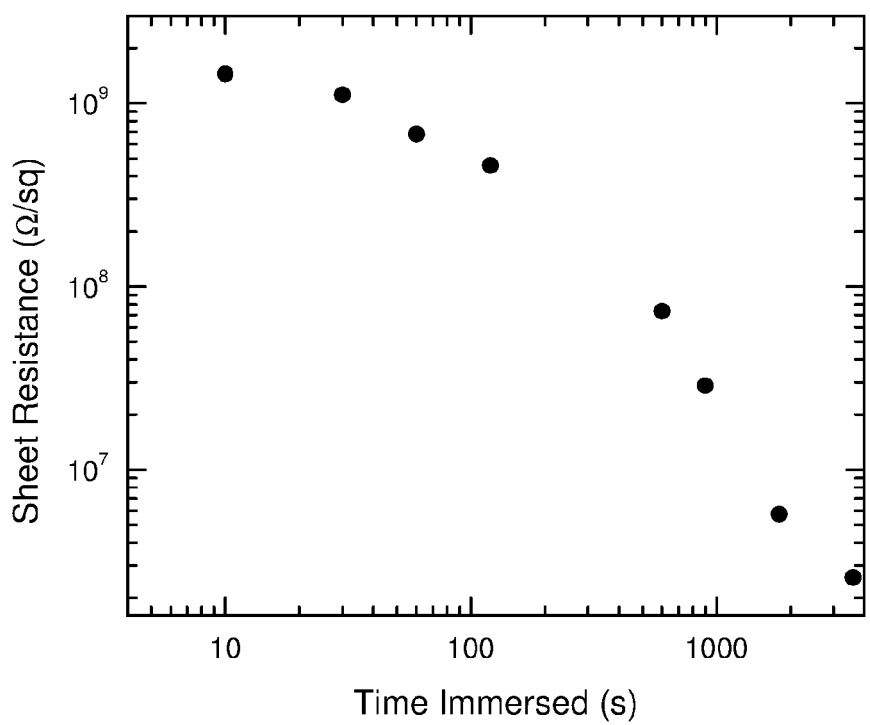
FIG. 41 shows sheet resistance dependence of doped P3HT as a function of immersion time in PTA solution, as discussed with reference to Example 14.

Example 14. Doping of P3HT Films by Immersion in A Phosphotungstic Acid (PTA) Solution FIG. 40 depicts chemical structures of PTA and P3HT, as disclosed herein. FIG. 41 shows sheet resistance dependence of doped P3HT as a function of immersion time in PTA solution.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

Then the substrates were transferred into a N$_2$-filled glove box. After mixing the solution for 12 h at 80° C. at 500 rpm, the film of poly(3-hexylthiophene) (P3HT, 4002-E, BS16-77, Rieke Metals) was filtered through 0.2-µm-pore PTFE filters and spin-coated on each substrate from 30 mg/ml chlorobenzene solution at a speed of 800 rpm and an acceleration of 10000 rpm/s for 30 s and annealed at 150° C. for 10 min on hot plate in the glove box. The thickness of the P3HT film is 140 nm, measured using a spectroscopic ellipsometer (J. A. Woollam Co.). The substrates were then dipped into a 0.5 M solution of Phosphotungstic Acid Hydrate (PTA, Alfa Aesar, Lot # P19A005) in nitromethane for various times, 10, 30, 60, 120, 300, 600, 1800, and 3600 s, rinsed thoroughly with pure nitromethane to remove all remaining PTA from the surface, and annealed at 70° C. for 10 min on a hot plate inside a N$_2$-filled glove box.

Samples were then loaded into a vacuum thermal evaporation system (SPECTROS) 150 nm of Ag was deposited through a shadow mask at a base pressure of $5\times10^{-8}$ Torr. The completed devices were transferred to another N$_2$-filled glove box for electrical measurements in a sealed container.

Transfer Length Measurements (TLM) were conducted on each of the films to determine the conductivity of the film. The TLM data was gathered from 4 rows of contacts along each substrate, 2 rows with a width of 1200 µm and 2 rows with a width of 2400 µm with distances along each row of contacts of 200, 100, 50, and 25 µm.

Example 15. Doping, De-Doping of P3HT Films by Immersion

Figures 42, 43:
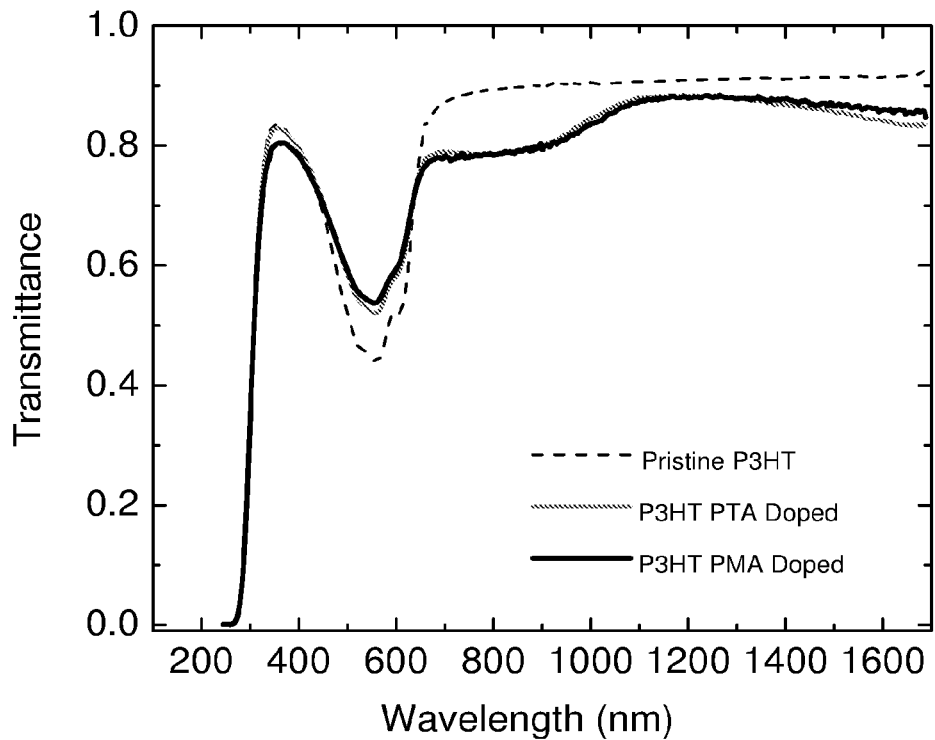
FIG. 42 shows transmittance spectra of pristine P3HT, PTA and PMA-doped P3HT films, as discussed with reference to Example 15.
FIG. 43 summarizes the work function of the various P3HT films (pristine, doped, de-doped, and $2^{nd}$ doped) with PMA and PTA dopants, as discussed with reference to Example 15.

FIG. 42 shows transmittance spectra of pristine P3HT, PTA and PMA doped P3HT films. FIG. 43 summarizes the work function of the various P3HT films (pristine, doped, de-doped, and 2$^{nd}$ doped) with PMA and PTA dopants.

Glass/ITO sheets were cut and half of the ITO was etched with 3:1 HNO$_3$:HCl. The etched slides were cut into 1"×1" pieces and cleaned in sequential ultrasonic baths of deionized water, Acetone, and IPA.

A solution of P3HT in 1,2-dichlorobenzene was simultaneously prepared with a concentration of 10 mg/mL and set on a hot plate at 70° C. at 500 rpm to stir overnight (12 h). A 30 nm thick film of P3HT film was spun on the glass/ITO at 1000 rpm 10000 rpm/s for 30 s through a 0.2 µm PTFE filter. The films were solvent annealed for 2 h.

A 0.5 M (922 g/L) solution of 12-Molybdophosphoric acid hydrate (PMA, Alfa Aesar, Lot # W15A045) in nitromethane was prepared in a N$_2$-filled glove box. Glass/ITO/P3HT samples were dipped for 1 hour. A 0.5 M solution of Phosphotungstic Acid Hydrate (PTA, Alfa Aesar, Lot # P19A005) in nitromethane was prepared in a N$_2$-filled glove box. Glass/ITO/P3HT samples were dipped for 1 hour.

The PMA or PTA doped samples were then sprayed down by pure nitromethane and then 1 mL of nitromethane was spun on the samples at 2000 rpm 2000 rpm/s for 30 s to remove any remaining PMA. After washing the films with nitromethane, the substrates were set on the hot plate at 70° C. for 10 min to remove the remaining solvent.

To de-dope the films, a 0.5 M hydrazine hydrate (Sigma Aldrich, Lot #: SHBD9967V) solution in acetonitrile was prepared and PMA or PTA doped P3HT films dipped 30 min. To re-dope the films a 0.5 M (922 g/L) solution of PMA in nitromethane was prepared in a N$_2$-filled glove box. De-doped P3HT samples were dipped for 1 hour. A 0.5 M solution of Phosphotungstic Acid Hydrate (PTA, Alfa Aesar, Lot # P19A005) in nitromethane was prepared in a N$_2$-filled glove box and de-doped P3HT samples were dipped for 1 hour.

Figure 44A:
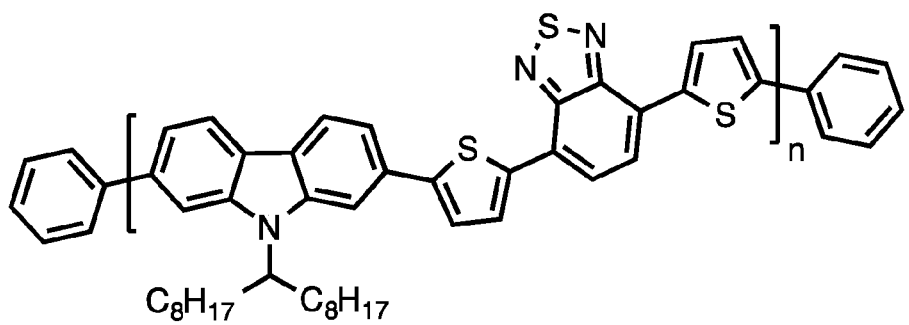
FIG. 44a shows a chemical structure of PCDTBT.
Figure 44B:
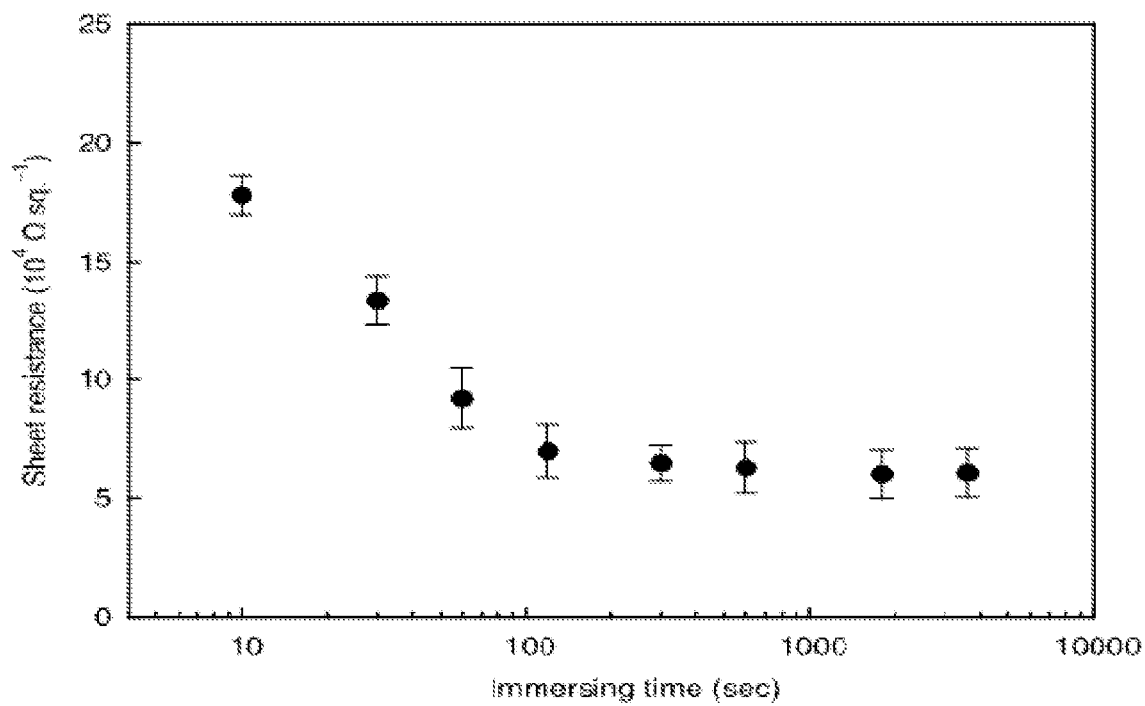
FIG. 44b shows sheet resistance of modified PCDTBT as function of immersing time.
Figure 44C:
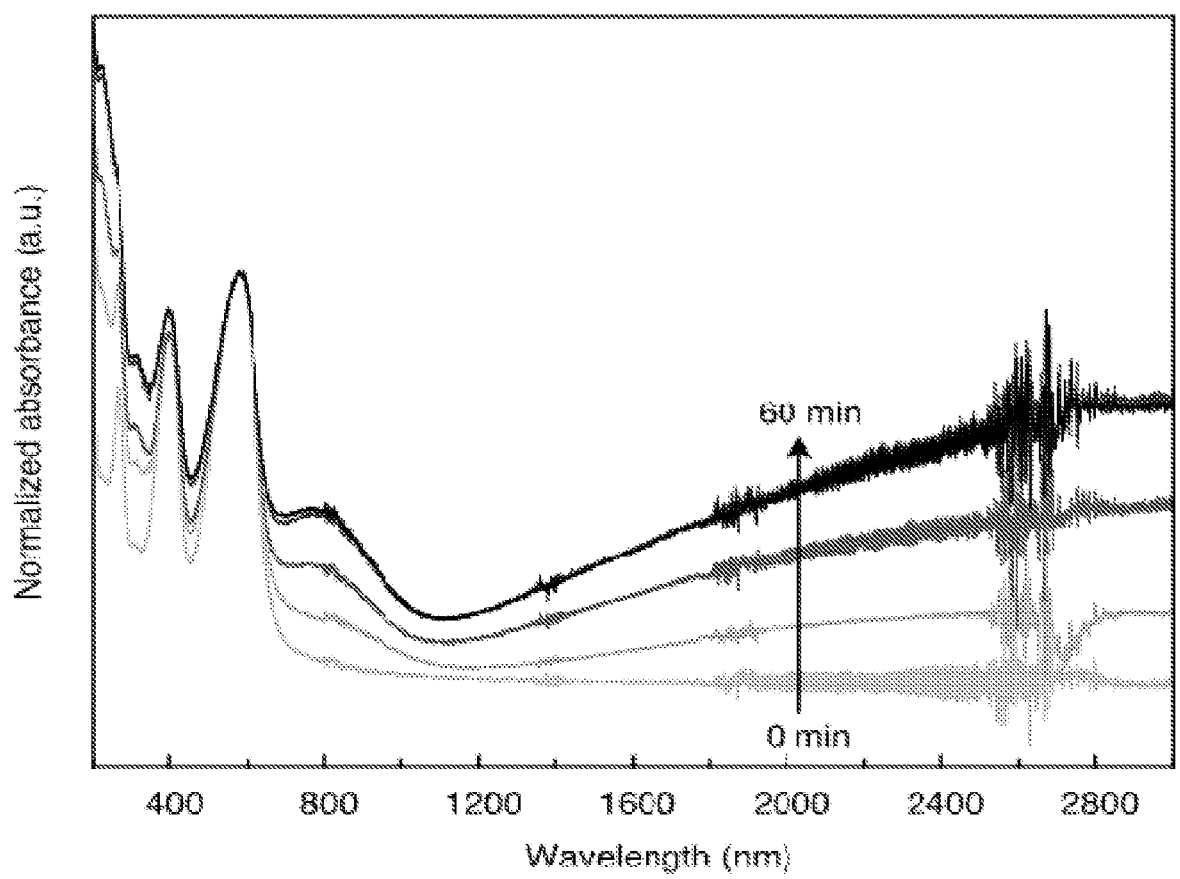
FIG. 44c shows a UV-vis-NIR absorption spectra of modified PCDTBT.
Figure 44D:
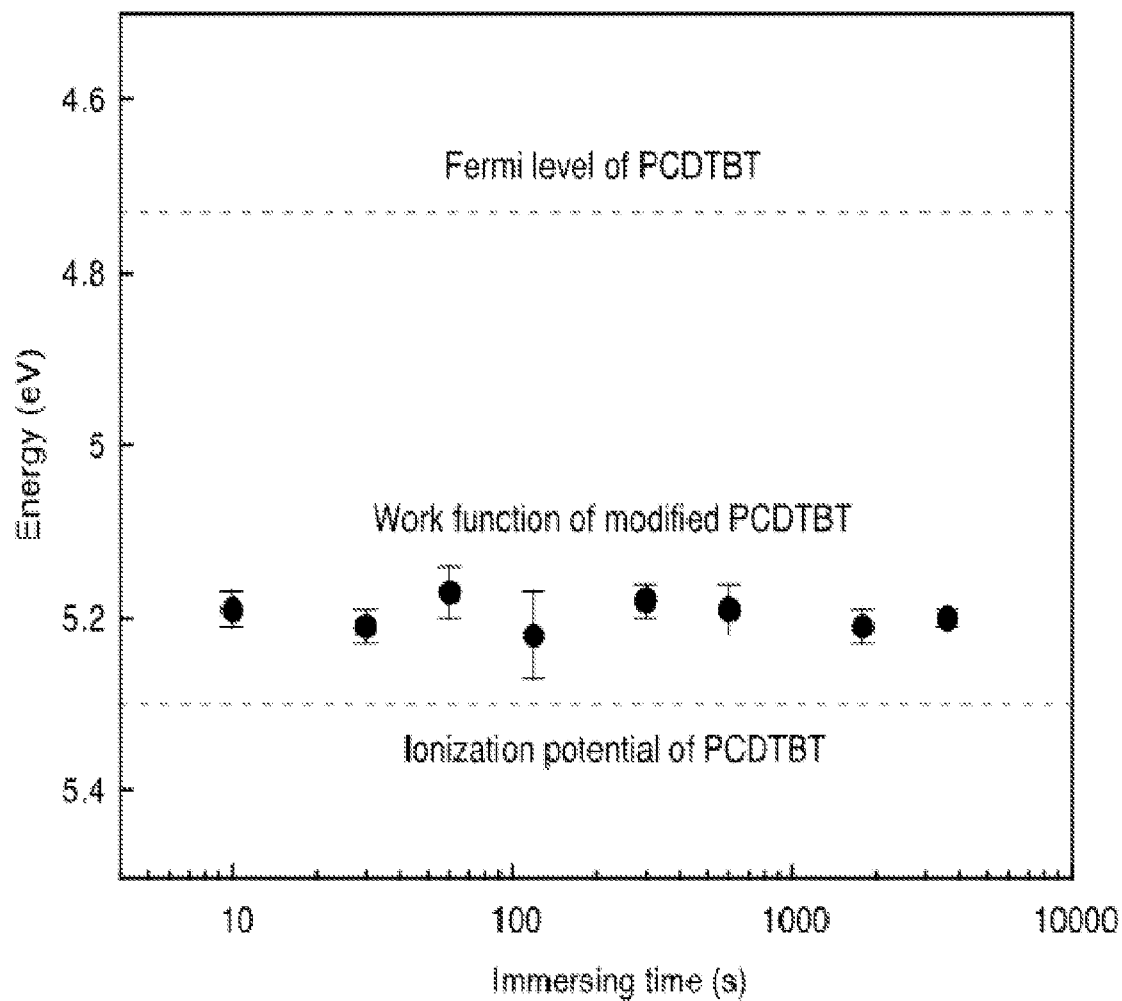
FIG. 44d shows the work function of modified PCDTBT as function of immersing time, as discussed with respect to Example 16.

Example 16. Doping of 30 nm-Thick PCDTBT Films by Immersion in A PMA Solution FIG. 44a shows a chemical structure of PCDTBT. FIG. 44b shows sheet resistance of modified PCDTBT as function of immersing time. FIG. 44c shows a UV-vis-NIR absorption spectra of modified PCDTBT. FIG. 44d shows the work function of modified PCDTBT as function of immersing time, as discussed with respect to Example 16.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

A 5.0 mg/mL poly[N-9'-heptadecanyl-2,7-carbazole-alt-5,5-(4',7'-di-2-thienyl-2',1',3'-benzothiadiazole)] (Ossila Ltd.) solution in anhydrous chlorobenzene (Aldrich), dissolved at 70° C. for 12 h and cooled at room temperature for 10 min before used. A 30-nm-thick PCDTBT film was spin coated on glass by filtering the solution using a 0.45 mm PVDF filter and spin coating at 2500 rpm, 1250 rpm/s for 30s. The film was annealed at 70° C. for 10 min and cooled in a Petri dish for 5 min prior to doping by immersion into a PMA solution. A 0.5 M (922 g/L, ca. 8 mL) nitromethane solution of PMA (Alfa Aesar 56166 lot: I11Y012) was placed in a Petri dish to allow the solution covering the entire surface of PCDTBT film during immersion for the selected amount of time, from 10 s to 60 min. In this process, PCDTBT films do not dissolve in nitromethane, but swell to allow PMA molecules to diffuse and introduce free holes through the films. After doping, the PCDTBT films were rinsed by pure nitromethane for 5 s and spin-rinsing with 1 mL of nitromethane at 2000 rpm, 2000 rpm/s for 30s and then annealed at 70° C. for 10 min. Upon immersion for 10 s, the resulting modified PCDTBT films became completely insoluble to common organic solvents, including dimethyl sulfoxide, tetrahydrofuran, and chlorobenzene, indicating that the polymer chains were covalently cross-linked into highly interpenetrated network structures. Additionally, we observed a considerably decreased sheet resistance of $1.8 \times 10^5$ $\Omega sq.^{-1}$, which is lower by seven orders of magnitude than that of pristine PCDTBT ($1.2 \times 10^{12}$ $\Omega sq.^{-1}$). The sheet resistance further decreased with immersing time from 10 s to 30 min (FIG. 23b), indicating an increase in the depth coverage of PMA. For a immersing time of 30 min, we measured the lowest sheet resistance of $6.0 \times 10^4$ $\Omega sq.^{-1}$, corresponding to a conductivity of 5.5 S $cm^{-1}$, which remained unchanged at 60 min, suggesting that the modified PCDTBT film was saturated with PMA.

UV-vis-NIR absorption spectroscopy was used to characterize the modified PCDTBT films (FIG. 23c). The work function of the modified PCDTBT deposited on an ITO electrode was investigated by Kelvin probe measurements. These measurements were calibrated against freshly cleaved highly oriented pyrolytic graphite (HOPG) with a known work function of 4.6 eV (FIG. 28d).

Figure 45:
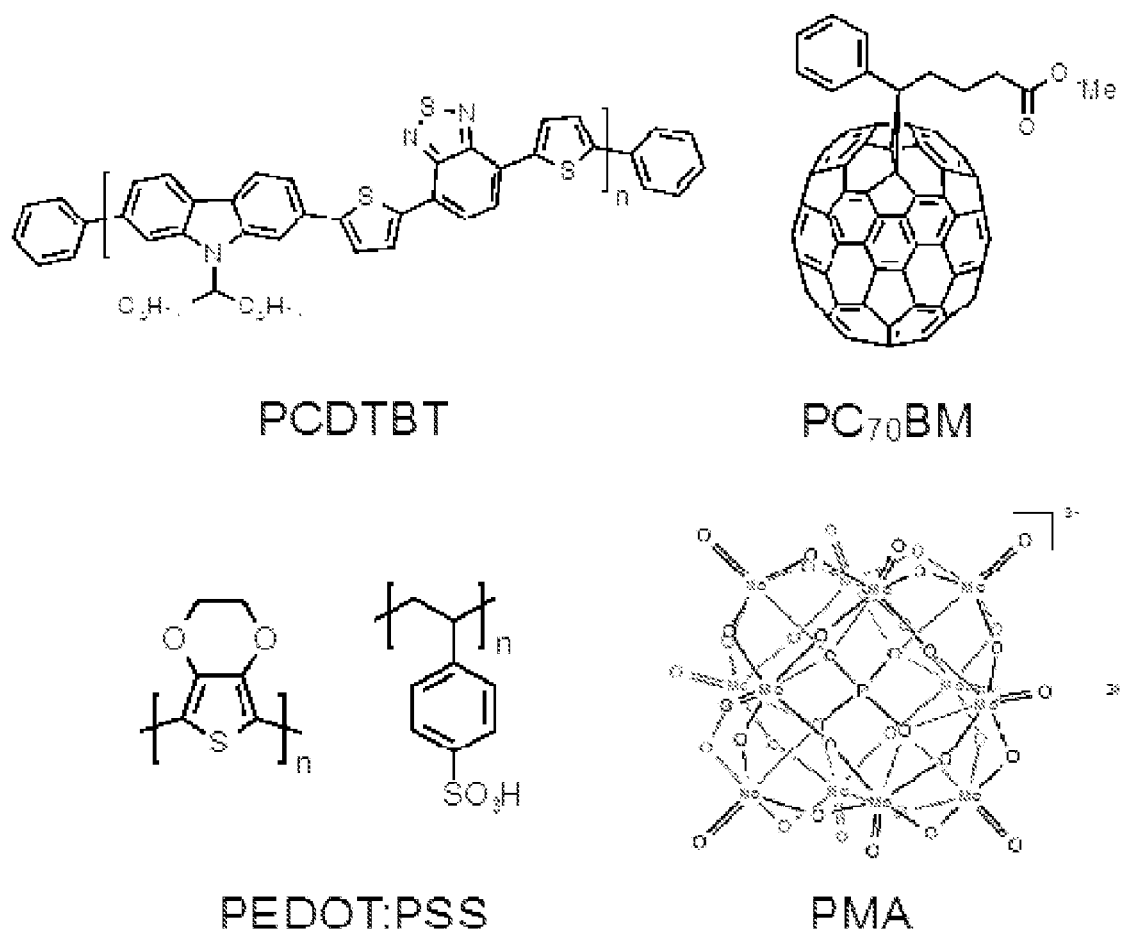
FIG. 45 depicts chemical structures of some of the materials disclosed herein for use in a solar cell device, as discussed with reference to Example 17.
Figure 46:
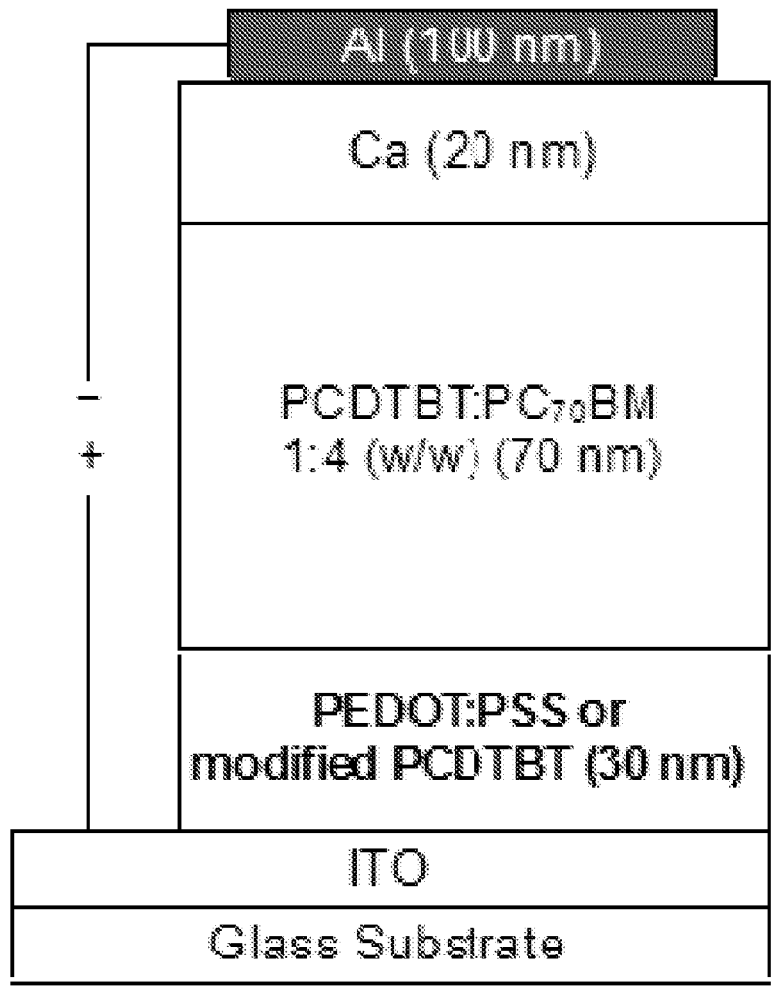
FIG. 46 depicts a solar cell structure, according to an example implementation of the disclosed technology, as discussed with reference to Example 17.
Figure 47:
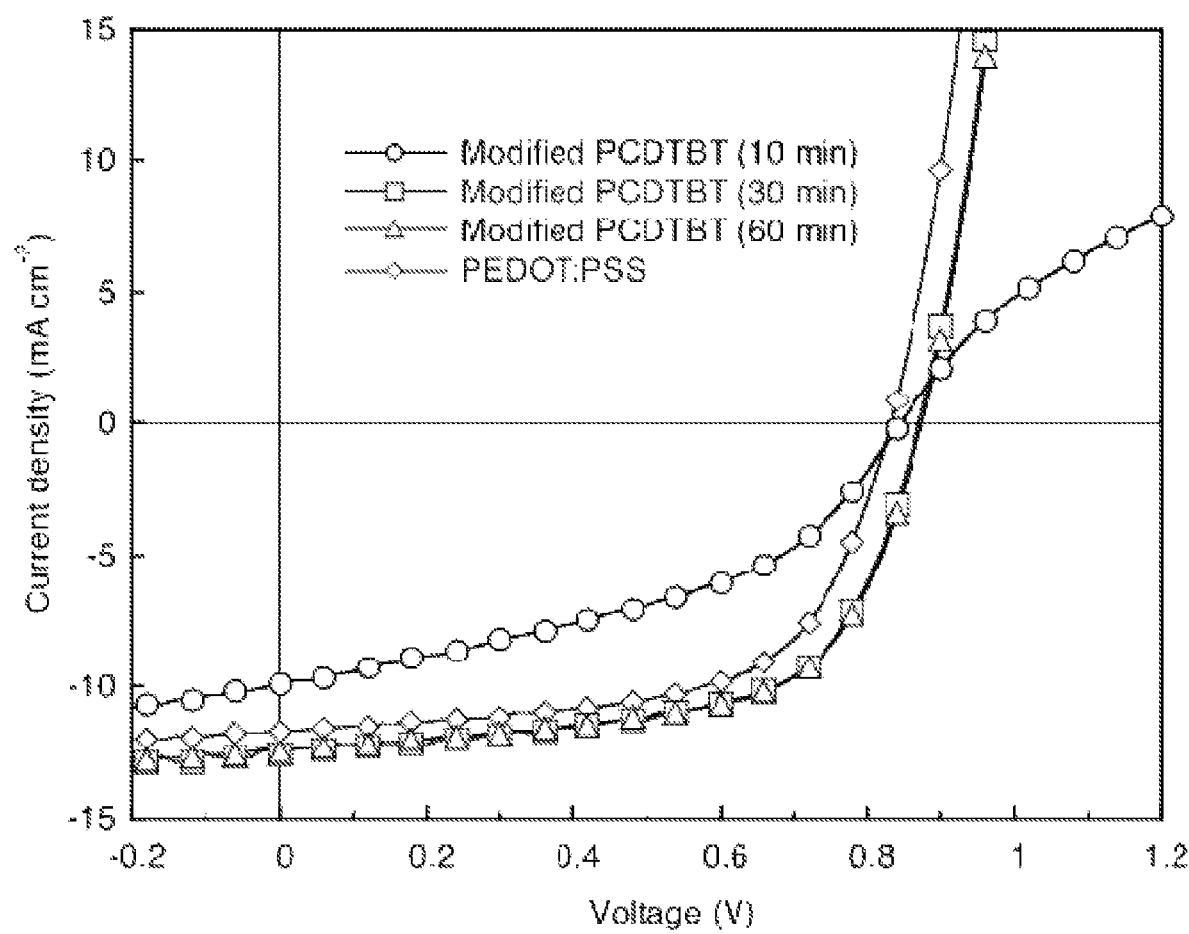
FIG. 47 shows J-V characteristics of solar cells with doped PCDTBT layers, as discussed with reference to Example 17.

Example 17. Solar Cells with 70 nm-Thick PCDTBT:PC$_{70}$BM Active Layers and 30 nm-Thick PCDTBT Hole-Collecting Layers by Immersion in a PMA Solution FIG. 45 depicts chemical structures of some of the materials disclosed herein for use in a solar cell device. FIG. 46 depicts a solar cell structure, according to an example implementation of the disclosed technology. FIG. 47 shows J-V characteristics of solar cells with doped PCDTBT layers.

OPVs using the modified PCDTBT as a hole-collecting layer were examined with the following device architecture: ITO (130 nm)/Modified PCDTBT (30 nm)/PCDTBT:PC$_{70}$BM 1:4 (by weight) (70 nm)/Ca (20 nm)/Al (100 nm). For comparison, PEDOT:PSS (Clevios P VP AI 4083) was also used as a hole-collecting layer as shown in FIG. 25.

ITO-coated glass (Colorado Concept Coatings LLC) with a sheet resistivity of ~15 $\Omega$/sq. was used as the substrates for the solar cells. The ITO substrates were patterned with kapton tape and etched by acid vapor (1:3 by volume, HNO$_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

In N$_2$-filled glove box, a 5.0 mg/mL PCDTBT (Ossila Ltd.) solution in chlorobenzene, dissolved at 70° C. for 12 h and cooled at room temperature for 10 min before used. A 30-nm-thick PCDTBT film was spin coated on the ITO-coated substrates by filtering the solution using a 0.45 mm PVDF filter and spin coating at 2500 rpm, 1250 rpm/s for 30s. The film was annealed at 70° C. for 10 min and cooled in a Petri dish for 5 min prior to doping by immersion into a PMA solution. A 0.5 M (922 g/mL, ca. 8 mL) nitromethane solution of PMA (Alfa Aesar 56166 lot: Ii 1Y012) was placed in a Petri dish to allow the solution covering the entire surface of PCDTBT film during immersion for the selected amount of time, from 10 min to 60 min. In this process, PCDTBT films do not dissolve in nitromethane, but swell to allow PMA molecules to diffuse and introduce free holes through the films. After doping, the PCDTBT films were rinsed by pure nitromethane for 5 s and spin-rinsing with 1 mL of nitromethane at 2000 rpm, 2000 rpm/s for 30 s and then annealed at 70° C. for 10 min.

A 20 mg/mL PCDTBT (Ossila Ltd.):PC$_{70}$BM (Nano-C Inc.) (1:4, by weight) solution in chlorobenzene, dissolved at 70° C. for 12 h and cooled at room temperature for 10 min before used. A 70-nm-thick PCDTBT:PC$_{70}$BM active layer was spin coated on the hole-collecting layer by filtering the solution using a 0.2-mm PTFE filter and spin coating at 500 rpm, 166 rpm/s for 30 s. The film was annealed at 70° C. for 10 min.

The devices were then loaded into a vacuum thermal evaporation system (EvoVac, Angstrom Engineering Inc.) 20-nm-thick Ca and 100-nm-thick Al were deposited through a shadow mask at a base pressure of $5 \times 10^{-8}$ Torr. The completed devices were transferred to another N$_2$-filled glove box for electrical measurements in a sealed container.

The current density (J) as function of voltage (V) of the OPVs is shown in FIG. 25. The device performance improved with increasing immersing time of modified PCDTBT because of the increased depth coverage of diffused PMA in modified PCDTBT, as shown by the UV-vis-NIR absorption spectroscopy. For an immersing time of 60 min, we achieved the best PCE of 6.8±0.4% with V$_{oc}$ of 0.88±0.01 V, short-circuit current (J$_{sc}$) of 12.5±0.5 mA $cm^{-2}$ and fill factor (FF) of 0.63±0.01. A reference device using PEDOT:PSS exhibited a decreased PCE of 5.7±0.4% with V$_{oc}$ of 0.81±0.02 V, J$_{sc}$ of 11.7±0.3 mA $cm^{-2}$ and FF of 0.60±0.01.

Figure 48:
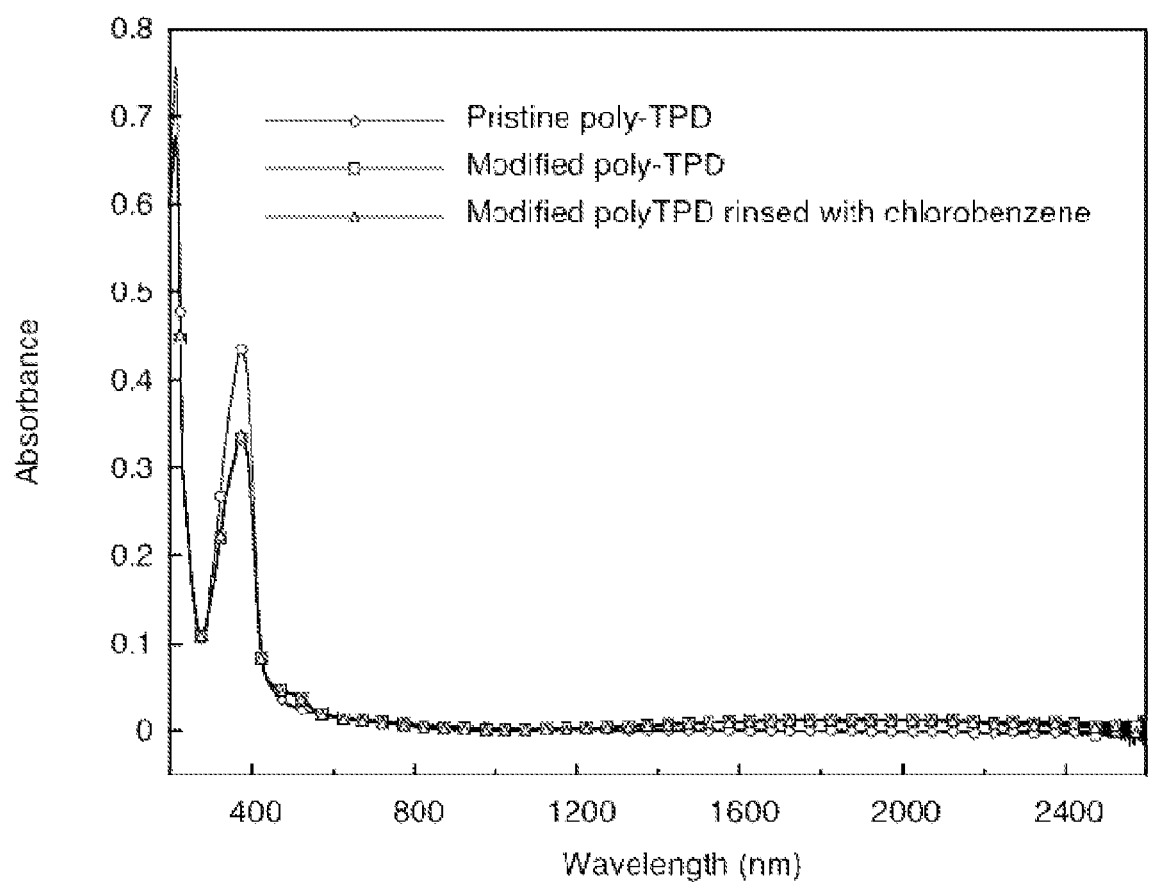
FIG. 48 shows UV-vis-NIR absorption spectra of modified poly-TPD, as discussed with reference to Example 18.
Figure 49:
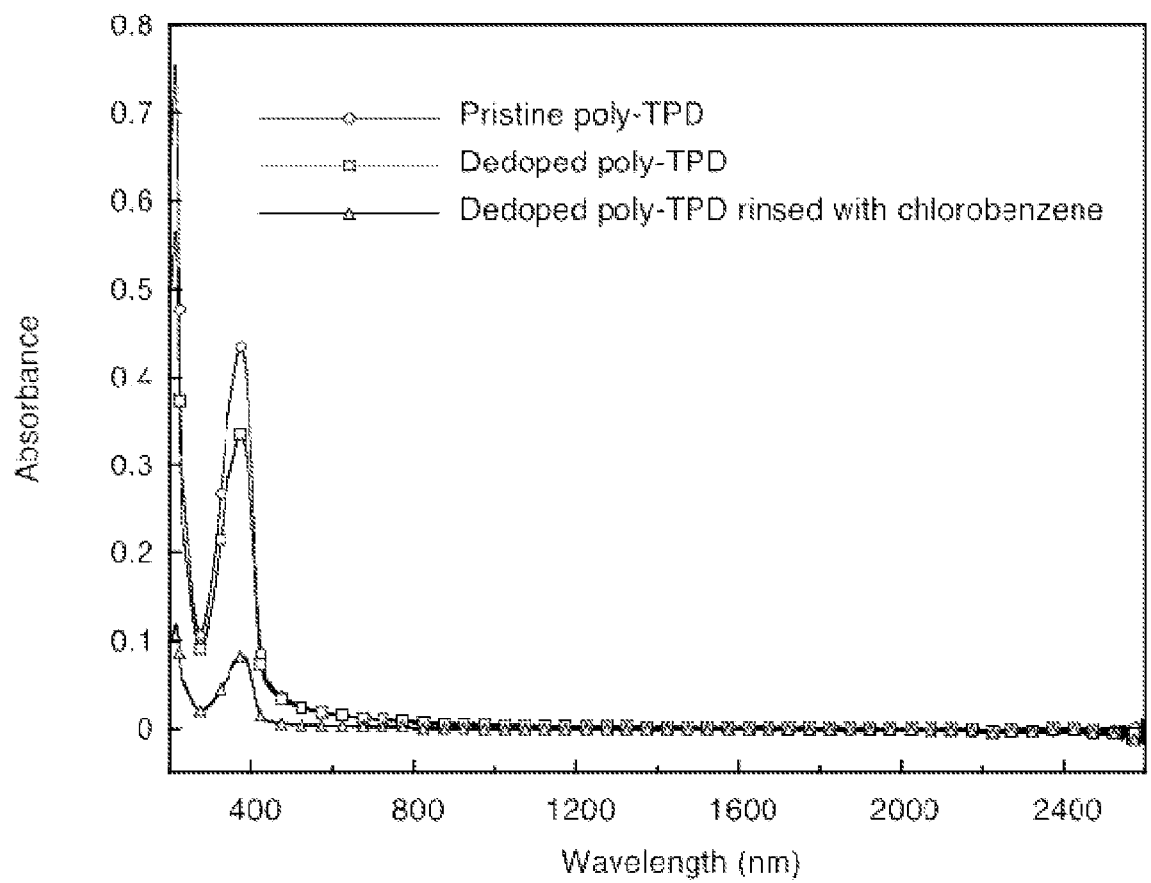
FIG. 49 shows UV-vis-NIR absorption spectra of dedoped poly-TPD, as discussed with reference to Example 18.

Example 18. Doping and De-Doping of 30 nm-Thick Poly-TPD Films by Immersion in a PMA Solution FIG. 48 shows UV-vis-NIR absorption spectra of modified poly-TPD. FIG. 49 shows UV-vis-NIR absorption spectra of dedoped poly-TPD.

Quartz substrates were cleaned in an ultrasonic bath of detergent water, rinsed with deionized water, and then cleaned in sequential ultrasonic baths of deionized water, acetone, and isopropanol. N$_2$ was used to dry the substrates after each of the last three baths.

In a N$_2$-filled glove box, a 4.0 mg/mL poly(N,N'-bis(4-butylphenyl)-N,N'-bis(phenyl)benzidine) (poly-TPD, American Dye Source, Inc.) solution in chlorobenzene, dissolved at 70° C. for 2 h and cooled at room temperature for 10 min before used. A 30-nm-thick poly-TPD film was spin coated on the cleaned quartz substrates by filtering the solution using a 0.45 mm PVDF filter and spin coating at 1200 rpm, 1200 rpm/s for 30s. The film was annealed at 120° C. for 10 min and cooled in a Petri dish for 5 min prior to doping by immersion in a PMA solution. A 0.5 M (922 g/mL, ca. 8 mL) nitromethane solution of PMA was placed in a Petri dish to allow the solution covering the entire surface of the poly-TPD film during immersion for 10 min. After dipping, the doped poly-TPD films were rinsed by pure nitromethane for 5 s and spin-rinsing with 1 mL of nitromethane at 2000 rpm, 2000 rpm/s for 30s and then annealed at 120° C. for 10 min. Upon immersion for 10 min, the resulting modified poly-TPD films became completely insoluble to common organic solvents, including chlorobenzene (FIG. 26).

To de-dope the modified poly-TPD films, the films were immersed in a 0.5 M solution of NaOH in methanol for 10 min, rinsed with pure methanol, and then annealed at 120° C. for 10 min. The resulting dedoped poly-TPD films became soluble to chlorobenzene (FIG. 27)

Figure 50:
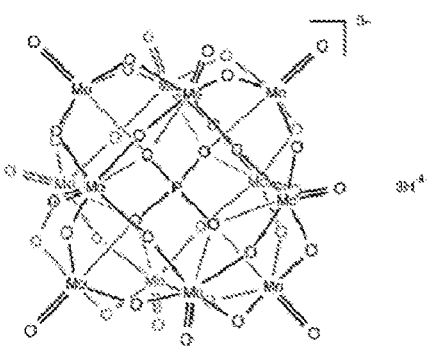
FIG. 50 depicts chemical structures of some of the materials disclosed herein for use in a solar cell device, as discussed with reference to Example 19.
Figure 50:
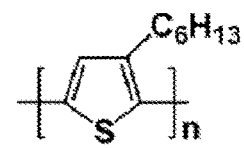
Figure 50:
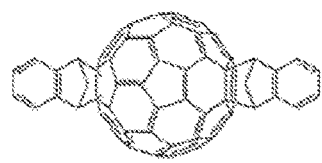
Figure 50:
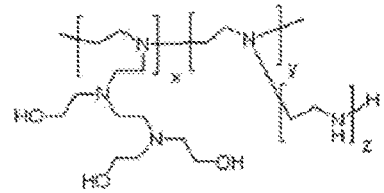
Figure 51:
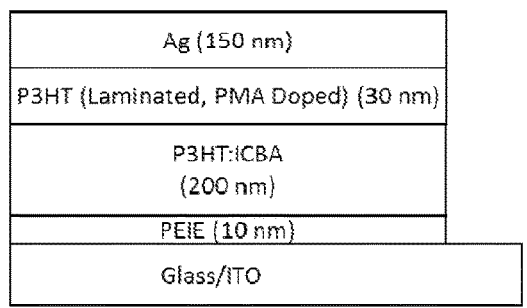
FIG. 51 depicts a device structure (top left figure), J-V characteristics (top right figure), and device performance parameters (bottom table) of devices with active layer immersed for 5 min in PMA solution, according to an example implementation of the disclosed technology, as discussed with reference to Example 19.
Figure 51:
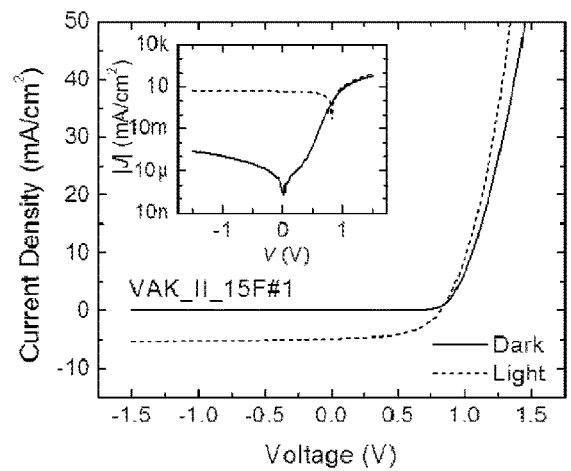
Figure 52:
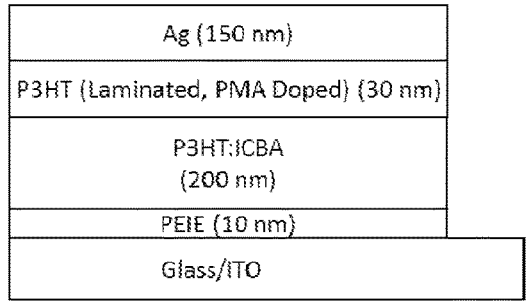
FIG. 52 depicts a device structure (top left figure), J-V characteristics (top right figure), and device performance parameters (bottom table) of devices with active layer immersed for 15 min in PMA solution, according to an example implementation of the disclosed technology, as discussed with reference to Example 19.
Figure 52:
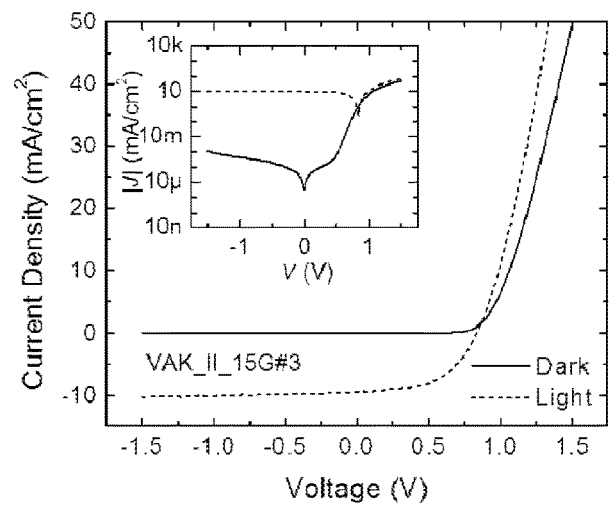

Example 19. Inverted Solar Cells with 200 nm-Thick P3HT:ICBA Active Layer and 30 nm-Thick P3HT Buffer Layer Immersed in PMA Solution for 5 or 15 Min FIG. 50 depicts chemical structures of some of the materials disclosed herein for use in a solar cell device. FIG. 51 depicts a device structure (top left figure), J-V characteristics (top right figure), and device performance parameters (bottom table) of devices with active layer immersed for 5 min in PMA solution, according to an example implementation of the disclosed technology. FIG. 52 depicts a device structure (top left figure), J-V characteristics (top right figure), and device performance parameters (bottom table) of devices with active layer immersed for 15 min in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70,000) was dissolved in $H_2O$ with a concentration of 35-40 wt. % as received from Aldrich. It was diluted into methoxyethanol to the weight concentration of 0.4%. Then the solution was spin coated onto cleaned ITO substrates at 5000 rpm for 1 min and annealed at 100° C. for 10 min on hotplate in ambient air.

Then the substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was filtered through 0.2-μm-pore PTFE filters and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.).

A separate layer of P3HT was fabricated on silicon substrates after following the same cleaning procedure described above. The P3HT was spun at 1000 rpm 10000 rpm/s for 30 s from a solution of P3HT of 10 mg/mL in chlorobenzene. A film of polydimethylsiloxane (PDMS) was prepared by mixing equal parts of base and crosslinker and pouring over a silicon substrate. This film was then annealed at 80° C. for 1 h in a vacuum oven. Strips of PDMS were then placed onto the film P3HT and immersed into distilled water to de-laminate it from the substrate onto the PDMS. The PDMS/P3HT film was then transferred onto the substrate containing the P3HT:ICBA active layer and slowly peeled off to transfer the P3HT layer onto the target substrate. The entire stack was then annealed at 150° C. for 10 min on hotplate in $N_2$ filled glove box.

The substrates were then dipped into a 0.5 M solution of 12-Molybdophosphoric acid hydrate (PMA, Alfa Aesar, Lot # W15A045, Alfa Aesar) in nitromethane for 5 or 15 min, rinsed thoroughly with pure nitromethane to remove all remaining PMA from the surface, and annealed at 70° C. for 10 min on a hot plate inside a $N_2$-filled glove box.

Samples were then loaded into a vacuum thermal evaporation system (EvoVac, Angstrom Engineering Inc.) 150 nm of Ag was deposited through a shadow mask at a base pressure of $5 \times 10^{-8}$ Torr. The completed devices were transferred to another $N_2$-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 53:
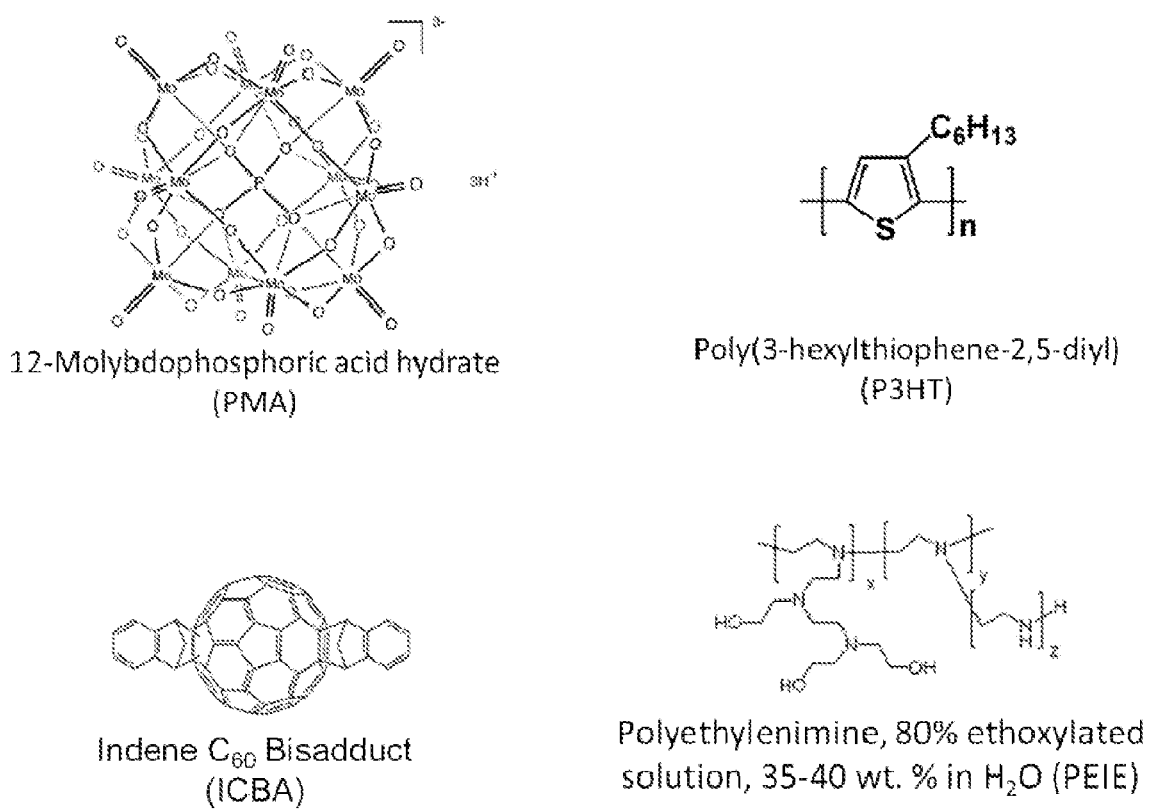
FIG. 53 depicts chemical structures of some of the materials disclosed herein for use in a solar cell device, as discussed with reference to Example 20.
Figure 54:
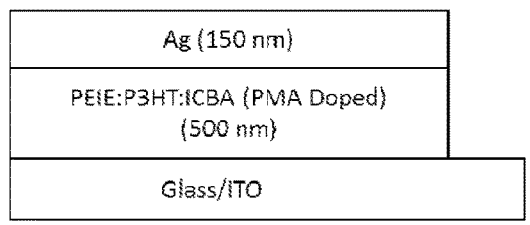
FIG. 54 depicts a device structure (top left figure), J-V characteristics (top right figure), and device performance parameters (bottom table) of devices with active layer immersed for 60 s in PMA solution, according to an example implementation of the disclosed technology, as discussed with reference to Example 20.
Figure 54:
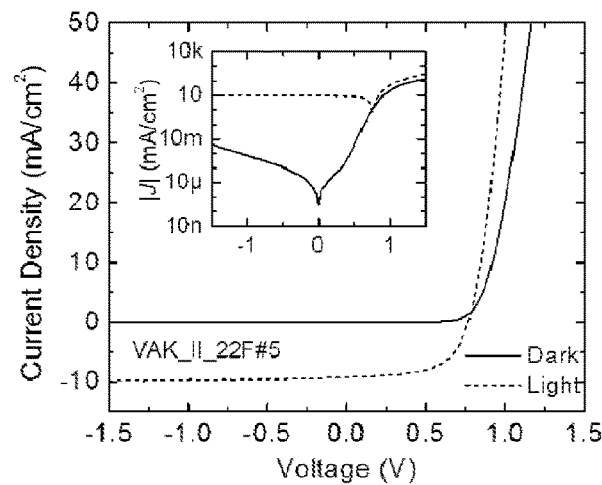

Example 20. Inverted Single-Layer Solar Cells of 500 nm-Thick PEIE:P3HT:ICBA Active Layer Immersed in PMA Solution for 60 s FIG. 53 depicts chemical structures of some of the materials disclosed herein for use in a solar cell device. FIG. 54 depicts a device structure (top left figure), J-V characteristics (top right figure), and device performance parameters (bottom table) of devices with active layer immersed for 60 min in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70,000) was dissolved in $H_2O$ with a concentration of 35-40 wt. % as received from Aldrich. It was diluted into methoxyethanol to the weight concentration of 0.4%.

The substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was mixed with the PEIE solution at a ratio of 8:92 v/v % PEIE:(P3HT:ICBA), filtered through 0.2-μm-pore PTFE filters, and spin-coated on each substrate from 80 mg/ml dichlorobenzene solution at a speed of 800 rpm and an acceleration of 10000 rpm/s for 30 s and annealed at 150° C. for 10 min on hot plate in the glove box. The thickness of the active layer is 500 nm, measured using a spectroscopic ellipsometer (J. A. Woollam Co.).

The substrates were then dipped into a 0.5 M solution of 12-Molybdophosphoric acid hydrate (PMA, Alfa Aesar, Lot # W15A045, Alfa Aesar) in nitromethane for 60 s, rinsed thoroughly with pure nitromethane to remove all remaining PMA from the surface.

Samples were then loaded into a vacuum thermal evaporation system (SPECTROS) 150 nm of Ag was deposited through a shadow mask at a base pressure of $5 \times 10^{-8}$ Torr. The completed devices were transferred to another $N_2$-filled glove box for electrical measurements in a sealed container.

The devices were electrically isolated using a razor to pattern around each device. Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source and the active area of each devices was defined with an aperture.

Figure 55:
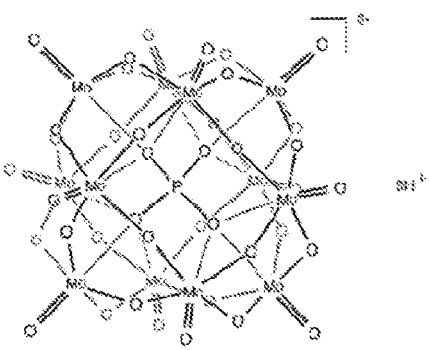
FIG. 55 depicts chemical structures of some of the materials disclosed herein for use in a solar cell device, as discussed with reference to Example 21.
Figure 55:
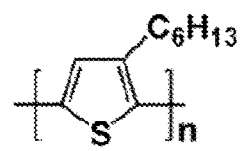
Figure 55:
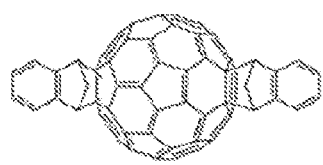
Figure 55:
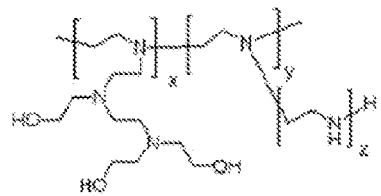
Figure 56:
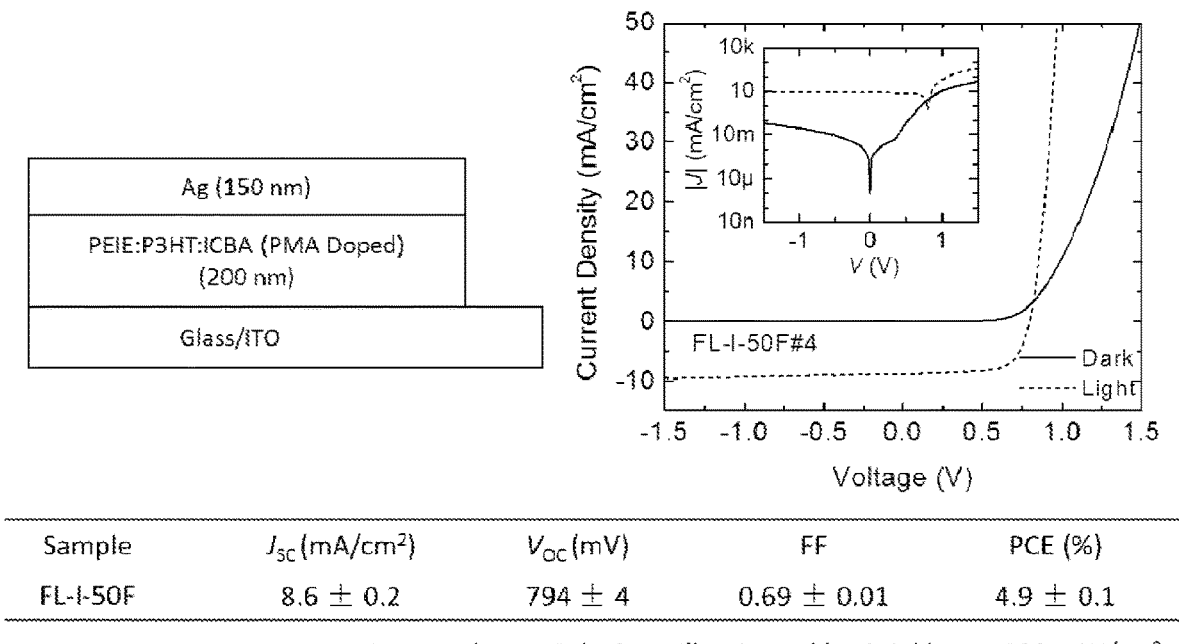
FIG. 56 depicts a device structure (top left figure), J-V characteristics (top right figure), and device performance parameters (bottom table) of devices with active layer immersed for 60 s in PMA solution, according to an example implementation of the disclosed technology, as discussed with reference to Example 21.

Example 21. Inverted Single-Layer Solar Cells of 200 nm-Thick PEIE:P3HT:ICBA Active Layer Immersed in PMA Solution for 60 s FIG. 55 depicts chemical structures of some of the materials disclosed herein for use in a solar cell device. FIG. 56 depicts a device structure (top left figure), J-V characteristics (top right figure), and device performance parameters (bottom table) of devices with active layer immersed for 60 s in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70,000) was dissolved in $H_2O$ with a concentration of 35-40 wt. % as received from Aldrich. It was diluted into methoxyethanol to the weight concentration of 0.4%.

The substrates were transferred into a $N_2$-filled glove box. The active layer of poly(3-hexylthiophene) (P3HT, 4002-E, PTL14-22, Rieke Metals): Indene $C_{60}$ Bisadduct (ICBA, Lumtec, Lot #39030-141006001) (1:1, weight ratio) was mixed with the PEIE solution at a ratio of 8:92 v/v % PEIE:(P3HT:ICBA), filtered through 0.2-μm-pore PTFE filters, and spin-coated on each substrate from 40 mg/ml dichlorobenzene solution at a speed of 800 rpm and an acceleration of 10000 rpm/s for 30 s and annealed at 150° C. for 10 min on hot plate in the glove box. The thickness of the active layer is 200 nm, measured using a spectroscopic ellipsometer (J. A. Woollam Co.).

The substrates were then dipped into a 0.5 M solution of 12-Molybdophosphoric acid hydrate (PMA, Alfa Aesar, Lot # W15A045, Alfa Aesar) in nitromethane for 60 s, rinsed thoroughly with pure nitromethane to remove all remaining PMA from the surface.

Samples were then loaded into a vacuum thermal evaporation system (SPECTROS) 150 nm of Ag was deposited through a shadow mask at a base pressure of 5×10$^{-8}$ Torr. The completed devices were transferred to another $N_2$-filled glove box for electrical measurements in a sealed container.

The devices were electrically isolated using a razor to pattern around each device. Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source and the active area of each devices was defined with an aperture.

Figure 57:
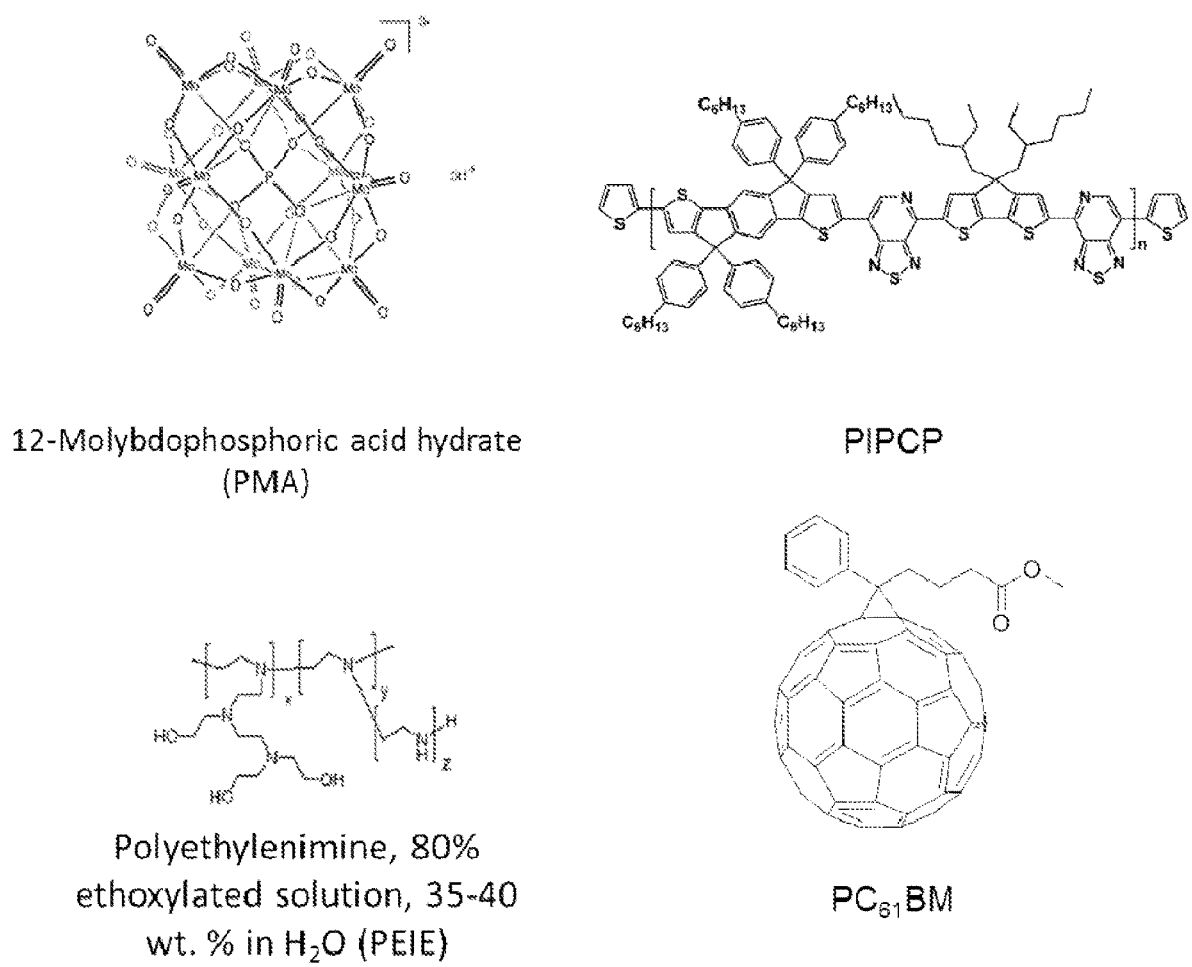
FIG. 57 depicts chemical structures of some of the materials disclosed herein for use in a solar cell device, as discussed with reference to Example 22.
Figure 58:
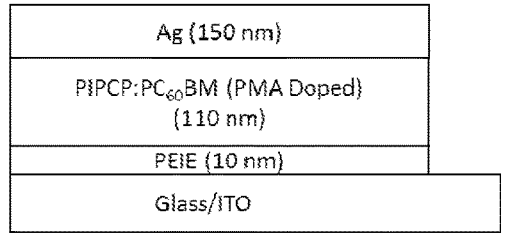
FIG. 58 depicts a device structure (top left figure), J-V characteristics (top right figure), and device performance parameters (bottom table) of devices with active layer immersed for 60 s in PMA solution, according to an example implementation of the disclosed technology, as discussed with reference to Example 22.
Figure 58:
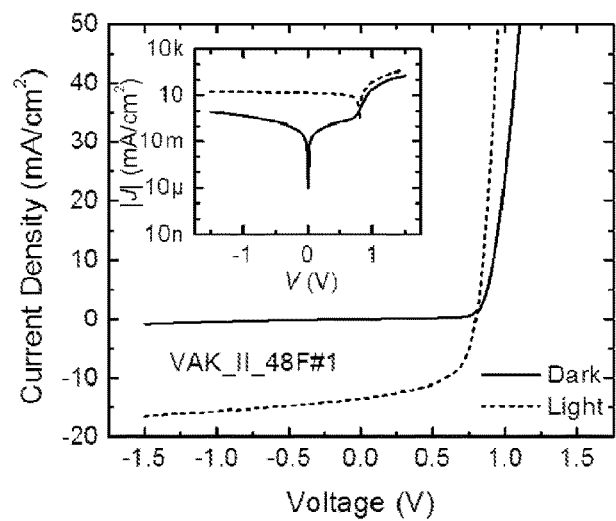
Figure 59:
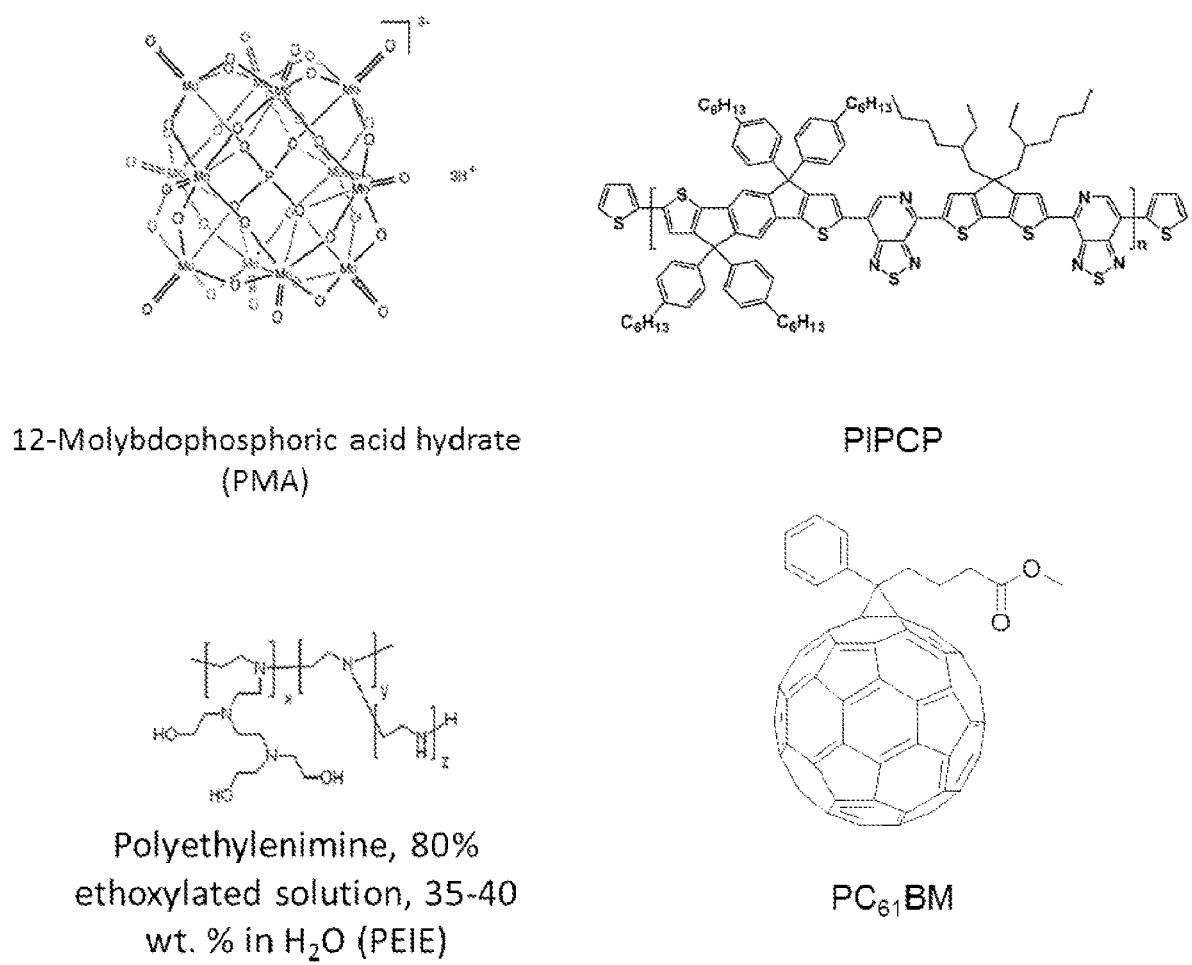
FIG. 59 depicts chemical structures of some of the materials disclosed herein for use in a solar cell device, as discussed with reference to Example 23.

Example 22. Inverted Solar Cells with a 110 Nm-Thick PIPCP:PC$_{60}$BM Active Layer Immersed in PMA Solution for 60 s FIG. 57 depicts chemical structures of some of the materials disclosed herein for use in a solar cell device. FIG. 59 depicts a device structure (top left figure), J-V characteristics (top right figure), and device performance parameters (bottom table) of devices with active layer immersed for 60 s in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PETE) (Mw ca.70,000) was dissolved in $H_2O$ with a concentration of 35-40 wt. % as received from Aldrich. It was diluted into 2-methoxyethanol to the weight concentration of 0.4%. Then the solution was spin coated onto cleaned ITO substrates at 5000 rpm for 1 min and annealed at 100° C. for 10 min on hotplate in ambient air.

The substrates were transferred into a $N_2$-filled glove box. The active layer poly-{4,4,9,9-tetrakis(4-hexylphenyl)-4,9-dihydro-s-indaceno[1,2-b:5,6-b']dithiophene-2,7-yl}-alt-{2,6-bis([1,2,5]thiadiazolo[3,4-c]pyridine-4'-yl)-4,4-bis(2-ethylhexyl)-cyclopenta[2,1-b:3,4-b']dithiophene-7',7"-yl} (PIPCP, Lot #:W15A045): PC$_{61}$BM (Nano-C, Lot # BJ120703) (1:2, weight ratio) was filtered through 0.2-μ-pore PTFE filters and spin-coated on each substrate from 30 mg/ml chloroform:chlorobenzene (3:2 v/v) solution at a speed of 2000 rpm and an acceleration of 10000 rpm/s for 60 s. The thickness of the active layer is 110 nm, measured using a spectroscopic ellipsometer (J. A. Woollam Co.).

The substrates were then dipped into a 0.05 M solution of 12-Molybdophosphoric acid hydrate (PMA, Alfa Aesar, Lot # W15A045, Alfa Aesar) in nitromethane for 60 s, rinsed thoroughly with pure nitromethane to remove all remaining PMA from the surface.

Samples were then loaded into a vacuum thermal evaporation system (SPECTROS) 150 nm of Ag was deposited through a shadow mask at a base pressure of 5×10$^{-8}$ Torr. The completed devices were transferred to another $N_2$-filled glove box for electrical measurements in a sealed container.

The devices were electrically isolated using a razor to pattern around each device. Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source and the active area of each devices was defined with an aperture.

Figure 60:
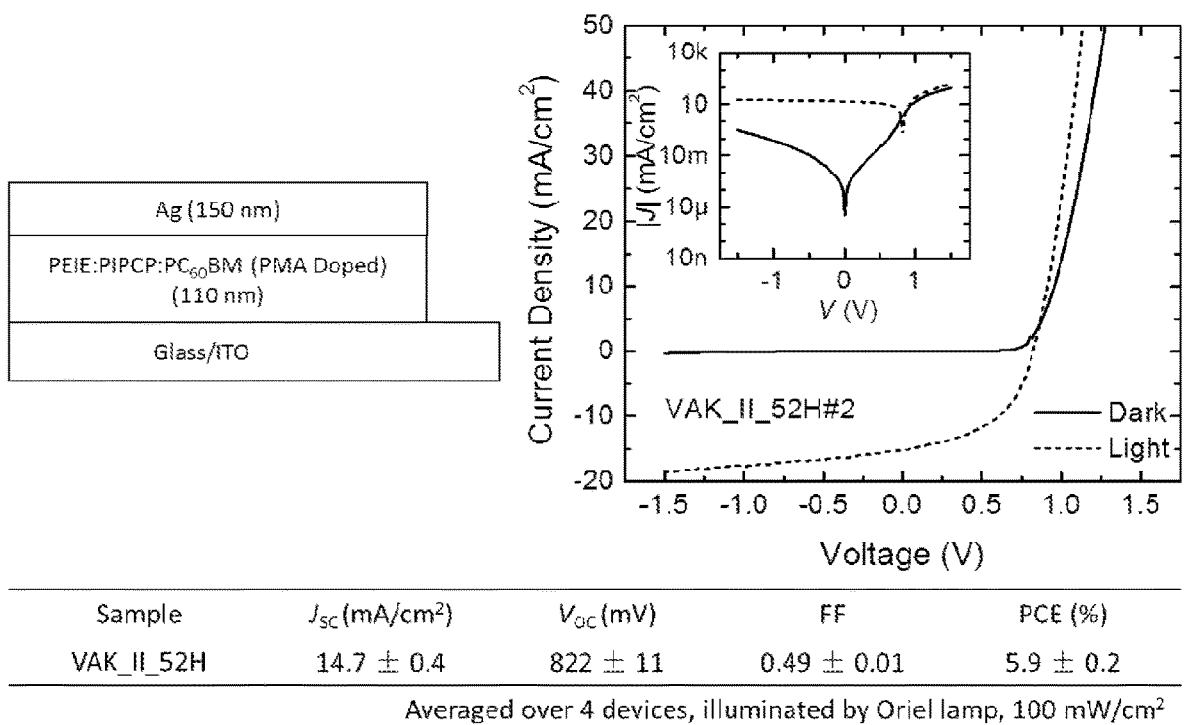
FIG. 60 depicts a device structure, as discussed with reference to Example 23 (top left figure), J-V characteristics (top right figure), and device performance parameters (bottom table) of devices with active layer immersed for 60 s in PMA solution, according to an example implementation of the disclosed technology.

Example 23. Inverted Single-Layer Solar Cells with a 110 nm-Thick PEIE:PIPCP:PC$_{60}$BM Active Layer Immersed in PMA Solution for 60 s FIG. 59 depicts chemical structures of some of the materials disclosed herein for use in a solar cell device. FIG. 60. depicts a device structure (top left figure), J-V characteristics (top right figure), and device performance parameters (bottom table) of devices with active layer immersed for 60 s in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70,000) was dissolved in $H_2O$ with a concentration of 35-40 wt. % as received from Aldrich. It was diluted into 2-methoxyethanol to the weight concentration of 0.4%.

The substrates were transferred into a $N_2$-filled glove box. The active layer poly-{4,4,9,9-tetrakis(4-hexylphenyl)-4,9-dihydro-s-indaceno[1,2-b:5,6-b']dithiophene-2,7-yl}-alt-{2,6-bis([1,2,5]thiadiazolo[3,4-c]pyridine-4'-yl)-4,4-bis(2-ethylhexyl)-cyclopenta[2,1-b:3,4-b']dithiophene-7',7"-yl} (PIPCP, Lot #:W15A045): $PC_{61}BM$ (Nano-C, Lot # BJ120703) (1:2, weight ratio) was mixed with the PEIE solution at a ratio of 4:96 v/v % PEIE:(PIPCP:$PC_{60}BM$), filtered through 0.2-μm-pore PTFE filters, and spin-coated on each substrate from 30 mg/ml chloroform:chlorobenzene (3:2 v/v) solution at a speed of 2000 rpm and an acceleration of 10000 rpm/s for 60 s. The thickness of the active layer is 110 nm, measured using a spectroscopic ellipsometer (J. A. Woollam Co.).

The substrates were then dipped into a 0.01 M solution of 12-Molybdophosphoric acid hydrate (PMA, Alfa Aesar, Lot # W15A045, Alfa Aesar) in nitromethane for 60 s, rinsed thoroughly with pure nitromethane to remove all remaining PMA from the surface.

Samples were then loaded into a vacuum thermal evaporation system (SPECTROS) 150 nm of Ag was deposited through a shadow mask at a base pressure of $5 \times 10^{-8}$ Torr. The completed devices were transferred to another $N_2$-filled glove box for electrical measurements in a sealed container.

The devices were electrically isolated using a razor to pattern around each device. Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source and the active area of each devices was defined with an aperture.

Figure 61:
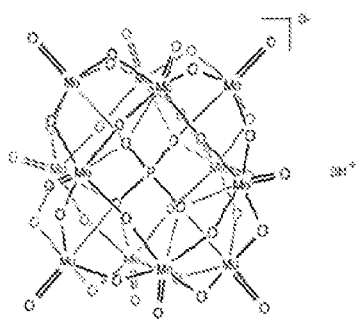
FIG. 61 depicts chemical structures of some of the materials disclosed herein for use in a solar cell device, as discussed with reference to Example 24.
Figure 61:
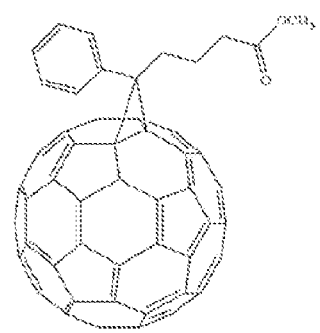
Figure 61:
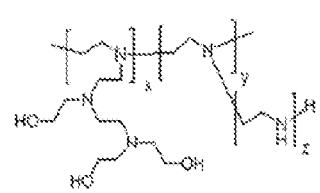
Figure 61:
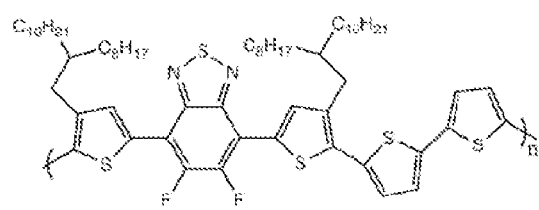
Figure 62:
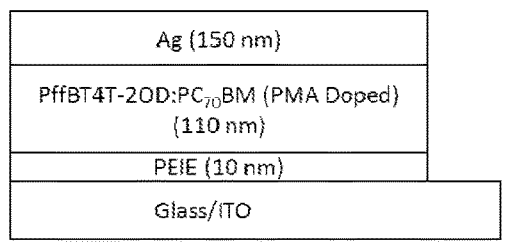
FIG. 62 depicts a device structure, as discussed with reference to Example 24 (top left figure), J-V characteristics (top right figure), and device performance parameters (bottom table) of devices with active layer immersed for 60 s in PMA solution, according to an example implementation of the disclosed technology.
Figure 62:
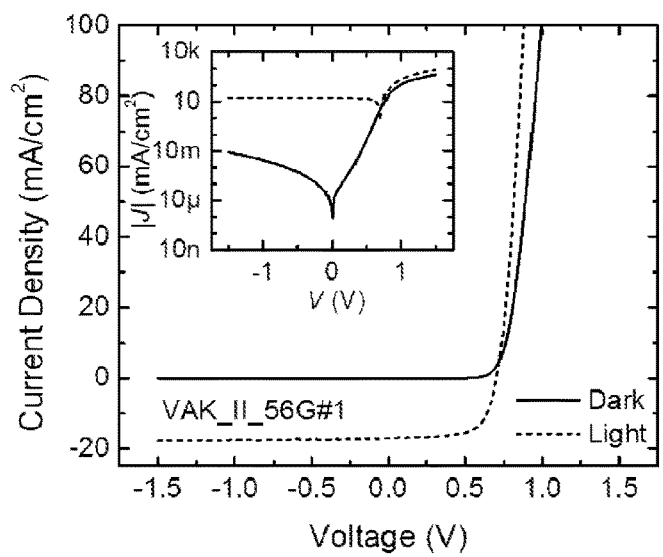

Example 24. Inverted Solar Cells with a 230 nm-Thick PFFBT4T-2OD:$PC_{70}BM$ Active Layer Immersed in PMA Solution for 60 s FIG. 61 depicts chemical structures of some of the materials disclosed herein for use in a solar cell device, according to an example implementation of the disclosed technology. FIG. 62 depicts a device structure (top left figure), J-V characteristics (top right figure), and device performance parameters (bottom table) of devices with active layer immersed for 60 s in PMA solution, according to an example implementation of the disclosed technology.

ITO-coated glass (Colorado Concept Coatings LLC) with a sheet resistivity of ca.15 Ω/sq. was used as the substrates for the solar cells. The ITO substrates were patterned with Kapton tape and etched by acid vapor (1:3 by volume, $HNO_3$:HCl) for 5 min at 80° C. The patterned substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Polyethylenimine, 80% ethoxylated (PEIE) (Mw ca.70,000) was dissolved in $H_2O$ with a concentration of 35-40 wt. % as received from Aldrich. It was diluted into 2-methoxyethanol to the weight concentration of 0.4%. Then the solution was spin coated onto cleaned ITO substrates at 5000 rpm for 1 min and annealed at 100° C. for 10 min on hotplate in ambient air.

The substrates were transferred into a $N_2$-filled glove box. The active poly[(5,6-difluoro-2,1,3-benzothiadiazol-4,7-diyl)-alt-(3,3'''-di(2-octyldodecyl)-2,2';5',2";5"',2'''-quaterthiophen-5,5'''-diyl)] (PffBT4T-2OD, Lot #:01A): $PC_{70}BM$ (Solenne, Lot #09-03-16) (1:1.4, weight ratio) was spin-coated on each substrate from 43.2 mg/mL dichlorobenzene:chlorobenzene (1:1 v/v)+3 v % 1,8-diodooctane solution at a speed of 800 rpm and an acceleration of 10000 rpm/s for 20 s from hot solution (110° C.) on pre-heated substrates. The thickness of the active layer is 230 nm, measured using a spectroscopic ellipsometer (J. A. Woollam Co.).

The substrates were then solvent annealed for 1 h, vacuum annealed for 1 h, thermally annealed at 110° C. for 5 min on a hot plate in the $N_2$ glove box, dipped into a 0.1 M solution of 12-Molybdophosphoric acid hydrate (PMA, Alfa Aesar, Lot # W15A045, Alfa Aesar) in nitromethane for 60 s, and rinsed thoroughly with pure nitromethane to remove all remaining PMA from the surface.

Samples were then loaded into a vacuum thermal evaporation system (SPECTROS) 150 nm of Ag was deposited through a shadow mask at a base pressure of $5 \times 10^{-8}$ Torr. The completed devices were transferred to another $N_2$-filled glove box for electrical measurements in a sealed container.

The devices were electrically isolated using a razor to pattern around each device. Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source and the active area of each devices was defined with an aperture.

Example 25. PMA Doping of PIPCP

Figure 63:
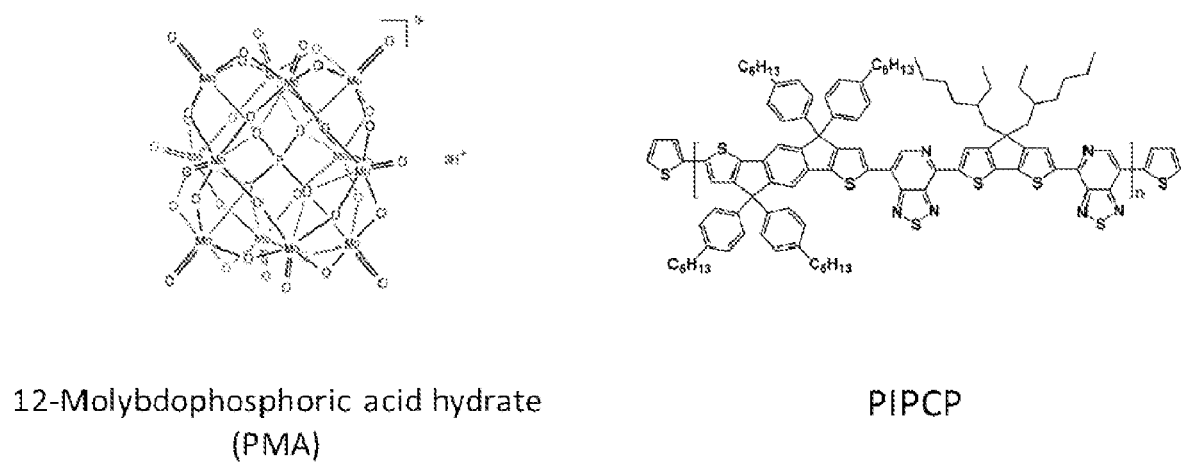
FIG. 63 depicts chemical structures of some of the materials disclosed herein for PMA doping of PIPCP, as described in Example 25.
Figure 64:
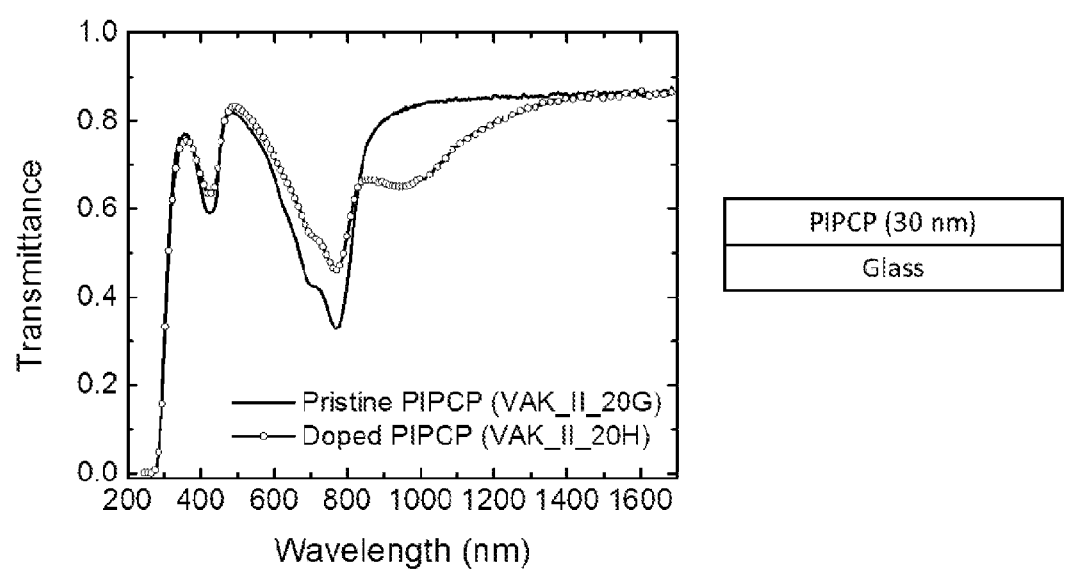
FIG. 64. depicts a sample geometry, as described in Example 25 (top right figure), transmittance of reference and doped PIPCP films (top left figure), and work function values (bottom table), according to an example implementation of the disclosed technology.

FIG. 63 depicts chemical structures of some of the materials disclosed herein for PMA doping of PIPCP, according to an example implementation of the disclosed technology. FIG. 64. depicts a sample geometry (top right figure), transmittance of reference and doped PIPCP films (top left figure), and work function valuse (bottom table), according to an example implementation of the disclosed technology.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 50° C. at 500 rpm, the film of poly-{4,4,9,9-tetrakis(4-hexylphenyl)-4,9-dihydro-s-indaceno[1,2-b:5,6-b']dithiophene-2,7-yl}-alt-{2,6-bis([1,2,5]thiadiazolo[3,4-c]pyridine-4'-yl)-4,4-bis(2-ethylhexyl)-cyclopenta[2,1-b:3,4-b']dithiophene-7',7"-yl} (PIPCP Lot #:W15A045) was filtered through 0.2-μm-pore PTFE filters and spin-coated on each substrate from 10 mg/ml chlorobenzene solution at a speed of 1000 rpm and an acceleration of 10000 rpm/s for 30 s. The thickness of the PIPCP film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045 Alfa Aesar) in nitromethane 10 min, rinsed thoroughly with pure nitromethane to remove all remaining PMA from the surface.

The work function, or Fermi level energy, of the PIPCP films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV.

The transmittance of the films was measured with the ellipsometer (J. A. Woollam Co.).

Example 26. PMA Doping of PBDTTT-C

Figure 65:
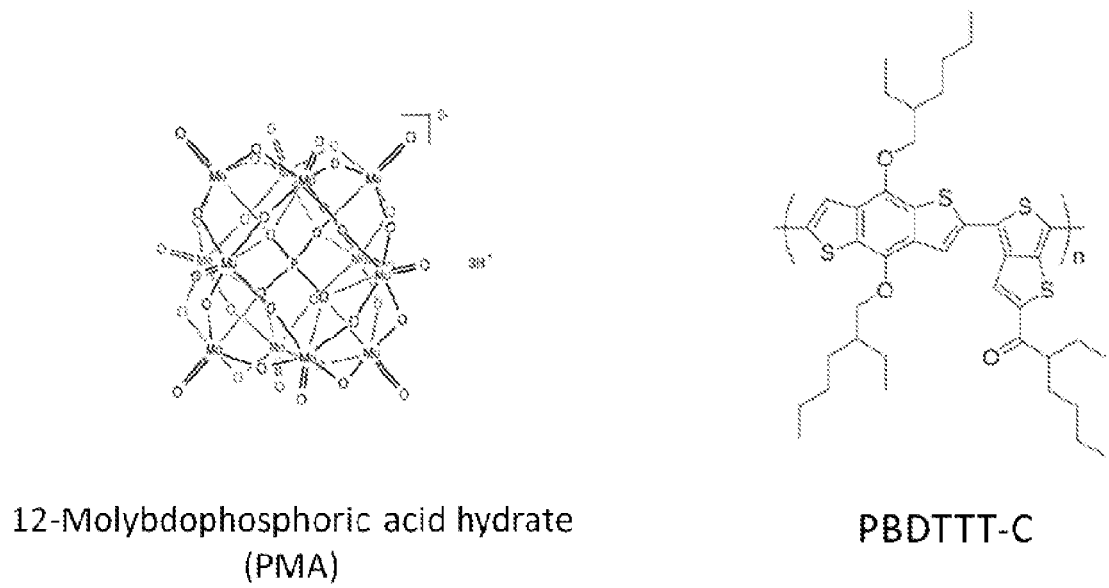
FIG. 65 depicts chemical structures of some of the materials disclosed herein for PMA doping of PBDTTT-C as described in Example 26.
Figure 66:
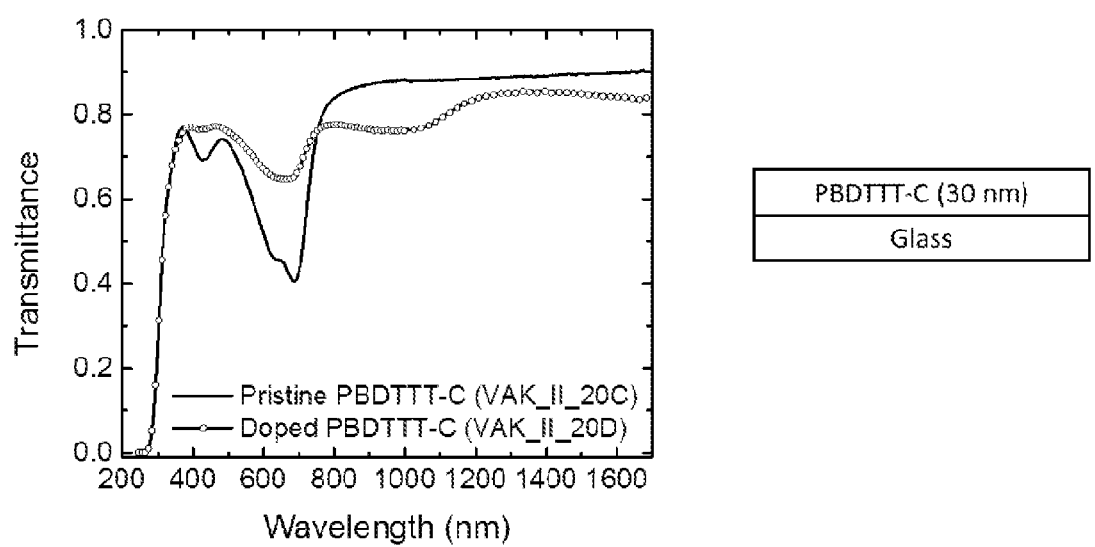
FIG. 66 depicts a sample geometry as described in Example 26 (top right figure), transmittance of reference and doped PBDTTT-C films (top left figure), and work function values (bottom table), according to an example implementation of the disclosed technology.

FIG. 65 depicts chemical structures of some of the materials disclosed herein for PMA doping of PBDTTT-C, according to an example implementation of the disclosed technology. FIG. 66 depicts a sample geometry (top right figure), transmittance of reference and doped PBDTTT-C films (top left figure), and work function values (bottom table), according to an example implementation of the disclosed technology.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene-)-2-6-diyl)] (PBDTTT-C) was filtered through 0.2-μm-pore PTFE filters and spin-coated on each substrate from 10 mg/ml chlorobenzene solution at a speed of 1000 rpm and an acceleration of 10000 rpm/s for 30 s. The thickness of the PBDTTT-C film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045, Alfa Aesar) in nitromethane 10 min, rinsed thoroughly with pure nitromethane to remove all remaining PMA from the surface.

The work function, or Fermi level energy, of the PBDTTT-C films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmittance of the films was measured with the ellipsometer (J. A. Woollam Co.).

Example 27. PMA Doping of PTB7

Figure 67:
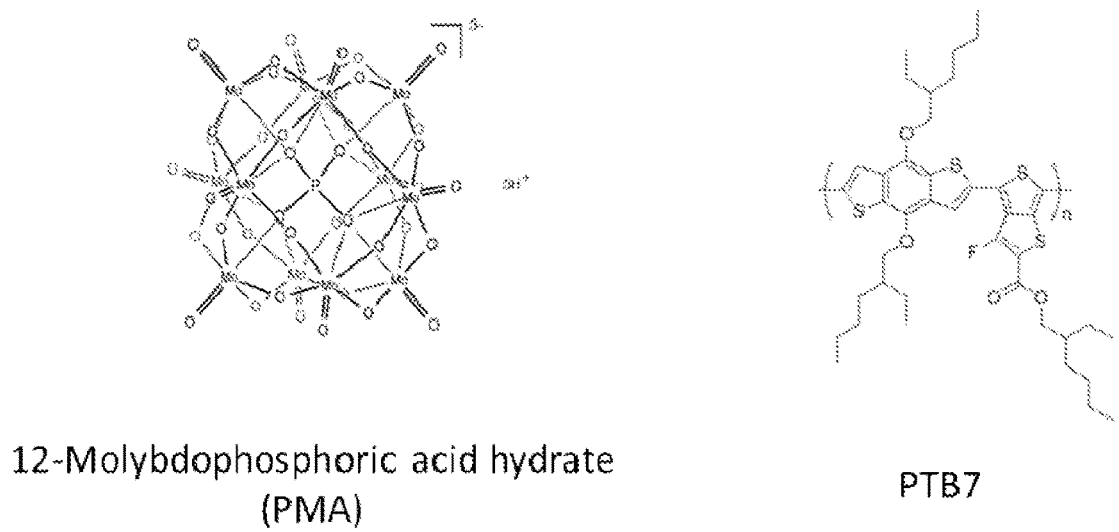
FIG. 67 depicts chemical structures of the materials disclosed herein for PMA doping of PTB7, as described with respect to Example 27.
Figure 68:
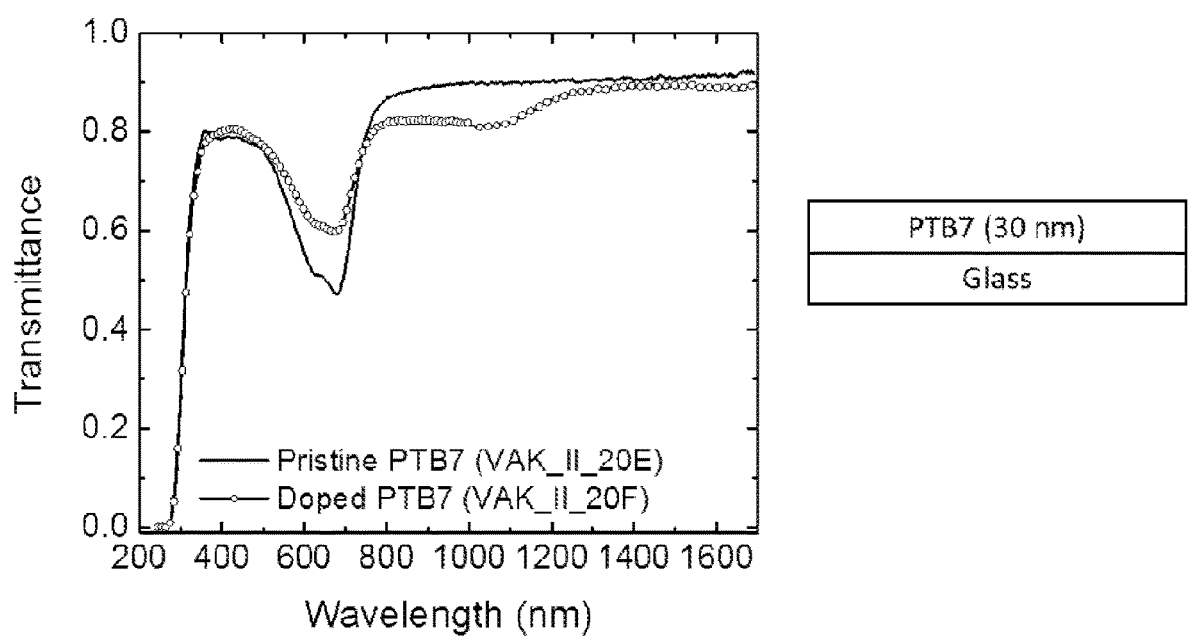
FIG. 68 depicts a sample geometry, as described in Example 27 (top right figure), transmittance of reference and doped PTB7 films (top left figure), and work function values (bottom table), according to an example implementation of the disclosed technology.

FIG. 67 depicts chemical structures of some of the materials disclosed herein for PMA doping of PTB7. FIG. 68 depicts a sample geometry (top right figure), transmittance of reference and doped PTB7 films (top left figure), and work function values (bottom table), according to an example implementation of the disclosed technology.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly[(4,8-bis-(2-ethylhexyloxy)-benzo(1,2-b:4,5-b')dithiophene)-2,6-diyl-alt-(4-(2-ethylhexyl)-3-fluorothieno[3,4-b]thiophene-)-2-carboxylate-2-6-diyl)] (PTB7) was filtered through 0.2-μm-pore PTFE filters and spin-coated on each substrate from 10 mg/ml chlorobenzene solution at a speed of 1000 rpm and an acceleration of 10000 rpm/s for 30 s. The thickness of the PTB7 film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045. Alfa Aesar) in nitromethane 10 min, rinsed thoroughly with pure nitromethane to remove all remaining PMA from the surface.

The work function, or Fermi level energy, of the PTB7 films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmittance of the films was measured with the ellipsometer (J. A. Woollam Co.).

Example 28. PMA Doping of PFFBT4T-2OD

Figure 69:
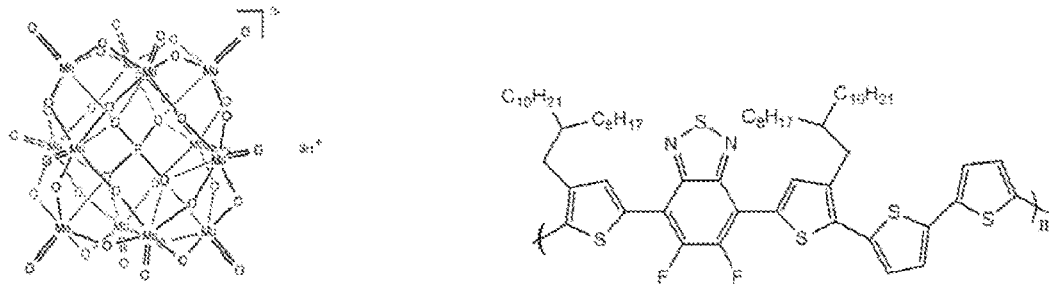
FIG. 69 depicts chemical structures of some of the materials disclosed herein for PMA doping of PFFBT4T-2OD, as described in Example 28.
Figure 70:
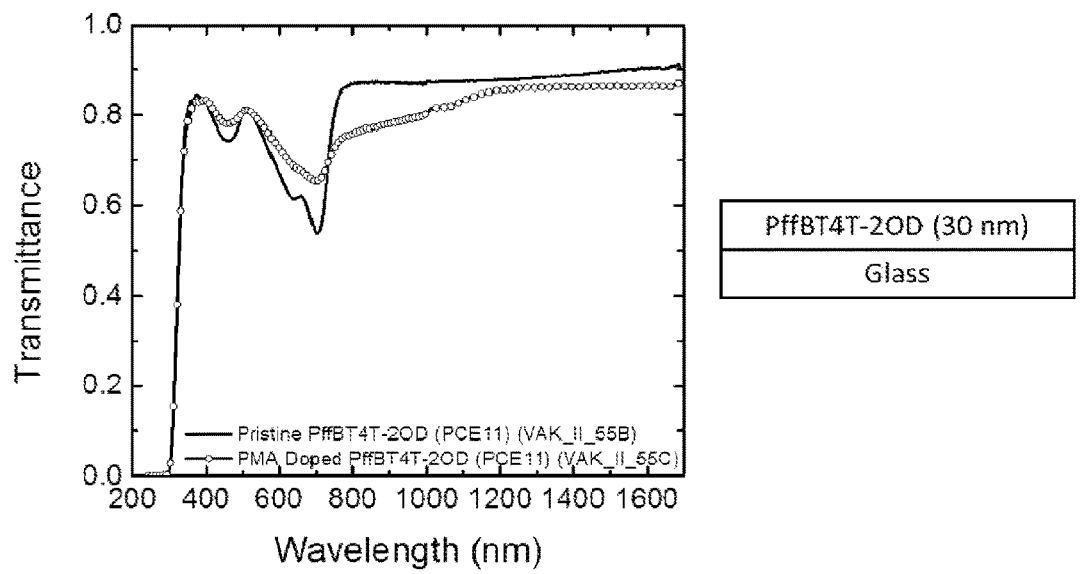
FIG. 70 depicts a sample geometry as described in Example 28 (top right figure), transmittance of reference and doped PFFBT4T-2OD films (top left figure), and work function values (bottom table), according to an example implementation of the disclosed technology.

FIG. 69 depicts chemical structures of some of the materials disclosed herein for PMA doping of PFFBT4T-2OD. FIG. 70 depicts a sample geometry (top right figure), transmittance of reference and doped PFFBT4T-2OD films (top left figure), and work function values (bottom table), according to an example implementation of the disclosed technology.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)] (PffBT4T-2OD, Lot #01A) was filtered through 0.2-μm-pore PTFE filters and spin-coated on each substrate from 10 mg/ml chlorobenzene solution at a speed of 1000 rpm and an acceleration of 10000 rpm/s for 30 s. The thickness of the PffBT4T-2OD film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045. Alfa Aesar) in nitromethane 10 min, rinsed thoroughly with pure nitromethane to remove all remaining PMA from the surface.

The work function, or Fermi level energy, of the PffBT4T-2OD films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmittance of the films was measured with the ellipsometer (J. A. Woollam Co.).

Example 29. PMA Doping of X2

Figure 71:
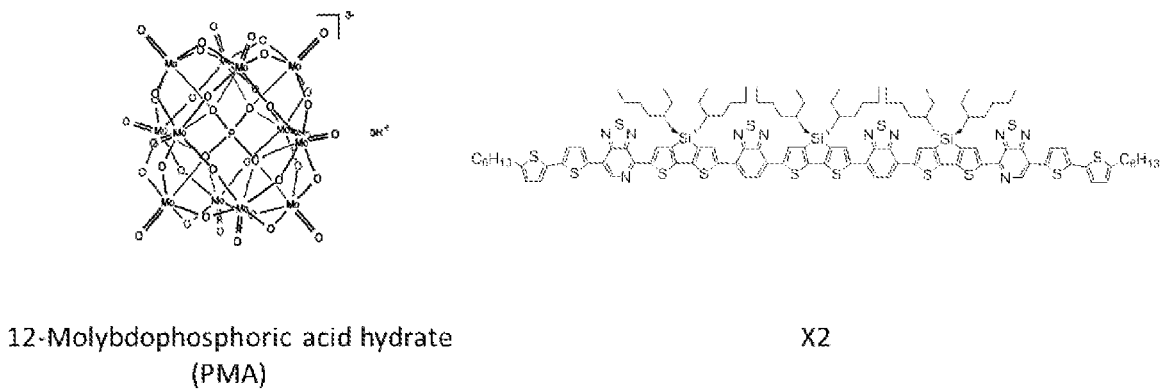
FIG. 71 depicts chemical structures of some of the materials disclosed herein for PMA doping of X2, as described in Example 29.
Figure 72:
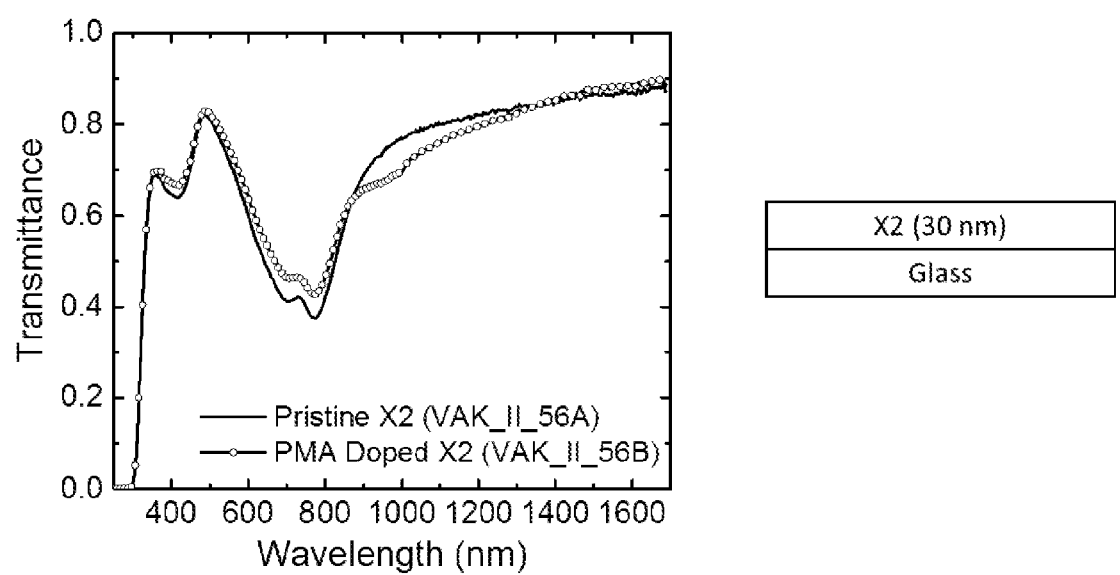
FIG. 72 depicts a sample geometry as described in Example 29 (top right figure), transmittance of reference and doped X2 films (top left figure), and work function values (bottom table), according to an example implementation of the disclosed technology.

FIG. 71 depicts chemical structures of some of the materials disclosed herein for PMA doping of X2. FIG. 72. depicts a sample geometry (top right figure), transmittance of reference and doped X2 films (top left figure), and work function values (bottom table), according to an example implementation of the disclosed technology.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of X2 was filtered through 0.2-µm-pore PTFE filters and spin-coated on each substrate from 10 mg/ml chlorobenzene solution at a speed of 1000 rpm and an acceleration of 10000 rpm/s for 30 s. The thickness of the X2 film is 30 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045, Alfa Aesar) in nitromethane 10 min, rinsed thoroughly with pure nitromethane to remove all remaining PMA from the surface.

The work function, or Fermi level energy, of the X2 films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmittance of the films was measured with the ellipsometer (J. A. Woollam Co.).

Example 30. Photo-Oxidation of P3HT

Figure 73:
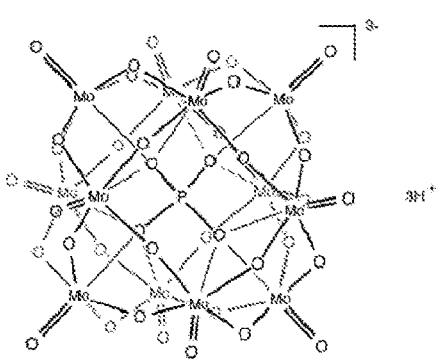
FIG. 73 depicts chemical structures of some of the materials disclosed herein for measuring photo-oxidation of P3HT, as described in Example 30.
Figure 73:
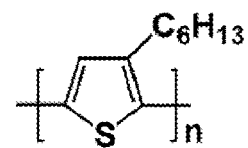
Figure 74:
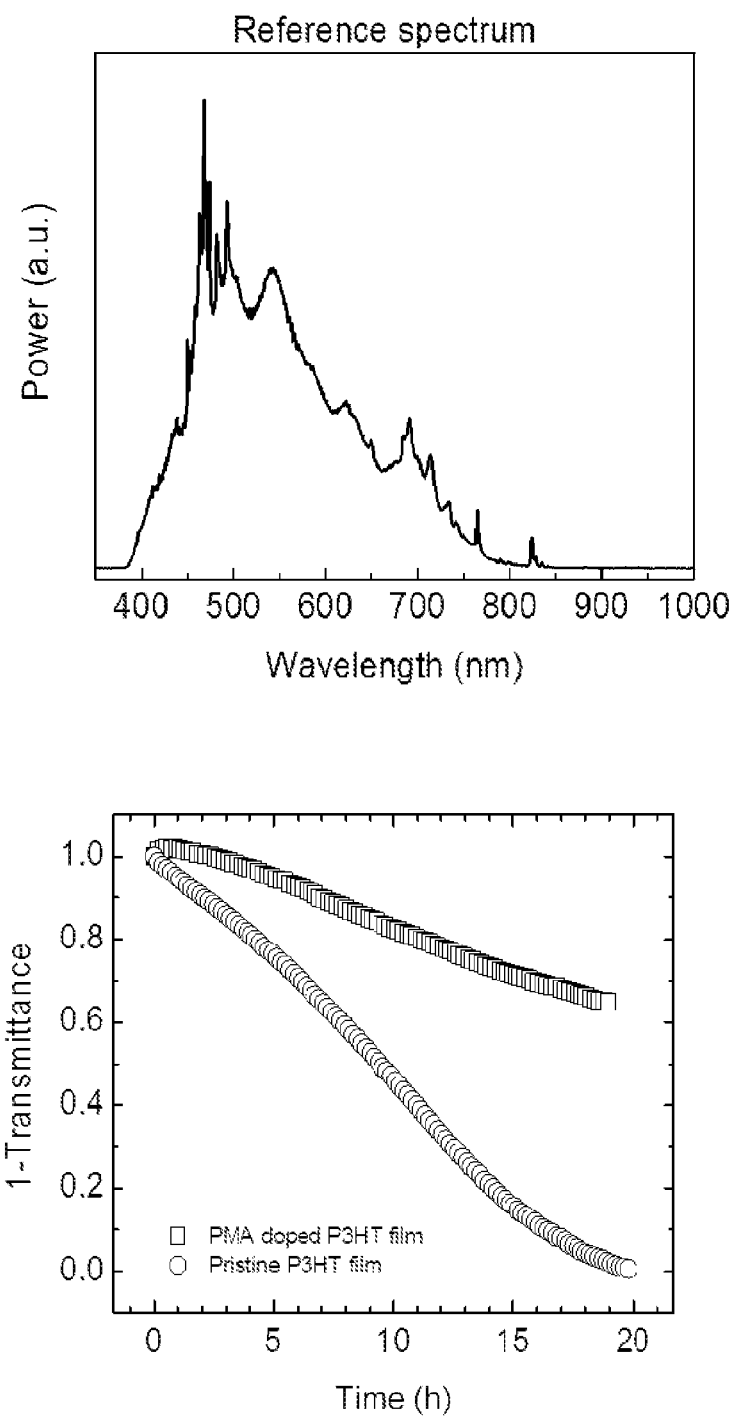
FIG. 74 shows reference power spectrum (top chart) and the temporal evolution (bottom chart) of 1-Transmittance of the pristine and doped P3HT films, as described in Example 30.

FIG. 73 depicts chemical structures of some of the materials disclosed herein for measuring photo-oxidation of P3HT. FIG. 74 shows reference power spectrum (top chart) and the temporal evolution (bottom chart) of 1-Transmittance of the pristine and doped P3HT films.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly(3-hexylthiophene) (P3HT) was filtered through 0.2-µm-pore PTFE filters and spin-coated on each substrate from 10 mg/ml chlorobenzene solution at a speed of 800 rpm and an acceleration of 10000 rpm/s for 30 s. The thickness of the P3HT film is 55 nm, measured using a spectroscopic ellipsometer (J. A. Woollam Co.). One substrate was then dipped into a 0.5 M solution of 12-Molybdophosphoric acid hydrate (PMA, Alfa Aesar, $M_w$=1825.25 g/mol, Lot # W15A045, Alfa Aesar) in nitromethane 30 min, rinsed thoroughly with pure nitromethane to remove all remaining PMA from the surface.

The samples were taken out in air and illuminated by a 300 W Xenon lamp for a period of 19 h, monitoring the power of the transmitted light.

Example 31. Photo-Oxidation of PCDTBT

Figure 75:
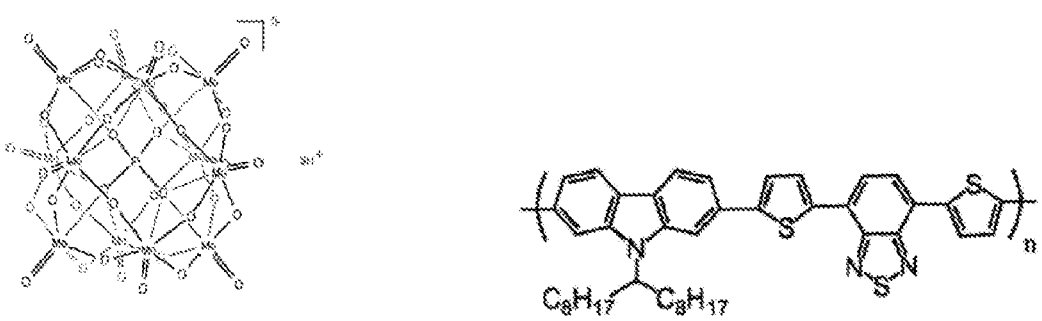
FIG. 75 depicts chemical structures of some of the materials disclosed herein for measuring photo-oxidation of PCDTBT, as described in Example 31.
Figure 76:
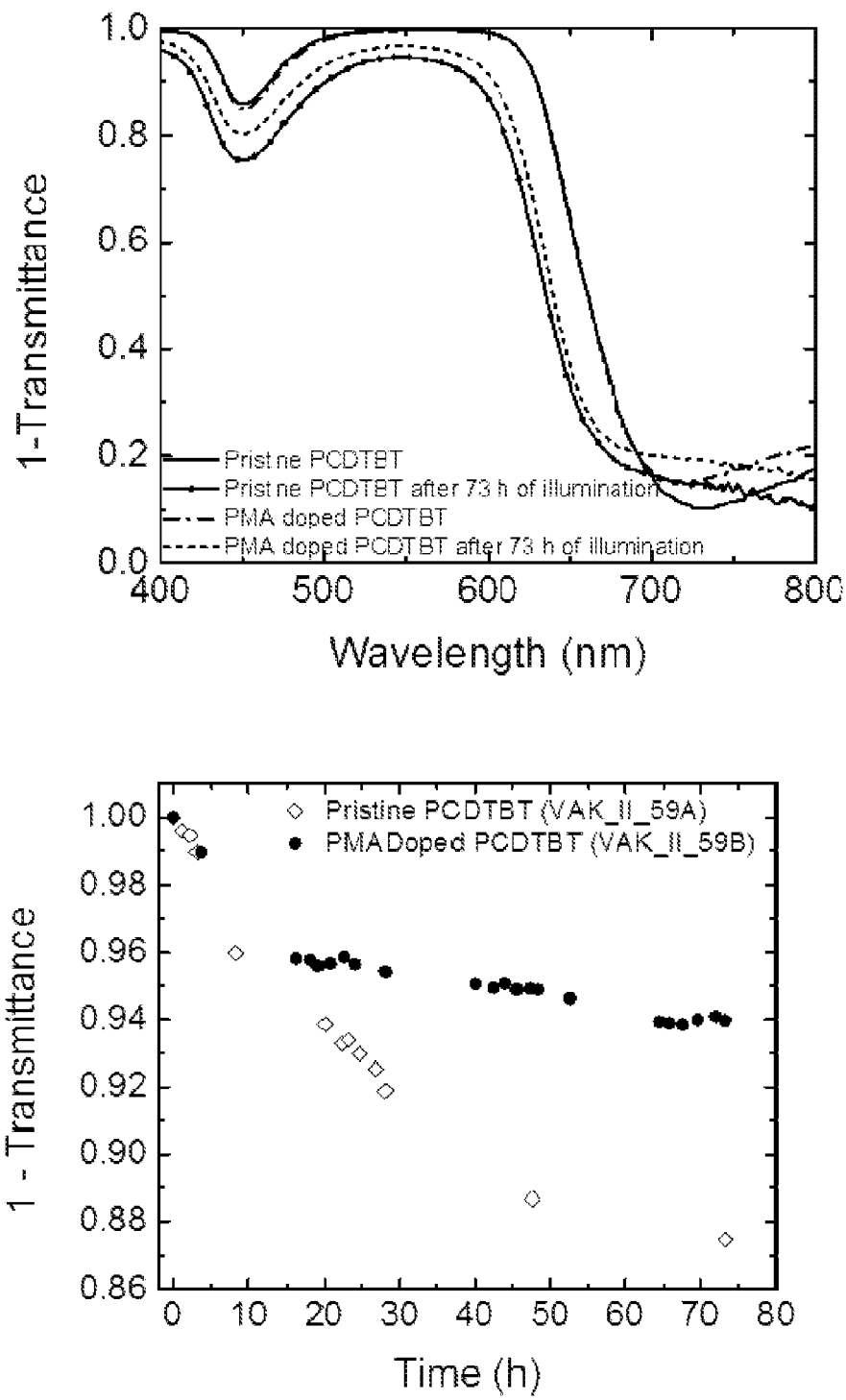
FIG. 76 shows transmittance of reference and doped PCDTBT films before and after illumination (top chart), and the temporal evolution (bottom chart) of 1-Transmittance of the pristine and doped PCDTBT films, as described in Example 31.

FIG. 75 depicts chemical structures of some of the materials disclosed herein for measuring photo-oxidation of PCDTBT. FIG. 76 shows transmittance of reference and doped PCDTBT films before and after illumination (top chart), and the temporal evolution (bottom chart) of 1-Transmittance of the pristine and doped PCDTBT films.

VWR glass microslides were used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly[N-9'-heptadecanyl-2,7-carbazole-alt-5,5-(4', 7'-di-2-thienyl-2',1',3'-benzothiadiazole)] (PCDTBT) was filtered through 0.2-µm-pore PTFE filters and spin-coated on each substrate from 27 mg/ml chlorobenzene solution at a speed of 800 rpm and an acceleration of 10000 rpm/s for 30 s. The thickness of the PCDTBT film is 300 nm, measured using a spectroscopic ellipsometer (J. A. Woollam Co.). One substrate was then dipped into a 0.5 M solution of 12-Molybdophosphoric acid hydrate (PMA, Alfa Aesar, $M_w$=1825.25 g/mol, Lot # W15A045. Alfa Aesar) in nitromethane 30 min, rinsed thoroughly with pure nitromethane to remove all remaining PMA from the surface.

The samples were taken out in air and illuminated by a 300 W Xenon lamp for a period of 73 h, monitoring the power of the transmitted light. The transmittance of the films was measured with the ellipsometer (J. A. Woollam Co.) before and after 73 h of illumination.

Example 32. XPS of Pristine and PMA Doped P3HT Films

Figure 77:
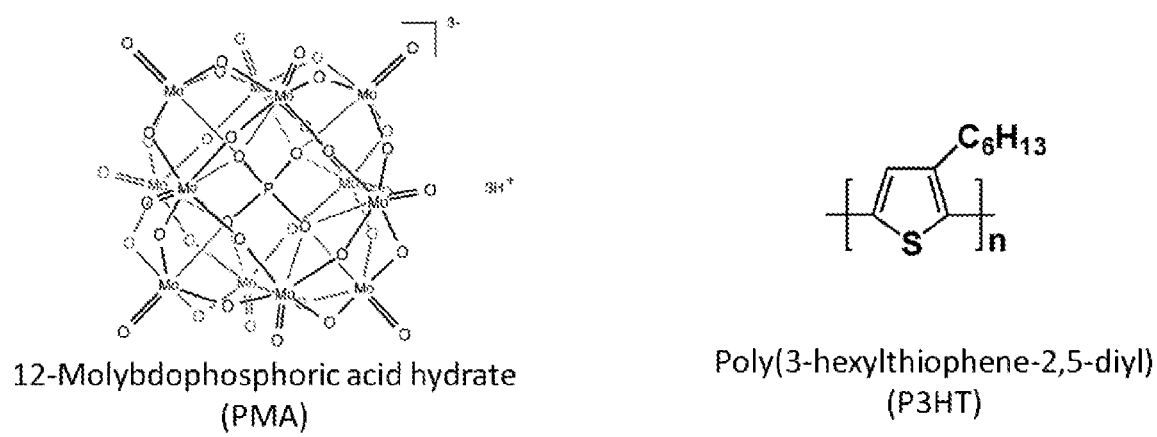
FIG. 77 depicts chemical structures of some of the materials disclosed herein for XPS measurements of pristine and PMA-doped P3HT films, as described in Example 32.

FIG. 77 depicts chemical structures of some of the materials disclosed herein for XPS measurements of pristine and PMA-doped P3HT films.

Figure 78:
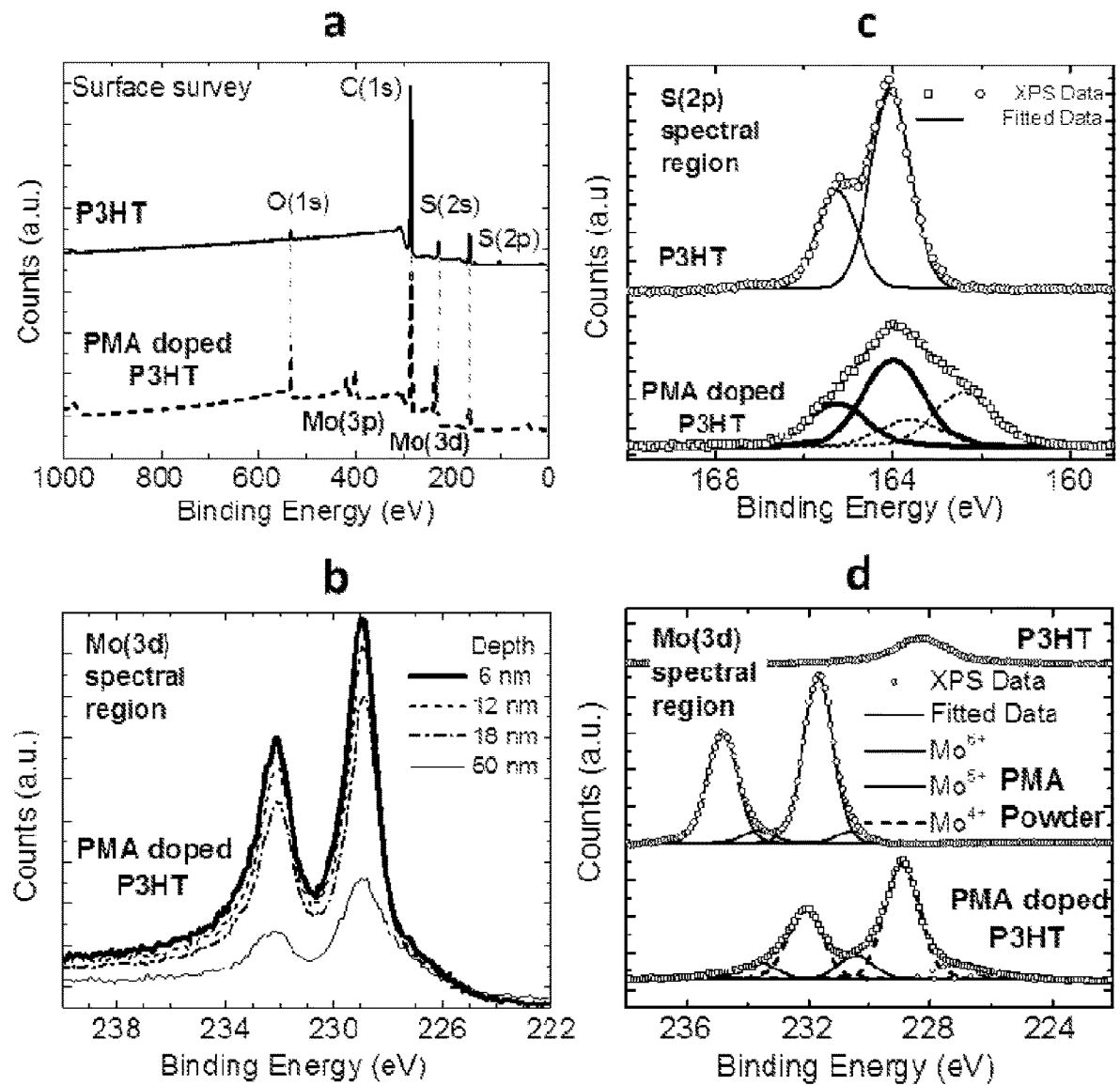
FIG. 78 shows properties and interactions of doped P3HT films. (a) XPS survey scan on the surface of 55 nm P3HT and PMA doped P3HT (immersed for 30 min) films on an ITO substrate. (b) High resolution XPS scans at the Mo(3d) binding energies of the PMA doped P3HT at different depths into the film after etching with an ion beam. (c) XPS measurements of 55 nm P3HT and PMA doped P3HT films in the S(2p) region. (d) XPS measurements of 55 nm P3HT and PMA doped P3HT film, and PMA powder in the Mo(3d) region, as described in Example 32.

FIG. 78 shows properties and interactions of doped P3HT films. a) XPS survey scan on the surface of 55 nm P3HT and PMA doped P3HT (immersed for 30 min) films on an ITO substrate. b) High resolution XPS scans at the Mo(3d) binding energies of the PMA doped P3HT at different depths into the film after etching with an ion beam. c) XPS measurements of 55 nm P3HT and PMA doped P3HT films in the S(2p) region. d) XPS measurements of 55 nm P3HT and PMA doped P3HT film, and PMA powder in the Mo(3d) region.

ITO-coated glass (Colorado Concept Coatings LLC) with a sheet resistivity of ca.15 Ω/sq. was used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly(3-hexylthiophene) (P3HT, 4002-E, PTL14-22, Rieke Metals) was filtered through 0.2-µm-pore PTFE filters and spin-coated on each substrate from 10 mg/ml chlorobenzene solution at a speed of 800 rpm and an acceleration of 10000 rpm/s for 30 s. The thickness of the P3HT film is 55 nm, measured using a spectroscopic ellipsometer (J. A. Woollam Co.). One substrate was then dipped into a 0.5 M solution of 12-Molybdophosphoric acid hydrate (PMA, Alfa Aesar, $M_w$=1825.25 g/mol, Lot # W15A045, Alfa Aesar) in nitromethane 30 min, rinsed thoroughly with pure nitromethane to remove all remaining PMA from the surface.

To determine the presence of PMA in a P3HT film, surface survey scans and depth profiling was conducted using a Thermo K-Alpha XPS system with a low-energy $Ar^+$ ion beam for etching a 55 nm film of P3HT spun on an ITO substrate.

Example 33. XPS of Pristine and PTA Doped P3HT Films

Figure 79:
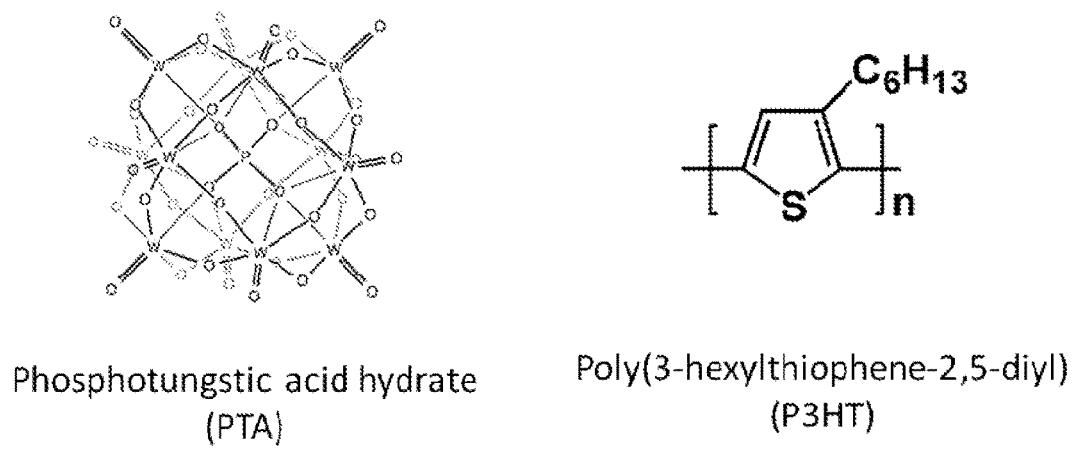
FIG. 79 depicts chemical structures of some of the materials disclosed herein for XPS measurements of pristine and PTA-doped P3HT films, as described in Example 33.

FIG. 79 depicts chemical structures of some of the materials disclosed herein for XPS measurements of pristine and PTA-doped P3HT films.

Figure 80:
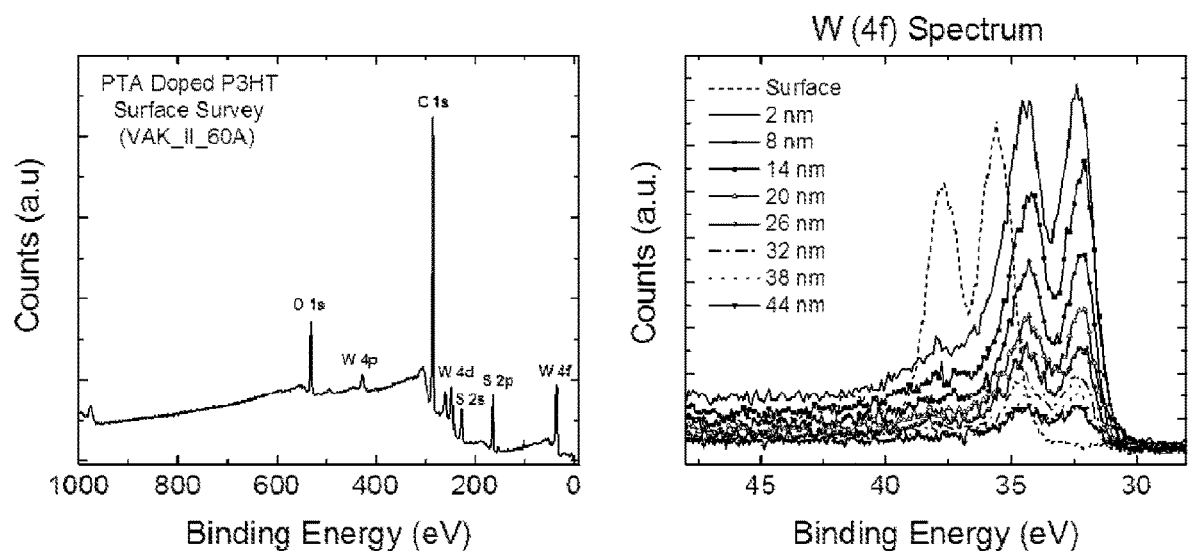
FIG. 80 shows properties and interactions of PTA doped P3HT films. XPS survey scan on the surface of 55 nm P3HT and PTA doped P3HT (immersed for 30 min) films on an ITO substrate (left). High resolution XPS scans at the W(4f) binding energies of the PTA doped P3HT at different depths into the film after etching with an ion beam (right), as described in Example 33.

FIG. 80 shows properties and interactions of PTA doped P3HT films. XPS survey scan on the surface of 55 nm P3HT and PTA doped P3HT (immersed for 30 min) films on an ITO substrate (left). High resolution XPS scans at the W(4f) binding energies of the PTA doped P3HT at different depths into the film after etching with an ion beam (right).

ITO-coated glass (Colorado Concept Coatings LLC) with a sheet resistivity of ca.15 Ω/sq. was used as the substrate for the semiconducting film. The substrate was cleaned in an ultrasonic bath of detergent water, rinsed with deionized water, and then cleaned in sequential ultrasonic baths of deionized water, acetone, and isopropanol. $N_2$ was used to dry the substrate after each of the last three baths.

Then the substrate was transferred into a $N_2$-filled glove box. After mixing the solution for 12 h at 70° C. at 500 rpm, the film of poly(3-hexylthiophene) (P3HT, 4002-E, PTL14-22, Rieke Metals) was filtered through 0.2-µm-pore PTFE filters and spin-coated on each substrate from 10 mg/ml chlorobenzene solution at a speed of 800 rpm and an acceleration of 10000 rpm/s for 30 s. The thickness of the P3HT film is 55 nm, measured using a spectroscopic ellipsometer (J. A. Woollam Co.). The substrate was then dipped into a 0.5 M solution of phosphotungstic acid (PTA, Lot #: P19A005, Alfa Aesar) in nitromethane 30 min, rinsed thoroughly with pure nitromethane to remove all remaining PTA from the surface.

To determine the presence of PTA in a P3HT film, surface survey scans and depth profiling was conducted using a Thermo K-Alpha XPS system with a low-energy $Ar^+$ ion beam for etching a 55 nm film of P3HT spun on an ITO substrate.

Example 34. Solvent Selectivity of PMA Doping

Figure 81:
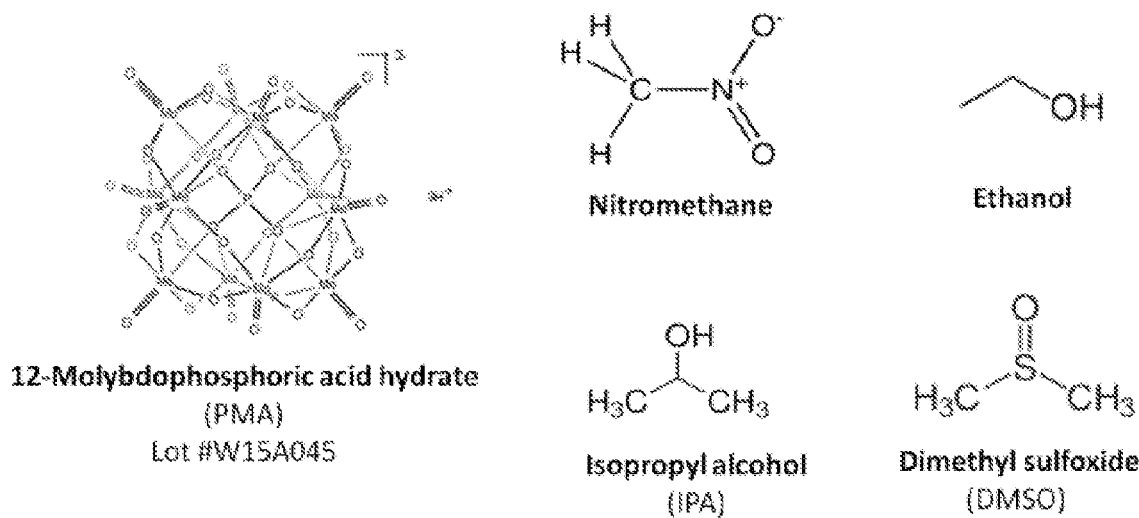
FIG. 81 depicts chemical structures of some of the materials disclosed herein for measuring PMA-doping solvent selectivity, as described in Example 34.
Figure 82:
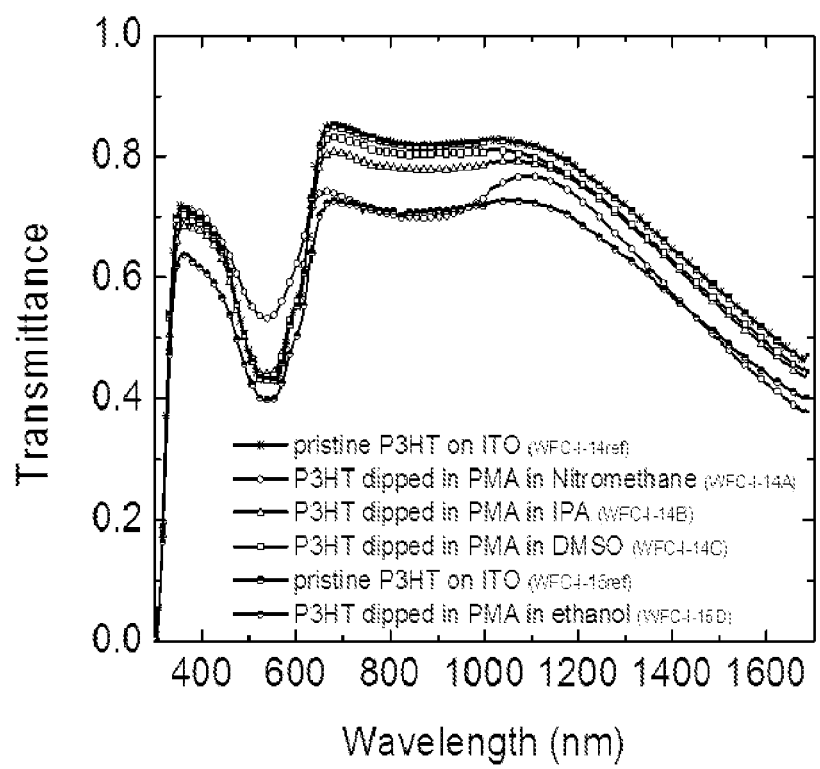
FIG. 82 shows transmittance of reference and doped P3HT films, as described in Example 34.

FIG. 81 depicts chemical structures of some of the materials disclosed herein for measuring PMA-doping solvent selectivity. FIG. 82 shows transmittance of reference and doped P3HT films. FIG. 83 shows work function values of the P3HT films.

ITO-coated glass (Colorado Concept Coatings LLC) with a sheet resistivity of ca.15 Ω/sq. was used as the substrates for the semiconducting films. The substrates were cleaned in an ultrasonic bath of detergent water, rinsed with deionized water, and then cleaned in sequential ultrasonic baths of deionized water, acetone, and isopropanol. $N_2$ was used to dry the substrates after each of the last three baths.

Then the substrates were transferred into a $N_2$-filled glove box. After mixing the solution for 12 h at 70° C. at 500 rpm, the film of poly(3-hexylthiophene) (P3HT, 4002-E, PTL15-15, Rieke Metals) was filtered through 0.2-µm-pore PTFE filters and spin-coated on each substrate from 10 mg/ml chlorobenzene solution at a speed of 1000 rpm and an acceleration of 10000 rpm/s for 30 s. The thickness of the P3HT film is 55 nm, measured using a spectroscopic ellipsometer (J. A. Woollam Co.). The substrates were then dipped into a 0.5 M solution of 12-Molybdophosphoric acid hydrate (PMA, Alfa Aesar, $M_w$=1825.25 g/mol, Lot # W15A045, Alfa Aesar) in nitromethane, isopropyl alcohol (IPA), dimethyl sulfoxide (DMSO), and ethanol 60 min respectively, rinsed thoroughly with pure solvent to remove all remaining PMA from the surface.

The work function, or Fermi level energy, of the P3HT films was measured prior to PMA doping and post PMA doping with a Kelvin probe inside a $N_2$-filled glove box. The samples were transferred in between glove boxes in a sealed container filled with $N_2$. The work function of each film was measured at 4 different spots on the substrate and adjusted by measuring the work function of freshly peeled highly ordered pyrolytic graphite (HOPG) with a known work function of 4.6 eV. The transmittance of the films was measured with the ellipsometer (J. A. Woollam Co.).

The invention claimed is:

1. A semiconductor device comprising:
    a substrate; and
    an organic semiconductor film;
    wherein the organic semiconductor film comprises a first electrically conductive doped region characterized by a first set of electrical dopant molecules that provides the first electrically conductive doped region with a first electrical conductivity, and that are distributed to a first controlled depth with respect to a first surface of the organic semiconductor film;
    wherein an un-doped portion of the organic semiconductor film has a second electrical conductivity and lies outside the first controlled depth; and
    wherein the first electrical conductivity of the first electrically conductive doped region of the organic semiconductor film is more than an order of magnitude greater than the second electrical conductivity of the un-doped portion of the organic semiconductor film.

2. The semiconductor device of claim 1, wherein the organic semiconductor film comprises one or more of a conjugated polymer, a conjugated molecule, a conjugated supramolecular structure, and a combination thereof;

wherein the organic semiconductor film further comprises a second electrically conductive doped region characterized by a second set of electrical dopant molecules distributed to a second controlled depth with respect to the first surface of the organic semiconductor film; and wherein at least a portion of the distributed electrical dopant molecules of one or both of the first and second electrically conductive doped regions are at least partially removed or neutralized.

3. The semiconductor device of claim 2, wherein at least a portion of the distributed electrical dopant molecules of one or both of the first and second electrically conductive doped regions are at least partially removed or neutralized by exposure of one or both of the first and second electrically conductive doped regions to hydrazine.

4. The semiconductor device of claim 1, wherein the organic semiconductor film has a thickness in the range from about 10 nm to about 10,000 nm.

5. The semiconductor device of claim 1, wherein at least a portion of the electrical dopant molecules are selected from the group consisting of molybdenum (Mo), tungsten (W), an oxidizing agent, a reducing agent, a p-dopant, and a polyoxometalate.

6. The semiconductor device of claim 5, wherein at least a portion of the electrical dopant molecules reduce the solubility of the organic semiconductor film.

7. The semiconductor device of claim 5, wherein at least a portion of the electrical dopant molecules increase a photo-oxidation stability of the organic semiconductor film.

8. The semiconductor device of claim 5, wherein the organic semiconductor film comprises one or more of:
 an active layer of a solar cell;
 an active layer of a single-active layer solar cell; and
 an active layer of a single-active layer P-I-N junction.

9. The semiconductor device of claim 5, wherein the diffused electrical dopant molecules are configured to facilitate one or more of transport, injection and collection of charge carriers.

10. A process for the manufacture of the semiconductor device of claim 1 comprising:
 disposing the organic semiconductor film on the substrate;
 exposing a portion of the disposed organic semiconductor film to a doping environment comprising the first set of the electrical dopant molecules; and
 forming the first electrically conductive doped region of the organic semiconductor film by distributing the first set of the electrical dopant molecules to the first controlled depth by exposing the first region of the organic semiconductor film to the doping environment for a prescribed time.

11. The process of claim 10, wherein the doping environment further comprises acetonitrile.

12. The process of claim 10 further comprising selecting the doping environment to:
 reduce a solubility of the organic semiconductor film upon exposure to the doping environment;
 increase a photo-oxidation stability of the organic semiconductor film upon exposure to the doping environment; and
 facilitate one or more of transport, injection and collection of charge carriers in the organic semiconductor film upon exposure to the doping environment.

13. The process of claim 12, wherein exposing the portion of the disposed organic semiconductor film to the doping environment comprises immersing the organic semiconductor film in a polyoxometalate solution.

14. The process of claim 12, wherein exposing the portion of the disposed organic semiconductor film to the doping environment comprises exposing the organic semiconductor film to a solvent of nitromethane.

15. The process of claim 12 further comprising:
 exposing a portion of the first electrically conductive doped region of the organic semiconductor film to an environment comprising a basic solvent for a predetermined duration to de-dope the organic semiconductor film by removal of at least a portion of the electrical dopant molecules from the exposed the portion of the first electrically conductive doped region; and
 drying the organic semiconductor film.

16. The process of claim 15, wherein the basic solvent comprises hydrazine.

17. The process of claim 15, wherein a sheet resistance of the de-doped film is substantially equivalent to a sheet resistance of the un-doped portion of the organic semiconductor film.

18. The process of claim 15, wherein a Fermi level energy of the de-doped film is substantially equivalent to that of the un-doped portion of the organic semiconductor film.

19. The process of claim 12, wherein disposing the organic semiconductor film on the substrate comprises disposing the organic semiconductor film having a thickness range from about 10 nm to about 10,000 nm.

20. The process of claim 12 further comprising forming the organic semiconductor film by spin coating.

21. The process of claim 12, wherein the doping environment comprises polyoxometalate molecules.

22. The process of claim 12, wherein the exposing and forming produces one or more of:
 an active layer of a solar cell;
 an active layer of a single-active layer solar cell; and
 an active layer of a single-active layer P-I-N junction.

23. The semiconductor device of claim 1, wherein the first controlled depth is determined by an exposure time of the organic semiconductor film to a doping environment comprising the electrical dopant molecules and solvent molecules.

24. The semiconductor device of claim 23, wherein the solvent molecules comprises acetonitrile.

25. A semiconductor device comprising:
 a substrate;
 an organic semiconductor film on the substrate, the organic semiconductor film comprising an electrically conductive doped region having a first electrical conductivity and an un-doped region having a second electrical conductivity; and
 an electrode in contact with at least a portion of the organic semiconductor film;
 wherein the organic semiconductor film comprises one or more of a conjugated polymer, a conjugated molecule, a conjugated supramolecular structure, and a combination thereof;
 wherein the electrically conductive doped region of the organic semiconductor film comprises electrical dopant molecules selected from the group consisting of molybdenum (Mo), an oxidizing agent, a polyoxometalate, and combinations thereof;
 wherein the electrical dopant molecules are diffused to a depth with respect to a first surface of the organic semiconductor film; and
 wherein the first electrical conductivity of the electrically conductive doped region of the organic semiconductor film is more than six orders of magnitude greater than the second electrical conductivity of the un-doped region of the organic semiconductor film.

26. The semiconductor device of claim 25, wherein the electrically conductive doped region of the organic semiconductor film has a dopant diffusivity instability of less than 5.0% over 300 hours at 60 degrees C.

* * * * *